United States Patent
Hirata et al.

(10) Patent No.: US 11,150,464 B2
(45) Date of Patent: Oct. 19, 2021

(54) OPTICAL SCANNING DEVICE AND METHOD OF ADJUSTING OPTICAL SCANNING DEVICE

(71) Applicant: Mitsubishi Electric Corporation, Chiyoda-ku (JP)

(72) Inventors: Yoshiaki Hirata, Chiyoda-ku (JP); Nobuaki Konno, Chiyoda-ku (JP); Takahiko Ito, Chiyoda-ku (JP); Kozo Ishida, Chiyoda-ku (JP); Yoshitaka Kajiyama, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 95 days.

(21) Appl. No.: 16/608,035

(22) PCT Filed: Mar. 16, 2018

(86) PCT No.: PCT/JP2018/010401
§ 371 (c)(1),
(2) Date: Oct. 24, 2019

(87) PCT Pub. No.: WO2018/230065
PCT Pub. Date: Dec. 20, 2018

(65) Prior Publication Data
US 2020/0271920 A1    Aug. 27, 2020

(30) Foreign Application Priority Data
Jun. 13, 2017   (JP) .............................. JP2017-115812

(51) Int. Cl.
*G02B 26/08* (2006.01)
*G02B 26/10* (2006.01)

(52) U.S. Cl.
CPC ....... *G02B 26/0858* (2013.01); *G02B 26/101* (2013.01)

(58) Field of Classification Search
CPC .. G02B 26/0858; G02B 26/101; G02B 26/08; G02B 26/10; G01S 7/4817; G01S 7/4972; G01S 7/481; B81B 3/00
(Continued)

(56) References Cited

U.S. PATENT DOCUMENTS

| 2010/0195180 A1 | 8/2010 | Akanuma et al. |
| 2013/0208330 A1 | 8/2013 | Naono |

(Continued)

FOREIGN PATENT DOCUMENTS

| CN | 106461934 A | 2/2017 |
| JP | 2007-206480 A | 8/2007 |

(Continued)

OTHER PUBLICATIONS

International Search Report dated Jun. 19, 2018 in PCT/JP2018/010401 filed Mar. 16, 2018.

(Continued)

*Primary Examiner* — Euncha P Cherry
(74) *Attorney, Agent, or Firm* — Xsensus LLP

(57) ABSTRACT

An optical scanning device includes a mirror part having a mirror surface configured to reflect light, N support cantilevers supporting the mirror part swingably, N drive cantilevers, and a plurality of driving piezoelectric elements secured on N drive cantilevers. The mirror part precesses by setting the frequency of AC voltage applied to each of a plurality of piezoelectric elements to a determined common value and setting the phase of AC voltage applied to each of a plurality of piezoelectric elements to a value determined according to the position of each piezoelectric element.

18 Claims, 31 Drawing Sheets

(58) Field of Classification Search
USPC .................................................. 359/200.8
See application file for complete search history.

(56) References Cited

U.S. PATENT DOCUMENTS

2016/0004070 A1* 1/2016 Kuisma ................ G02B 26/101
                                                   359/212.1
2018/0172982 A1   6/2018 Okada et al.

FOREIGN PATENT DOCUMENTS

| JP | 2010-197994 A | 9/2010 |
| JP | 2011-100103 A | 5/2011 |
| JP | 2013-167681 A | 8/2013 |
| JP | 2014-92630 A  | 5/2014 |
| JP | 2017-3717 A   | 1/2017 |

OTHER PUBLICATIONS

Chinese Office Action dated May 31, 2021 in Chinese Application No. 201880030193.1.
Chinese Office Action dated Aug. 24, 2021 in Chinese Application No. 201880030193.1.

* cited by examiner (a)

(b)

OPTICAL SCANNING DEVICE AND METHOD OF ADJUSTING OPTICAL SCANNING DEVICE

TECHNICAL FIELD

The present invention relates to an optical scanning device and a method of adjusting the same, more specifically to an optical scanning device available for laser distance sensors or optical scanners, for example, and a method of adjusting the same.

BACKGROUND ART

Microelectromechanical systems (MEMS) mirrors are known as optical scanning devices for use in laser distance sensors or optical scanners, for example. The mirror part of a MEMS mirror is driven using electrostatic force, electromagnetic force, or piezoelectric force.

When electrostatic force is used, the generated driving force is small and a sufficient deflection angle is not ensured. When electromagnetic force is used, it is necessary to arrange a permanent magnet externally, which makes the device configuration complicated and makes downsizing difficult.

When piezoelectric force is used, a piezoelectric element minutely deformable is formed on a cantilever-like elastic member, and in-plane distortion by piezoelectric force is converted into warp, resulting in a large deformation. In the MEMS mirror described in PTL 1, a piezoelectric element is arranged on a linear cantilever, and a mirror on the linear cantilever axis is torsion-vibrated in a single-axis or two-axis direction ([0099] to [00102] and FIG. 40 in PTL 1).

The MEMS mirror described in PTL 2 includes mirror supports formed at diagonal portions of a rectangular mirror, and a first actuator and a second actuator arranged to surround the mirror part. Each of the first actuator and the second actuator has a structure in which a plurality of first piezoelectric cantilevers with a longitudinal direction oriented in a first axis direction and a plurality of second piezoelectric cantilevers with a longitudinal direction oriented in a second axis direction are coupled in a folded manner. One end of each actuator is connected to the mirror part through the mirror support, and the other end is connected to a fixed portion in the vicinity of the mirror support. Each actuator rotationally vibrates in two axes, namely, around the X axis and the Y axis ([0029] to [0067] and FIG. 1 to FIG. 12 in PTL 2).

The MEMS mirror described in PTL 3 includes an annular elastic frame. On a surface of the frame, a piezoelectric body is provided which is divided into four, is symmetric with respect to the center, and includes electrodes having the same area. This MEMS mirror includes a plurality of torsion bars extending in the radial direction of the annular frame and a mirror panel connected to the torsion bars. The MEMS mirror rotationally vibrates in plane while keeping the deflection angle of the mirror optical axis to enable two-dimensional scanning ([0009] to [0012] and FIG. 1 in PTL 3).

In any of the MEMS mirrors in PTLs 1 to 3, in order to convert a minute deformation of piezoelectric force into a large deformation, the piezoelectric element is driven at a resonance frequency of the MEMS mirror.

CITATION LIST

Patent Literature

PTL 1: Japanese Patent Laying-Open No. 2010-197994
PTL 2: Japanese Patent Laying-Open No. 2013-167681
PTL 3: Japanese Patent Laying-Open No. 2007-206480

SUMMARY OF INVENTION

Technical Problem

A wide in-plane scanning range is required for a MEMS mirror used in laser distance sensors and the like. The MEMS mirror capable of all-round rotational displacement enables information acquisition in in-plane 360-degree surroundings.

Unfortunately, since the conventional MEMS mirrors described in PTLs 1 to 3 performs a scan by supporting a mirror part by a silicon cantilever and distorting the cantilever, the in-plane scan range is limited by fracture stress limit of silicon.

In view of the problems above, the present invention provides an optical scanning device having a wide in-plane scan angle and a method of adjusting the same.

Solution to Problem

According to an aspect of the present invention, an optical scanning device includes a mirror part having a mirror surface configured to reflect light, N (N≥3) support cantilevers supporting the mirror part swingably, and N drive cantilevers respectively connected to the N support cantilevers. The N drive cantilevers are arranged to surround the mirror part. An end of both ends of each of the N drive cantilevers that is not connected to the support cantilever is fixed. Each of the N drive cantilevers has a shape bent one or more times. The optical scanning device further includes a plurality of driving piezoelectric elements secured on the N drive cantilevers and a power supply unit configured to apply AC voltage to the piezoelectric elements. The mirror part precesses by setting a frequency of AC voltage applied to each of the piezoelectric elements to a common value and setting a phase of AC voltage applied to each of the piezoelectric elements to a value determined according to a position of the piezoelectric element.

Advantageous Effects of Invention

According to the present invention, the mirror part precesses, thereby increasing the in-plane scan range of the mirror part.

DESCRIPTION OF EMBODIMENTS

Embodiments of the present invention will be described below with reference to the drawings.

First Embodiment

Figure 1:
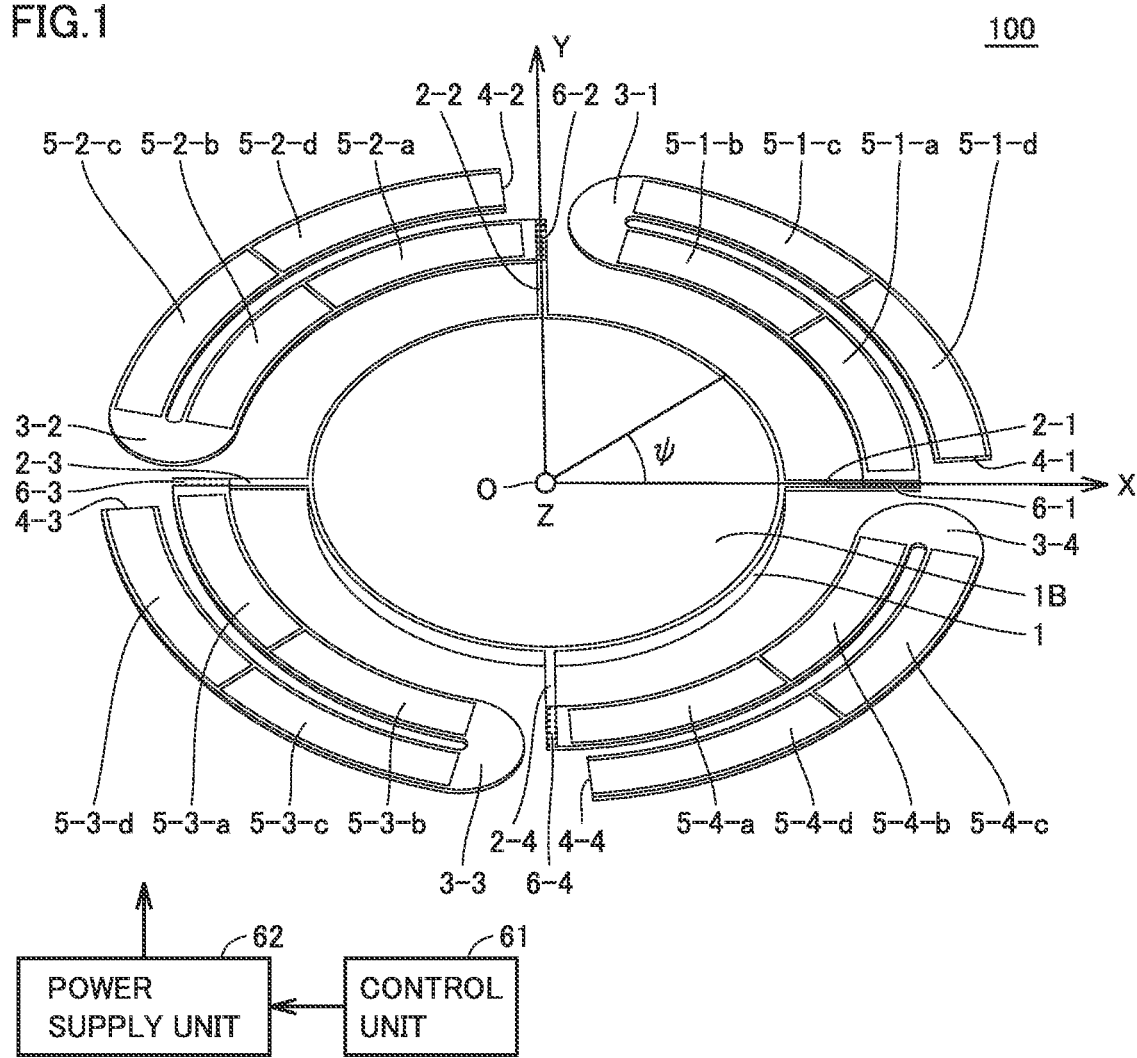
FIG. 1 is a diagram illustrating a configuration and a front surface of the main part of an optical scanning device in a first embodiment.
Figure 2:
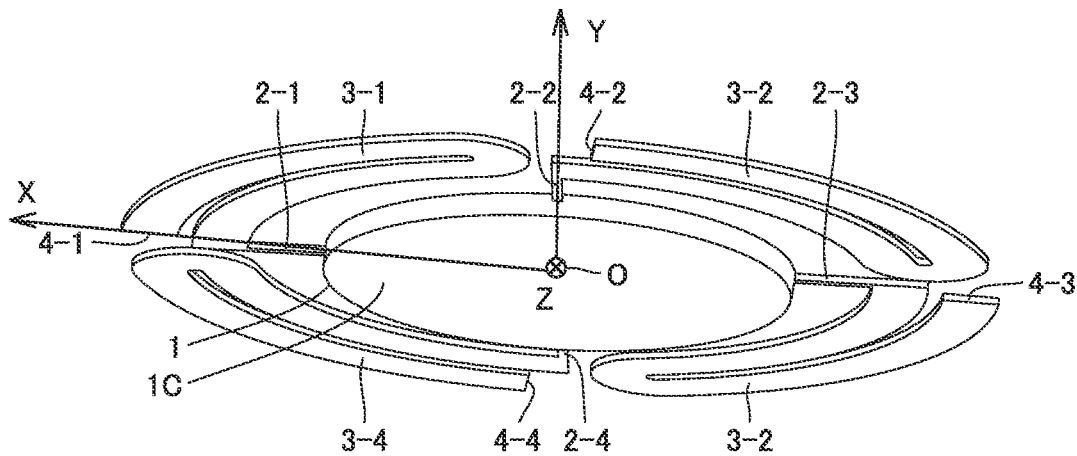
FIG. 2 is a diagram illustrating a back surface of the main part of the optical scanning device in first embodiment.

FIG. 1 is a diagram illustrating a configuration of an optical scanning device 100 in a first embodiment and a front surface of the main part of optical scanning device 100. FIG. 2 is a diagram illustrating a back surface of the main part of optical scanning device 100 in the first embodiment.

Referring to FIG. 1 and FIG. 2, optical scanning device 100 includes a mirror part 1, drive cantilevers 3-1, 3-2, 3-3, 3-4, support cantilevers 2-1, 2-2, 2-3, 2-4, piezoelectric elements 5-1-a, b, c, d, piezoelectric elements 5-2-a, b, c, d, piezoelectric elements 5-3-a, b, c, d, piezoelectric elements 5-4-a, b, c, d, and detecting piezoelectric elements 6-1, 6-2, 6-3, 6-4.

Mirror part 1 is a MEMS mirror. Mirror part 1 includes a mirror surface 1B and a silicon mirror part 1C. Mirror surface 1B receives light from a light source and reflects light. The front surface (mirror surface 1B) and the back surface of mirror part 1 are circular. Mirror surface 1B is made of a metal thin film with high reflectivity. Silicon mirror part 1C is obtained by processing a silicon substrate.

When mirror part 1 is at rest, the normal direction of mirror part 1 is the Z axis. Here, the center axis of mirror part 1 matches the Z axis. When mirror part 1 is at rest, two orthogonal axes parallel to the surfaces (one of which is mirror surface 1B) of mirror part 1 are the X axis and the Y axis. The direction of the X axis is the direction from the center O of mirror part 1 to support cantilever 2-1. The direction of the Y axis is the direction from the center O of mirror part 1 to support cantilever 2-2. The Z axis also serves as the center axis and the optical axis of mirror part 1 at rest.

A mirror inscribed angle $\Psi$ at a certain point on the circumference of mirror part 1 is the angle between the line connecting the point with the center O of mirror part 1 and the X axis.

Support cantilevers 2-1 to 2-4 support silicon mirror part 1C swingably. Support cantilevers 2-1 to 2-4 have the same shape and size. Support cantilevers 2-1 to 2-4 are arranged in 90° rotational symmetry with respect to the center axis (the Z axis) of mirror part 1.

Drive cantilevers 3-1 to 3-4 are arranged to surround mirror part 1. Drive cantilevers 3-1 to 3-4 have the same shape and size. One end of drive cantilever 3-i (i=1 to 4) is connected to support cantilever 2-i and the other end of drive cantilever 3-i is connected to a fixed portion 4-i. Drive cantilevers 3-1 to 3-4 are arranged in 90° rotational symmetry with respect to the center axis of mirror part 1. Drive cantilevers 3-1 to 3-4 each have a shape bent once at 180°. Drive cantilevers 3-1 to 3-4 each have two circumferential portions extending in the same direction as the circumferential direction of mirror part 1 and a bend portion. In other words, drive cantilevers 3-1 to 3-4 are each U-shaped. However, the portion in the longitudinal direction of the U shape is curved in the same direction as the circumference direction of mirror part 1.

Support cantilevers 2-1 to 2-4 are ordered counterclockwise. Support cantilever 2-i is the i-th support cantilever. Drive cantilevers 3-1 to 3-4 are ordered counterclockwise. Drive cantilever 3-i is the i-th drive cantilever. Alternatively, support cantilevers 2-1 to 2-4 and drive cantilevers 3-1 to 3-4 may be ordered clockwise, instead. That is, support cantilevers 2-1, 2-2, 2-3, 2-4 may be the first, fourth, third, and second support cantilevers. Drive cantilevers 3-1, 3-2, 3-3, 3-4 may be the first, fourth, third, and second drive cantilevers.

Piezoelectric elements 5-i-a, b, c, d (i=1 to 4) are secured on drive cantilever 3-i. Sixteen piezoelectric elements 5-i-a, b, c, d have the same shape and size.

Of the portions that constitute drive cantilever 3-i (i=1 to 4), a first portion of two circumferential portions extending in the same direction as the circumferential direction of mirror part 1 has piezoelectric elements 5-i-a, b, and a second portion has piezoelectric elements 5-i-c, d. The first portion is positioned closer to mirror part 1 than the second portion. Piezoelectric element 5-i-a and piezoelectric element 5-i-b are spaced apart from each other. Piezoelectric element 5-i-c and piezoelectric element 5i-d are spaced apart from each other. Piezoelectric element 5-i-b and piezoelectric element 5i-c are adjacent to each other with the bend portion of drive cantilever 3-i interposed. Piezoelectric element 5i-a is arranged at a position closest to one end of drive cantilever 3-i connected to support cantilever 2-i. Piezoelectric element 5i-d is arranged at a position closest to the other end of drive cantilever 3-i connected to fixed portion 4-i.

Although not illustrated in the figures, piezoelectric element 5i-a, b, c, d (i=1 to 4) is connected to an upper electrode and a lower electrode for applying a drive voltage. In the present embodiment, the lower electrodes of piezoelectric elements 5-i-a, b, c, d are grounded, and a drive voltage is applied to the upper electrodes of piezoelectric elements 5i-a, b, c, d, so that dielectric polarization directions of all piezoelectric elements 5i-a, b, c, d are identical. Alternatively, the upper electrodes of piezoelectric elements 5i-a, b, c, d may be grounded, and voltage may be applied to the lower electrodes of piezoelectric elements 5i-a, b, c, d, so that the dielectric polarization directions of all piezoelectric elements 5i-a, b, c, d are identical.

A power supply unit 62 applies AC voltage to piezoelectric elements 5i-a, b, c, d. A control unit 61 controls output voltage of power supply unit 62.

Figure 3:
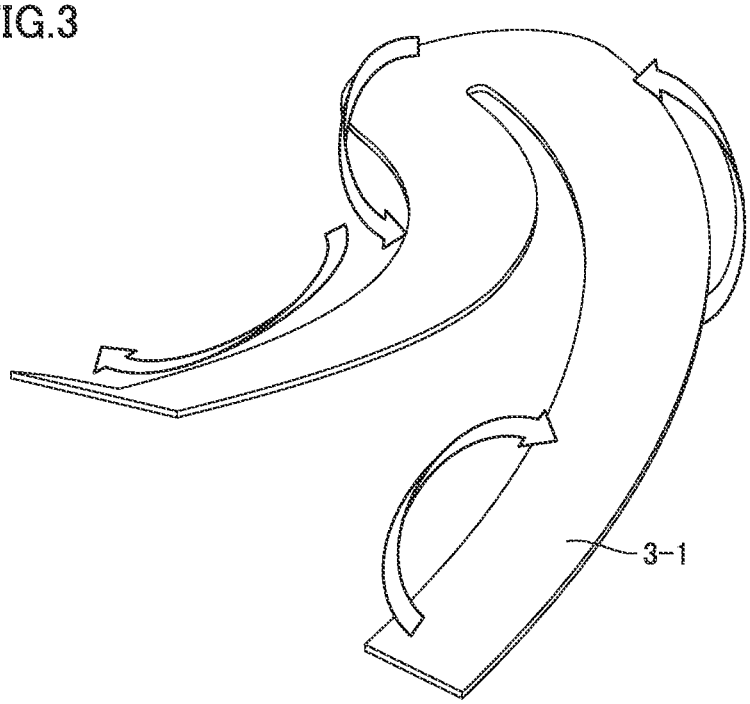
FIG. 3 is a diagram illustrating warp deformation of a drive cantilever.

When power supply unit 62 applies a drive voltage to piezoelectric elements 5-i-a, b, c, d (i=1 to 4), piezoelectric elements 5i-a, b, c, d expand and contract on a plane parallel to the XY plane so that drive cantilever 3-i warps as a whole. FIG. 3 is a diagram illustrating an example of warp deformation of drive cantilever 3-i. Drive cantilevers 3-2 to 3-4 are deformed similarly. Because of the warp deformation of drive cantilever 3-i, the connection portion between drive cantilever 3-i and support cantilever 2-i is driven in the Z axis direction, whereby mirror part 1 is driven.

Mirror part 1 precesses by setting the frequency of AC voltage applied to each of a plurality of piezoelectric elements 5i-a, b, c, d to a predetermined common value and setting the phase of AC voltage applied to each of a plurality of piezoelectric elements 5i-a, b, c, d to a value determined according to the position of the piezoelectric element.

That is, with application of such AC voltage to a plurality of piezoelectric elements, the mirror inscribed angle $\Psi$ at which the out-of-plane direction of the outer peripheral portion of mirror part 1 achieves the largest displacement changes with time at regular intervals, whereby mirror part 1 precesses.

Silicon mirror part 1C is formed of a support layer and an active layer of a silicon on insulator (SOI) substrate. Support cantilevers 2-1 to 2-4 and drive cantilevers 3-1 to 3-4 are formed of a support layer of a SOI substrate.

As described above, according to the first embodiment, since mirror part 1 precesses, the in-plane scan range of mirror part 1 is increased.

(Note)

Optical scanning device 100 in the first embodiment has the following features.

(1) Optical scanning device 100 includes a mirror part (1) having a mirror surface (1B) configured to reflect light, N (N≥3) support cantilevers (2-1 to 2-4) supporting the mirror part (1) swingably, and N drive cantilevers (3-1 to 3-4) respectively connected to N support cantilevers (2-1 to 2-4). N drive cantilevers (3-1 to 3-4) are arranged to surround mirror part 1. An end of both ends of each of N drive cantilevers (3-1 to 3-4) that is not connected to the support cantilever (2-1 to 2-4) is fixed. Each of N drive cantilevers (3-1 to 3-4) has a shape bent one or more times.

Optical scanning device 100 further includes a plurality of driving piezoelectric elements (5-1-a to d, 5-2-a to d, 5-3-a to *d*, 5-4-*a* to *d*) secured on N drive cantilevers (3-1 to 3-4) and a power supply unit (62) configured to apply AC voltage to a plurality of piezoelectric elements (5-1-*a* to *d*, 5-2-*a* to *d*, 5-3-*a* to *d*, 5-4-*a* to *d*). The mirror part (1) precesses by setting the frequency of AC voltage applied to each of a plurality of piezoelectric elements (5-1-*a* to *d*, 5-2-*a* to *d*, 5-3-*a* to *d*, 5-4-*a* to *d*) to a predetermined command value and setting the phase of AC voltage applied to each of a plurality of piezoelectric elements 5-1-*a* to *d*, 5-2-*a* to *d*, 5-3-*a* to *d*, 5-4-*a* to *d*) to a predetermined value according to the position of the piezoelectric element.

Such a configuration allows the mirror part to precess and thereby increases the scan range of the mirror part.

Second Embodiment

The result of modal analysis of mirror part 1 is described.

Figure 4:
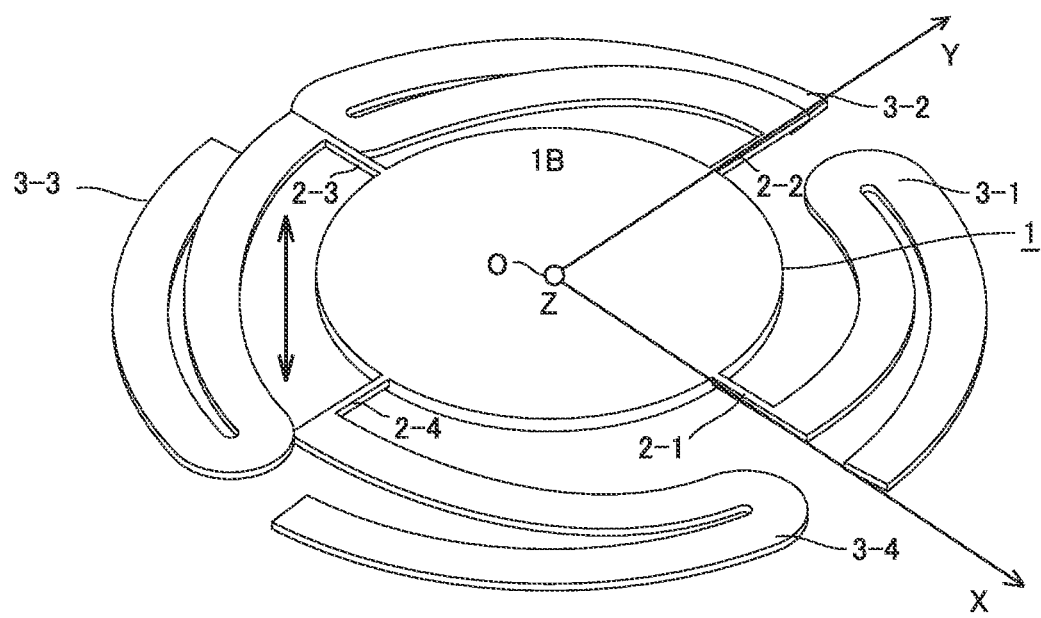
FIG. 4 is a diagram illustrating displacement of mirror part 1 in a natural frequency mode 1.
Figure 5:
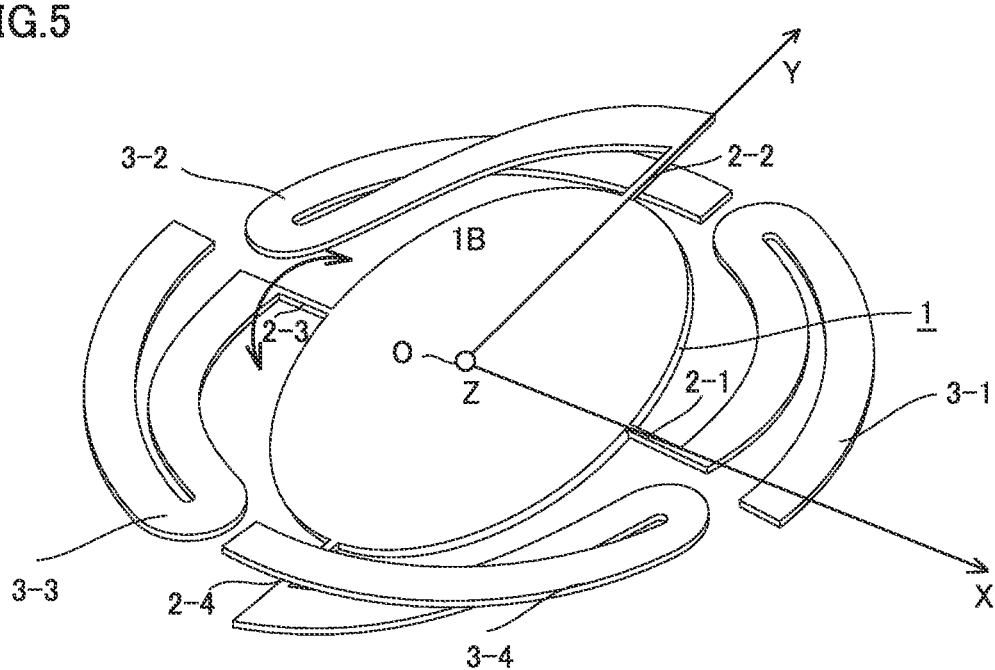
FIG. 5 is a diagram illustrating displacement of mirror part 1 in a natural frequency mode 2.
Figure 6:
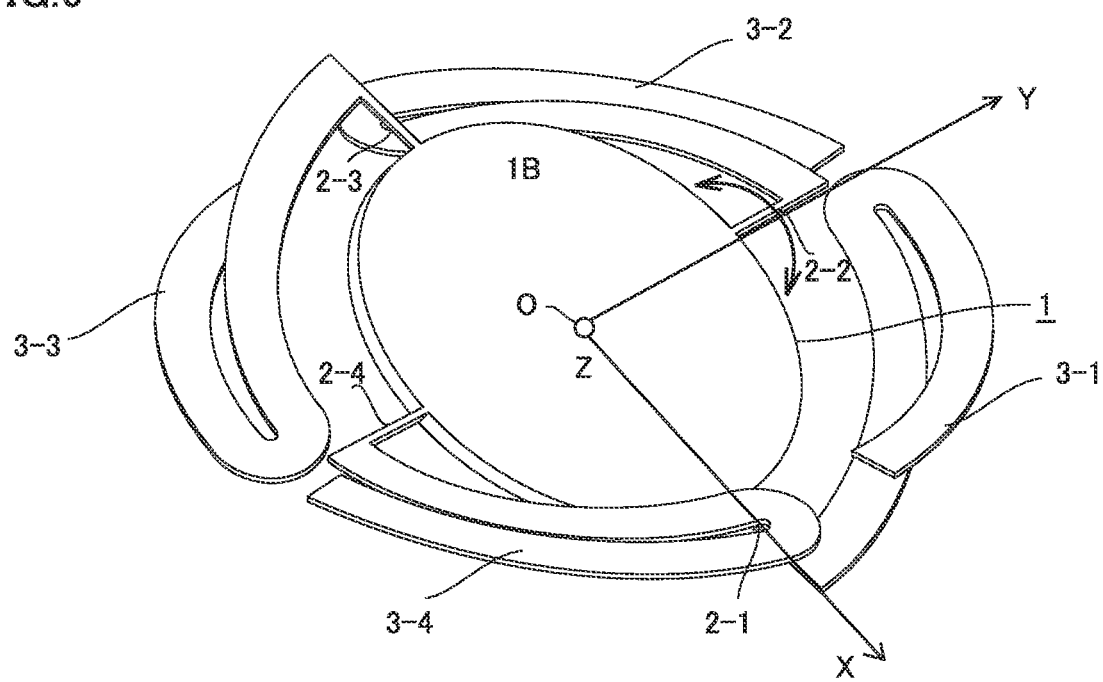
FIG. 6 is a diagram illustrating displacement of mirror part 1 in a natural frequency mode 3.

FIG. 4 is a diagram illustrating displacement of mirror part 1 in a natural frequency mode 1. FIG. 5 is a diagram illustrating displacement of mirror part 1 in a natural frequency mode 2. FIG. 6 is a diagram illustrating displacement of mirror part 1 in a natural frequency mode 3.

Referring to FIG. 4 to FIG. 6, in natural frequency mode 1, mirror part 1 is translationally displaced in the Z axis direction. In natural frequency mode 2, mirror part 1 is rotationally displaced around a first axis. In natural frequency mode 3, mirror part 1 is rotationally displaced around a second axis.

The first axis is parallel to mirror surface 1B, and the direction of the first axis is the direction of a straight line connecting the center of mirror part 1 with the connection portion between mirror part 1 and support cantilever 2-1. The second axis is parallel to mirror surface 1B. The direction of the second axis is the direction of a straight line connecting the center of mirror part 1 with the connection portion between mirror part 1 and support cantilever 2-2. In FIG. 4, the first axis is the X axis, and the second axis is the Y axis.

When the optical scanning device includes N support cantilevers arranged in (360°/N) rotational symmetry with respect to the center axis of mirror part 1, the configuration is as follows.

The first axis is parallel to mirror surface 1B. The direction of the first axis is the direction of a straight line connecting the center of mirror part 1 with the connection portion between mirror part 1 and one of N support cantilevers. The second axis is parallel to mirror surface 1B and orthogonal to the first axis.

When the shape of mirror part 1 has 90-degree rotational symmetry on the XY plane, the resonance frequency in the natural frequency mode 2 matches the resonance frequency in the natural frequency mode 3. It is assumed that the resonance frequency in the natural frequency mode 2 and the natural frequency mode 3 when the shape of mirror part 1 has 90-degree rotational symmetry on the XY plane is F0.

Power supply unit 62 applies AC voltage having the resonance frequency F0 as a frequency to piezoelectric elements 5*i*-*a, b, c, d* (i=1 to 4), whereby a small strain of piezoelectric elements 5*i*-*a, b, c, d* causes a large displacement of drive cantilever 3-*i* (i=1 to 4). This can deflect mirror part 1 in the Z axis direction.

Figure 7:
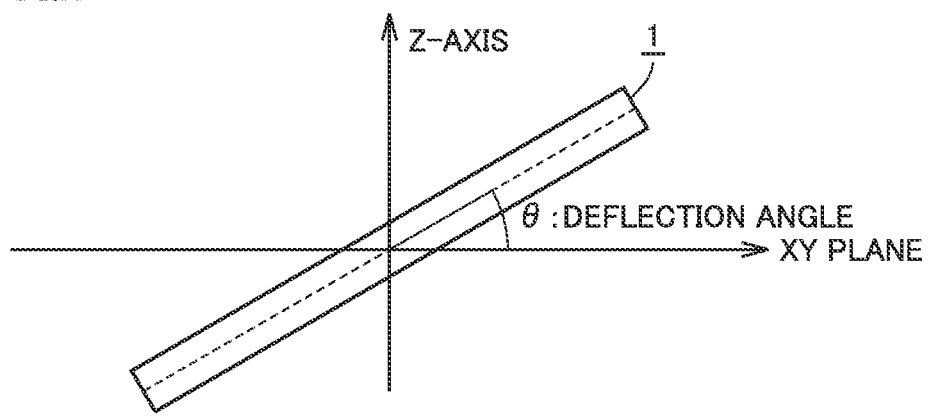
FIG. 7 is a diagram illustrating a deflection angle of the mirror part.

FIG. 7 is a diagram illustrating a deflection angle θ of mirror part 1.

As shown in FIG. 7, the deflection angle θ of mirror part 1 is the angle between mirror part 1 and the XY plane.

Figure 8:
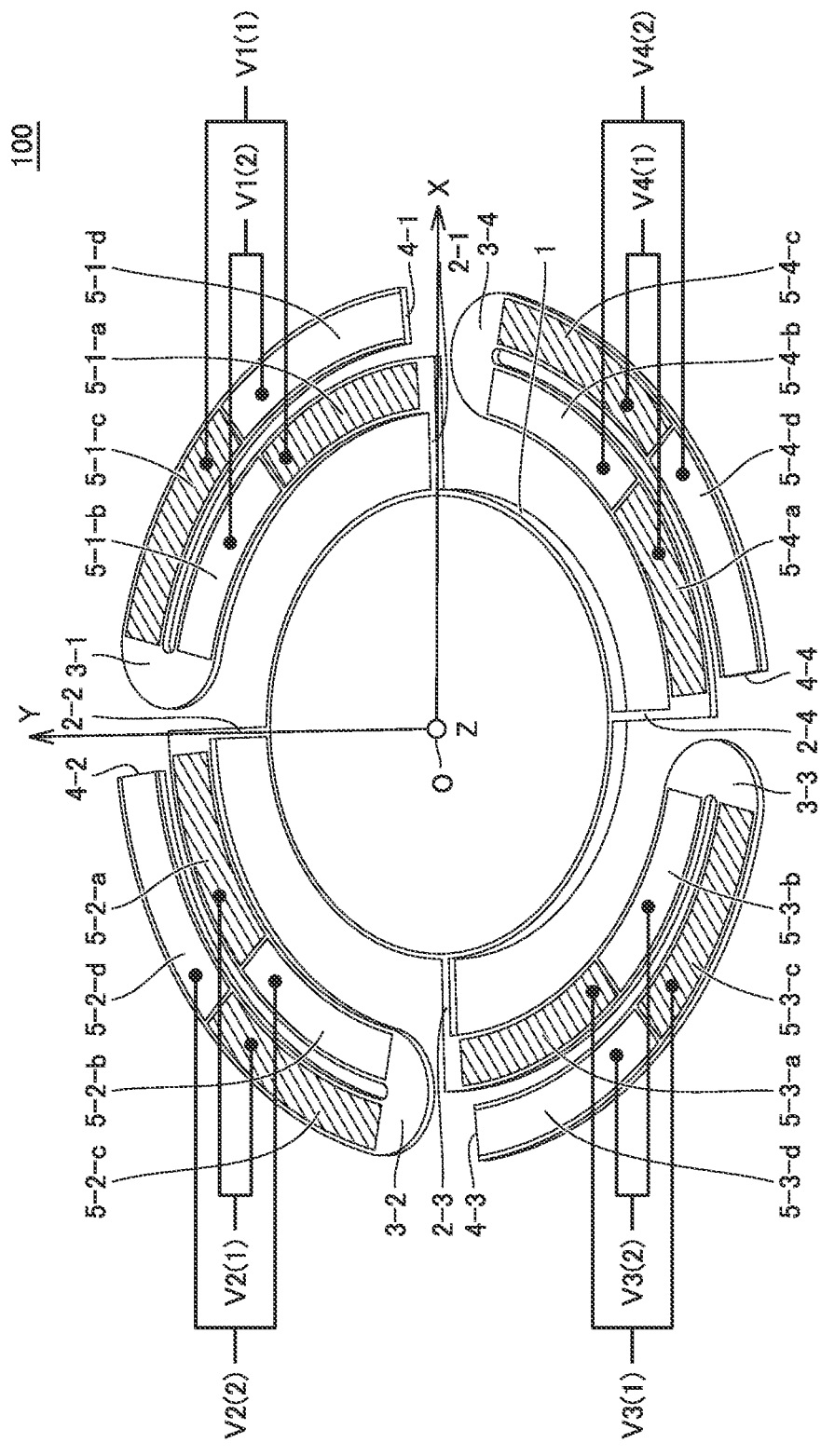
FIG. 8 is a diagram for explaining AC voltage applied to piezoelectric elements on the drive cantilever in a second embodiment.

FIG. 8 is a diagram for explaining AC voltage applied to piezoelectric elements 5*i*-*a* to *d* on drive cantilever 3-*i* (i=1 to 4) in a second embodiment.

Power supply unit 62 applies AC voltage of Equation (1) to piezoelectric elements 5*i*-*a*, 5*i*-*c* on drive cantilever 3-*i* (i=1 to 4), where i=1 to 4.

$$Vi(1)=Vs\times\sin(\omega t+90°\times(i-1)) \quad (1)$$

Here, $\omega=2\pi\times F0$. F0 is the resonance frequency in the natural frequency mode 2 and the resonance frequency in the natural frequency mode 3. t is time.

Power supply unit 62 applies AC voltage of Equation (2) to piezoelectric elements 5*i*-*b*, 5*i*-*d* on drive cantilever 3-*i* (i=1 to 4), where i=1 to 4.

$$Vi(2)=-Vi(1)=-Vs\times\sin(\omega t+90°\times(i-1)) \quad (2)$$

Since the signs of Vi(1) in Equation (1) and Vi(2) in Equation (2) are reversed, the phase of Vi(1) in Equation (1) and the phase of Vi(2) in Equation (2) differ by 180°.

Figure 9:
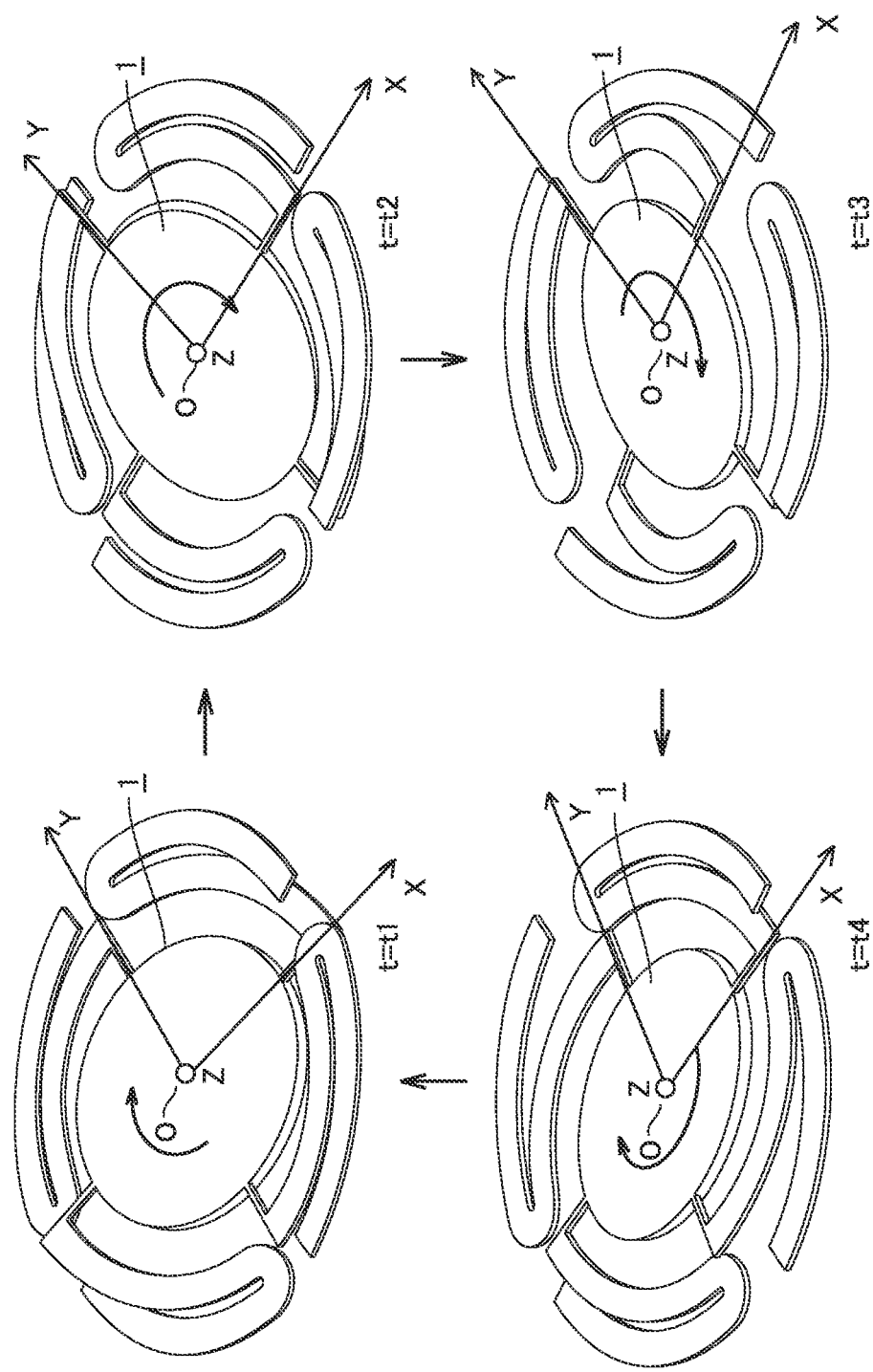
FIG. 9 is a diagram illustrating temporal change of displacement of the mirror part when AC voltage of Equation (1) is applied to some of piezoelectric elements and AC voltage of Equation (2) is applied to the remaining piezoelectric elements.

FIG. 9 is a diagram illustrating temporal change of displacement of mirror part 1 when AC voltage of Equation (1) is applied to piezoelectric elements 5*i*-*a, c* (i=1 to 4) and AC voltage of Equation (2) is applied to piezoelectric elements 5*i*-*b, d*. As shown in FIG. 9, as the time progresses (t1→t2→t3→t4), the portion of mirror part 1 that deflects in the Z axis direction turns around the Z axis. Such displacement is called all-round rotational displacement of mirror part 1. In other words, all-round rotational displacement of mirror part 1 refers to displacement of mirror part 1 in such a manner that the center axis of mirror part 1 makes a turn while the deflection angle θ of mirror part 1 is kept constant.

Referring to FIG. 1 again, detecting piezoelectric element 6-*i* is arranged at the joint portion between support cantilever 2-*i* and drive cantilever 3-*i*. The reason why it is arranged at the joint portion is that the joint portion has high stress. Detecting piezoelectric element 6-*i* is connected with an upper electrode and a lower electrode, although not shown in the figures. Detecting piezoelectric element 6-*i* generates electric charge proportional to the deflection angle θ of mirror part 1.

Control unit 61 monitors the electric charge generated in detecting piezoelectric element 6-*i* to measure the deflection angle θ of mirror part 1. Control unit 61 can control the deflection angle θ by adjusting the value of amplitude Vs in Equations (1) and (2).

The difference in drive characteristics of mirror part 1 between a first voltage application method A in the present embodiment above and other second and third voltage application methods B and C will now be described.

Figure 10:
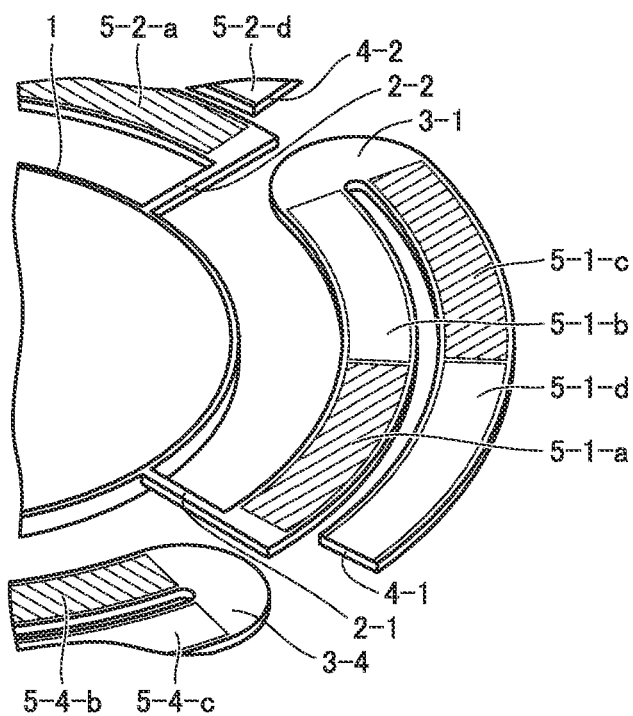
FIG. 10 is a diagram for explaining a first voltage application method A.

FIG. 10 is a diagram for explaining the first voltage application method A. In the first voltage application method A, voltage of Equation (1) is applied to piezoelectric element 5*i*-*a* and piezoelectric element 5*i*-*c*, and voltage of Equation (2) is applied to piezoelectric element 5*i*-*b* and piezoelectric element 5*i*-*d*.

Figure 11:
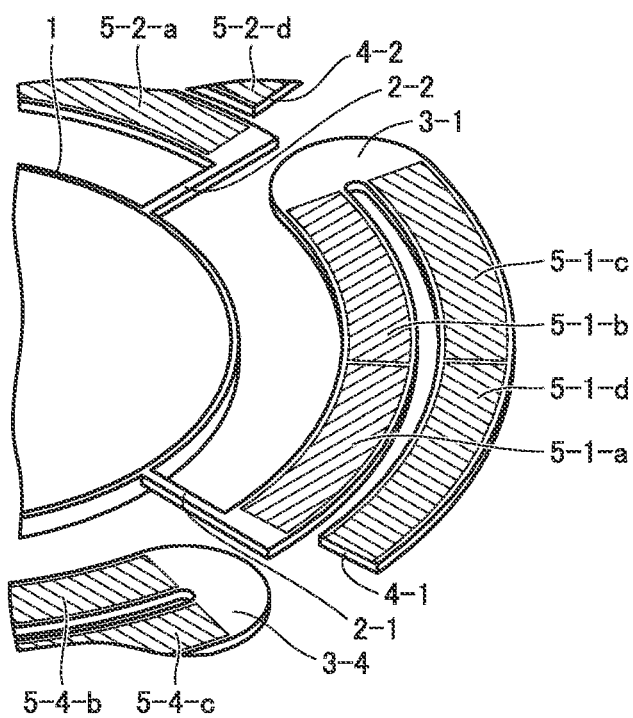
FIG. 11 is a diagram for explaining a second voltage application method B.

FIG. 11 is a diagram for explaining the second voltage application method B. In the second voltage application method B, voltage of Equation (1) is applied to piezoelectric element 5*i*-*a* and piezoelectric element 5*i*-*b*, and voltage of Equation (2) is applied to piezoelectric element 5*i*-*c* and piezoelectric element 5*i*-*d*.

Figure 12:
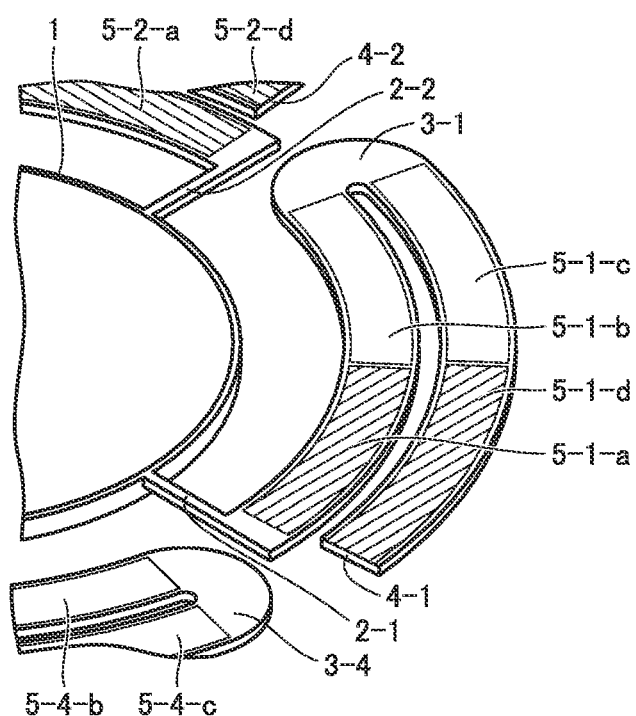
FIG. 12 is a diagram for explaining a third voltage application method C.

FIG. 12 is a diagram for explaining the third voltage application method C. In the third voltage application method C, voltage of Equation (1) is applied to piezoelectric element 5*i*-*a* and piezoelectric element 5*i*-*d*, and voltage of Equation (2) is applied to piezoelectric element 5*i*-*b* and piezoelectric element 5*i*-*c*.

Figure 13:
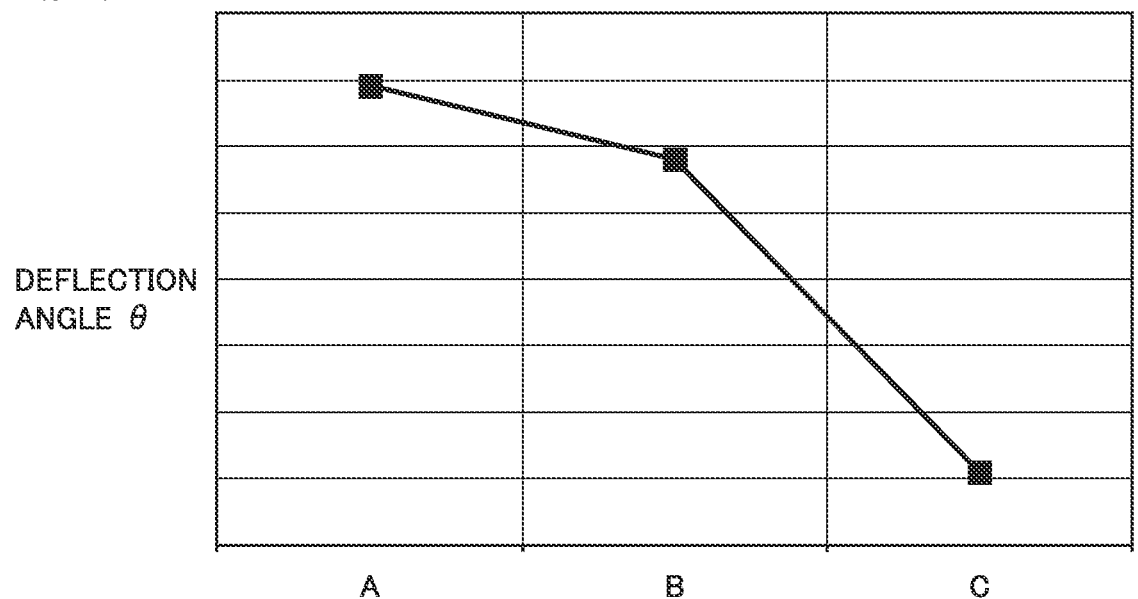
FIG. 13 is a diagram illustrating the drive characteristics of the mirror part in the first voltage application method A, the second voltage application method B, and the third voltage application method C.

FIG. 13 is a diagram illustrating the drive characteristics of mirror part 1 in the first voltage application method A, the second voltage application method B, and the third voltage application method C.

The vertical axis in FIG. 13 shows the deflection angle θ of mirror part 1. As shown in FIG. 13, the deflection angle θ is largest in the first voltage application method A.

Figure 14:
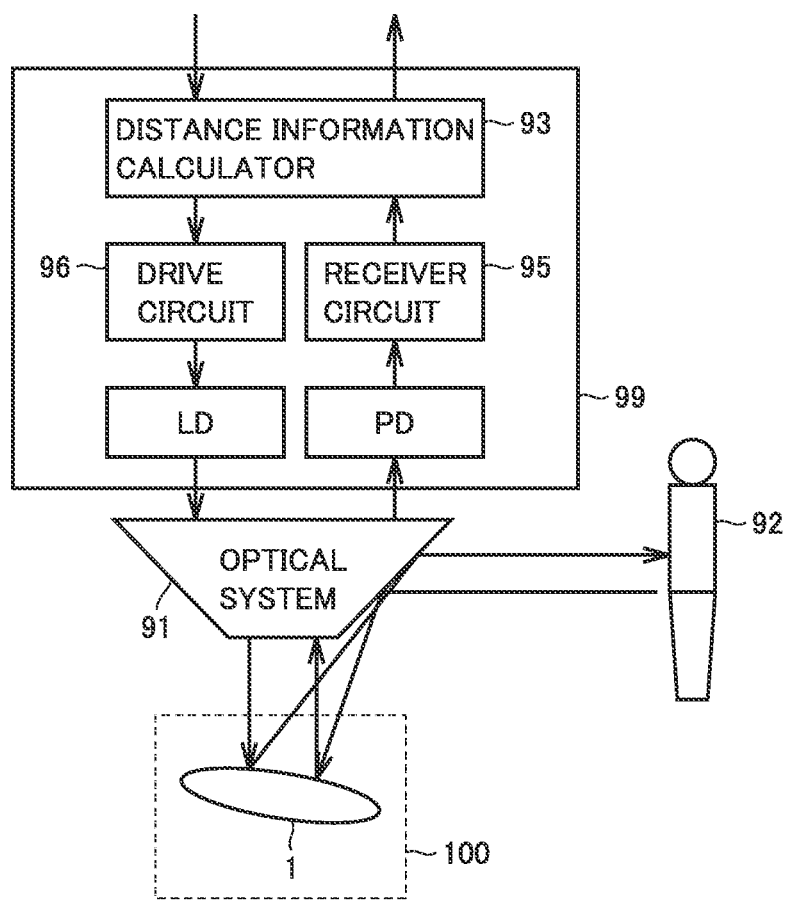
FIG. 14 is a schematic diagram of a laser distance sensor including the optical scanning device.

FIG. 14 is a schematic diagram of a laser distance sensor including optical scanning device 100.

The laser distance sensor includes a sensing unit 99, an optical system 91, and optical scanning device 100. Sensing unit 99 includes a distance information calculator 93, a drive circuit 96, a laser diode LD, a photodiode PD, and a receiver circuit 95.

Distance information calculator 93 instructs drive circuit 96 to output emission light in order to calculate the distance to a target 92.

Drive circuit 96 drives laser diode LD. Transmission light emitted by laser diode LD is collected by optical system 91 and applied to mirror part 1. Light reflected by mirror part 1 is reflected by optical system 91 and sent to target 92.

Light scattered by target 92 is directed again to mirror part 1. Light reflected by mirror part 1 is collected by optical system 91 and sent to photodiode PD. Photodiode PD converts the detected received light into voltage and sends the voltage to receiver circuit 95. Receiver circuit 95 notifies distance information calculator 93 that received light is input, based on change in voltage from photodiode PD.

Distance information calculator 93 calculates the distance to target 92 based on the difference between the time at which emission light is output and the time at which received light is input.

A method of manufacturing optical scanning device 100 will now be described.

FIGS. 15(a) to 15(i) are cross-sectional views of optical scanning device 100 in a manufacturing process.

Mirror part 1 and the like are formed using the crystal plane (100) of an SOI substrate which is a kind of semiconductor substrates.

Figure 15:
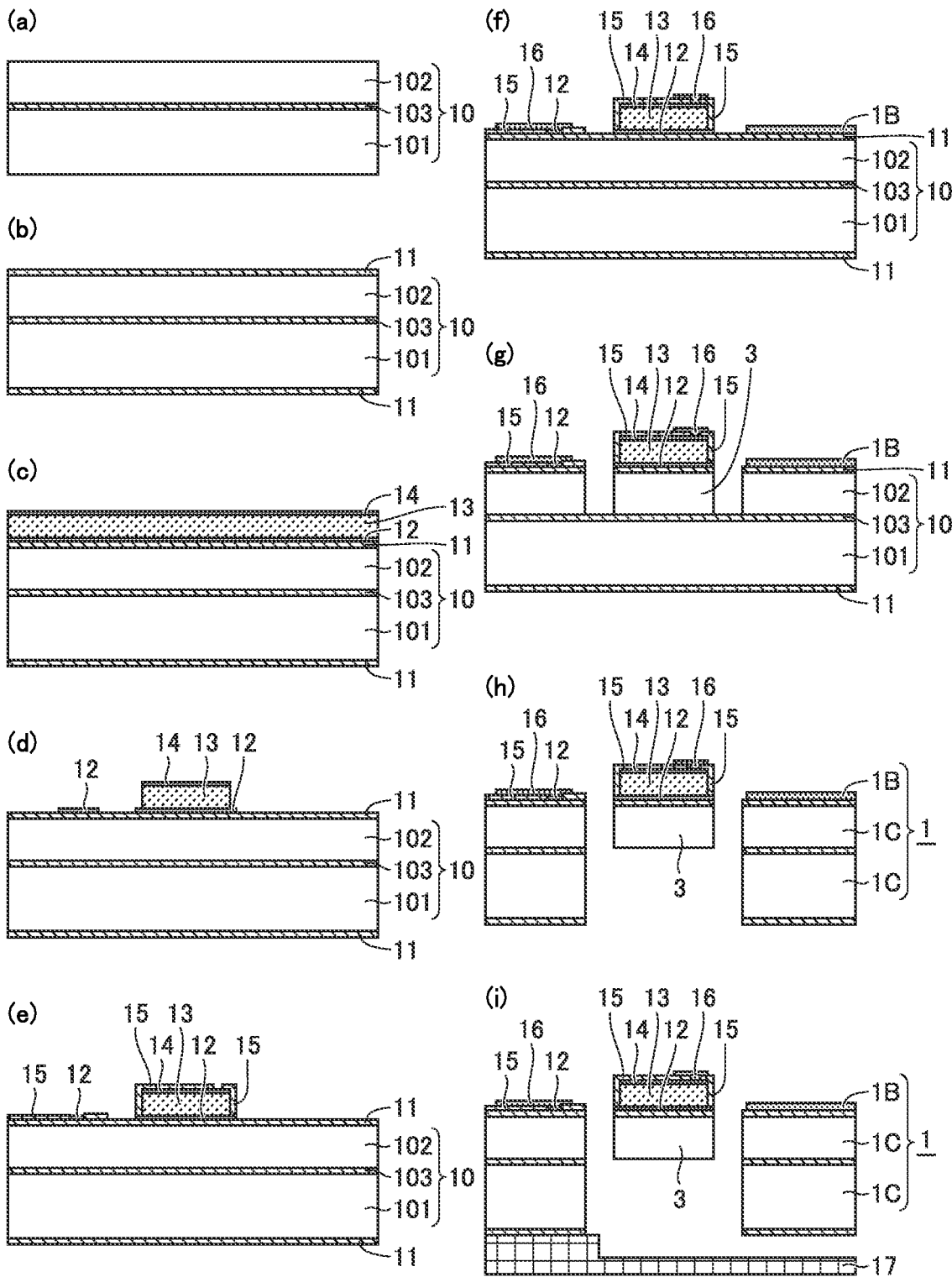
FIGS. 15(a) to 15(i) are cross-sectional views of the optical scanning device in a manufacturing process.

In FIG. 15(a), an SOI substrate 10 is used, in which a silicon oxide film 103 is sandwiched between a monocrystalline silicon support layer 101 and a monocrystalline silicon active layer 102. The mechanical property of the crystal plane (100) of the SOI substrate is 4-fold symmetry.

In FIG. 15(b), an insulating film 11 is formed on the front surface and the back surface of SOI substrate 10, for example, by thermal oxidation.

In FIG. 15(c), a lower layer electrode 12 such as Ti/Pt is formed on the front surface side of SOI substrate 10, for example, by sputtering, and a piezoelectric thin film 13 such as lead zirconate titanate (PZT) is formed thereon, for example, by sputtering or sol-gel process, and an upper layer electrode 14 such as Ti/Pt is formed thereon, for example, by sputtering.

In FIG. 15(d), lower layer electrode 12, piezoelectric thin film 13, and upper layer electrode 14 are patterned. Piezoelectric thin film 13 serves as driving piezoelectric elements 5i-a to d (i=1 to 4) and detecting piezoelectric element 6-i of mirror part 1. Lower layer electrode 12 is used not only for the lower layer electrode of piezoelectric thin film 13 but also for wiring. Lower layer electrode 12 on the left side in FIG. 15(d) is a wiring electrode.

In FIG. 15(e), an insulating film 15 such as an oxide film is formed and patterned. Insulating film 15 is a film for protecting piezoelectric thin film 13 and preventing short-circuit between electrodes, and a contact hole between lower layer electrode 12 and upper layer electrode 14 is formed for leading out an electrode.

In FIG. 15(f), a wiring electrode 16 and a mirror surface 1B are formed. Wiring electrode 16 is a low-resistance metal such as Ti/Pd/Au, and the surface of mirror surface 1B is a high-reflectivity material such as Au. Wiring electrode 16 and mirror surface 1B may be the same material. Mirror surface 1B may have a high-reflectivity dielectric multilayer film on its surface.

In FIG. 15(g), silicon active layer 102 is processed using an oxide film 103 as an etching stop layer by deep reactive ion etching (DRIE). In this etching, main constituent parts of optical scanning device 100, such as drive cantilevers 3-1 to 3-4 and support cantilevers 2-1 to 2-4, are formed.

In FIG. 15(h), silicon support layer 101 is processed from its back surface by DRIE to remove unnecessary parts of silicon oxide film 103. In this process, mirror part 1 and the like are formed, and the wafer process of the optical scanning device is completed.

In FIG. 15(i), a chip is isolated and then bonded to a package 17 and electrically connected to the outside, for example, by wire bonding. Package 17 may be sealed under reduced pressure atmosphere in order to increase the deflection angle θ as necessary. The method of manufacturing an optical scanning device in the present embodiment does not include a special process and therefore can be carried out using a typical silicon MEMS fabrication facility and a piezoelectric element fabrication facility.

As described above, in the second embodiment, four drive cantilevers are driven with a 90-degree phase difference by the rotational displacement resonance frequency around the support cantilever, whereby mirror part 1 can make all-round rotational displacement with a large deflection angle (inclination angle).

The structure of the drive cantilever extending along the outer periphery can reduce the dedicated area for the drive cantilever. The U-shaped bend shape of the drive cantilever can reduce stress exerted on the drive cantilever and stress exerted on the piezoelectric element serving as a drive source, compared with a drive cantilever with no bend structure, if the amount of displacement of mirror part 1 is the same. Consequently, the deflection angle can be increased. In addition, the U-shape of the drive cantilever can reduce the drive cantilever spring constant in the mirror in-plane direction. This can reduce misalignment of the mirror surface and change in the deflection angle even when the position of the fixed portion of the drive cantilever is shifted due to temperature change or the like.

Since the deflection angle θ is affected by the viscosity of air, the entire optical scanning device may be seal-packaged under reduced pressure atmosphere in accordance with the required deflection angle θ.

In a conventional optical scanning device, because of limitations of the in-plane scan range, the surroundings of the optical scanning device are measured only partially.

However, in the optical scanning device in the present embodiment, a combination of all-round rotational displacement and scanning at the deflection angle enables acquisition of distance information in the 360-degree surroundings around the Z axis. For example, by scanning at a deflection angle θ of 10±5 degrees, light incident on mirror surface 1B can be received with the deflection angle θ of 10±5 degrees in the 360-degree surroundings around the Z axis.

(Note)

Optical scanning device 100 in the second embodiment has the following features.

(2) Optical scanning device 100 includes a mirror part (1) having a mirror surface (1B) configured to reflect light, N (N≥3) support cantilevers (2-1 to 2-4) supporting the mirror part (1) swingably, and N drive cantilevers (3-1 to 3-4) respectively connected to N support cantilevers (2-1 to 2-4). N drive cantilevers (3-1 to 3-4) are arranged to surround mirror part 1. An end of both ends of each of N drive cantilevers (3-1 to 3-4) that is not connected to the support cantilever (2-1 to 2-4) is fixed. Each of N drive cantilevers (3-1 to 3-4) has a shape bent one or more times. Optical scanning device 100 further includes a plurality of driving piezoelectric elements (5-1-$a$ to $d$, 5-2-$a$ to $d$, 5-3-$a$ to $d$, 5-4-$a$ to $d$) secured on N drive cantilevers (3-1 to 3-4) and a power supply unit (62) configured to apply AC voltage to a plurality of piezoelectric elements (5-1-$a$ to $d$, 5-2-$a$ to $d$, 5-3-$a$ to $d$, 5-4-$a$ to $d$). N support cantilevers (2-1 to 2-4) are arranged in (360°/N) rotational symmetry with respect the center axis of the mirror part (1). The mirror part (1) has a first natural frequency mode (natural frequency mode 2) of being rotationally displaced around a first axis (the X axis) and a second natural frequency mode (natural frequency mode 3) of being rotationally displaced around a second axis (the Y axis). The first axis (the X axis) and the second axis (the Y axis) are parallel to the mirror surface (1B). The direction of the first axis (the X axis) is the direction of a straight line connecting the center of the mirror part (1) with a connection portion between the mirror part (1) and one of N support cantilevers (2-1 to 2-4). The second axis (the Y axis) is orthogonal to the first axis (the X axis). Both of the resonance frequency in the first natural frequency mode (natural frequency mode 2) and the resonance frequency in the second natural frequency mode (natural frequency mode 3) are a first frequency (F0). The power supply unit (62) applies AC voltage at the first frequency (F0).

Such a configuration enables all-round rotational displacement of the mirror part (1) with a large deflection angle.

(3) Two piezoelectric elements (5$i$-$a$ and 5$i$-$b$ or 5$i$-$c$ and 5$i$-$d$) are arranged on each of a plurality of circumferential portions extending in the same direction as the circumferential direction of the mirror part (1), of the portions that constitute each of N drive cantilevers (3-$i$).

This configuration can minimize the number of piezoelectric elements and also minimize the number of spacings between adjacent piezoelectric elements. As a result, the area of the piezoelectric elements that can be secured on the drive cantilever can be increased and therefore the drive force of the mirror part (1) can be increased.

(4) The dielectric polarization directions of a plurality of piezoelectric elements (5$i$-$a$ to $d$) arranged on each of N drive cantilevers (3-$i$) are the same. The power supply unit (62) applies voltages with opposite phases to two piezoelectric elements (5-$i$-$a$ and 5$i$-$b$, and 5$i$-$c$ and 5$i$-$d$) arranged on each of a plurality of circumferential portions, and applies AC voltages with phases opposite to each other to two piezoelectric elements (5$i$-$b$ and 5$i$-$c$) adjacent with the circumferential portion interposed therebetween.

With such a configuration, AC voltage can be applied to a plurality of piezoelectric elements (5$i$-$a$ to $d$) such that the mirror part (1) can make all-round rotational displacement.

(5) The control unit (61) controls the amplitude of AC voltage output from the power supply unit (62) to scan the deflection angle (θ) of the mirror part (1).

With such a configuration, three-dimensional information of a target can be acquired.

(6) The mirror part (1) is formed using the crystal plane (100) of a semiconductor substrate. N is 4×n (n is a natural number). The shape of the mirror surface (1B) is circular.

With such a configuration, the mechanical properties of a plurality of drive cantilevers can be made uniform.

Third Embodiment

Figure 16:
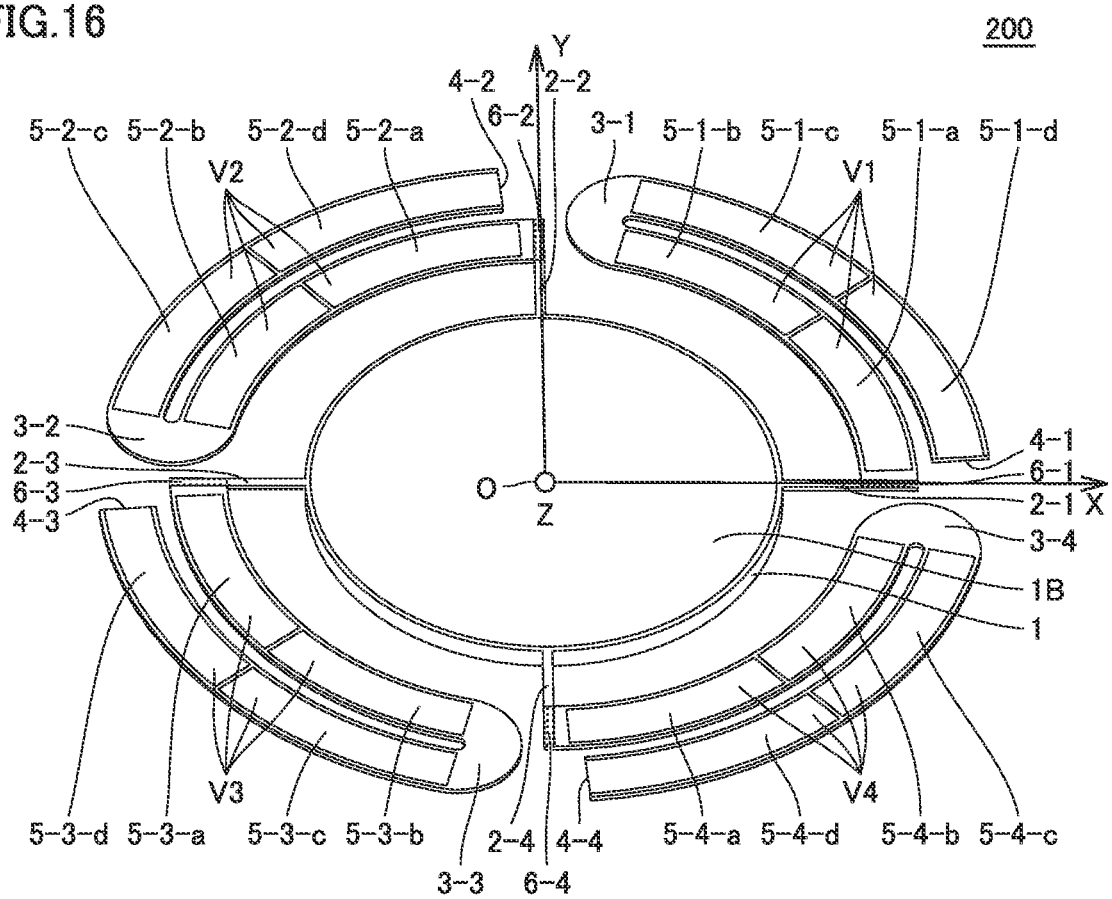
FIG. 16 is a diagram for explaining AC voltage applied to piezoelectric elements on the drive cantilever in a third embodiment.

FIG. 16 is a diagram for explaining AC voltage applied to piezoelectric elements 5$i$-$a$ to $d$ on drive cantilever 3-$i$ (i=1 to 4) of an optical scanning device 200 in a third embodiment.

Optical scanning device 200 in the third embodiment differs from optical scanning device 100 in the second embodiment in the following points.

In the second embodiment, the lower electrodes of piezoelectric elements 5$i$-$a$, $b$, $c$, $d$ (i=1 to 4) are grounded, and voltage is applied to the upper electrodes of piezoelectric elements 5$i$-$a$, $b$, $c$, $d$, so that the dielectric polarization directions of all of 16 piezoelectric elements 5$i$-$a$, $b$, $c$, $d$ are the same.

By contrast, in the present embodiment, the lower electrodes of piezoelectric elements 5$i$-$a$, $c$ (i=1 to 4) are grounded, and voltage is applied to the upper electrodes of piezoelectric elements 5$i$-$a$, $c$, so that the dielectric polarization direction of eight piezoelectric elements 5$i$-$a$, $c$ is a first direction, whereas the upper electrodes of piezoelectric elements 5$i$-$b$, $d$ are grounded, and voltage is applied to the lower electrodes of piezoelectric elements 5$i$-$b$, $d$, so that the dielectric polarization direction of eight piezoelectric elements 5$i$-$b$, $d$ is a second direction opposite to the first direction.

In the second embodiment, power supply unit 62 applies AC voltage of Equation (1) to eight piezoelectric elements 5$i$-$a$, 5$i$-$c$ on drive cantilevers 3-$i$ (i=1 to 4) and applies AC voltage of Equation (2) to eight piezoelectric elements 5$i$-$b$, 5$i$-$d$ on drive cantilevers 3-$i$.

By contrast, in the third embodiment, power supply unit 62 applies AC voltage of Equation (1) to 16 piezoelectric elements 5$i$-$a$, 5$i$-$b$, 5$i$-$c$, 5$i$-$c$ on drive cantilever 3-$i$ (i=1 to 4).

The third embodiment achieves the similar effects as in the first embodiment.

(Note)

Optical scanning device 200 in the third embodiment has the following features.

(7) The dielectric polarization directions of two piezoelectric elements arranged on each of a plurality of circumferential portions (5$i$-$a$ and 5$i$-$b$, and 5$i$-$c$ and 5$i$-$d$) are opposite. The dielectric polarization directions of two piezoelectric elements (5$i$-$b$ and 5$i$-$c$) adjacent with the bend portion interposed therebetween are opposite. The power supply unit (62) applies AC voltage of the same phase to a plurality of piezoelectric elements (5$i$-$a$ to $d$) arranged on each of N drive cantilevers (3-$i$).

With such a configuration, even when the dielectric polarization directions of adjacent piezoelectric elements are opposite directions, a plurality of piezoelectric elements (5$i$-$a$ to $d$) can be driven such that the mirror part (1) can make all-round rotational displacement.

Fourth Embodiment

Figure 17:
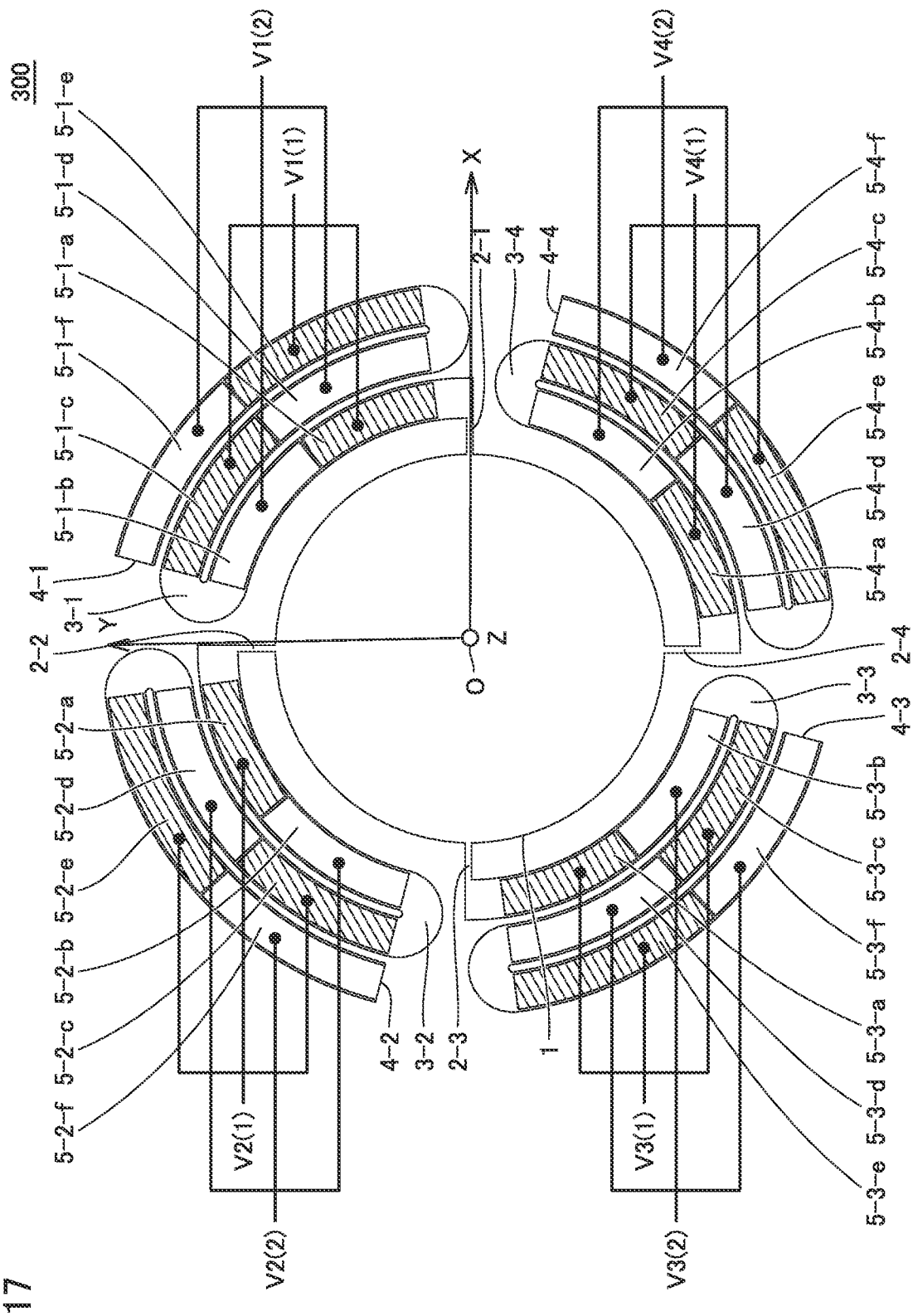
FIG. 17 is a diagram illustrating the front surface of the main part of the optical scanning device in a fourth embodiment.

FIG. 17 is a diagram illustrating the front surface of the main part of an optical scanning device 300 in a fourth embodiment.

Optical scanning device 400 in the fourth embodiment differs from optical scanning device 100 in the second embodiment in the following points.

Referring to FIG. 17, drive cantilevers 3-1 to 3-4 are arranged to surround mirror part 1. Drive cantilevers 3-1 to 3-4 have the same shape and size. Drive cantilevers 3-1 to 3-4 are arranged in 90° rotational symmetry with respect to the center axis of mirror part 1.

One end of drive cantilever 3-$i$ (i=1 to 4) is connected to support cantilever 2-$i$ and the other end of drive cantilever 3-$i$ is connected to fixed portion 4-$i$. Drive cantilever 3-$i$ has a shape bent twice at 180°.

Drive cantilever 3-$i$ (i=1 to 4) has three circumferential portions extending in the same direction as the circumferential direction of mirror part 1 and bend portions. In other words, drive cantilevers 3-1 to 3-4 have a continuous U shape such that U-shaped portions are formed serpentinely so as to be oriented in opposite directions alternately. The longitudinal portion of the U shape is curved in the same direction as the circumference direction of mirror part 1.

Piezoelectric elements 5$i$-$a$, $b$, $c$, $d$, $e$, $f$ (i=1 to 4) are secured on drive cantilever 3-$i$. Piezoelectric elements 5$i$-$a$, $b$, $c$, $d$, $e$, $f$ have the same shape and size.

Of the portions that constitute drive cantilever 3-$i$ (i=1 to 4), a first portion of three circumferential portions extending in the same direction as the circumferential direction of mirror part 1 has piezoelectric elements 5$i$-$a$, $b$, a second portion has piezoelectric elements 5$i$-$c$, $d$, and a third portion has piezoelectric elements 5$i$-$e$, $f$. The first portion is at a position closest to mirror part 1, and the third portion is at a position furthest from mirror part 1.

Piezoelectric element 5$i$-$a$ (i=1 to 4) and piezoelectric element 5$i$-$b$ are spaced apart from each other. Piezoelectric element 5$i$-$c$ and piezoelectric element 5-$i$-$d$ are spaced apart from each other. Piezoelectric element 5$i$-$e$ and piezoelectric element 5$i$-$f$ are spaced apart from each other. Piezoelectric element 5$i$-$b$ and piezoelectric element 5$i$-$c$ are adjacent to each other with a first bend portion of drive cantilever 3-$i$ interposed therebetween. Piezoelectric element 5$i$-$d$ and piezoelectric element 5$i$-$e$ are adjacent to each other with a second bend portion of drive cantilever 3-$i$ interposed therebetween. Piezoelectric element 5$i$-$a$ is arranged at a position closest to one end of drive cantilever 3-$i$ connected to support cantilever 2-$i$. Piezoelectric element 5$i$-$f$ is arranged at a position closest to the other end of drive cantilever 3-$i$ connected to fixed portion 4-$i$.

Not-shown upper electrodes and lower electrodes are connected to piezoelectric elements 5$i$-$a$, $b$, $c$, $d$, $e$, $f$ (i=1 to 4) for applying a drive voltage. The dielectric polarization directions of piezoelectric elements 5$i$-$a$, $b$, $c$, $d$, $e$, $f$ are the same.

Power supply unit 62 applies AC voltage of Equation (1) to piezoelectric elements 5$i$-$a$, 5$i$-$c$, 5$i$-$e$ on drive cantilever 3-$i$ (i=1 to 4) and applies AC voltage of Equation (2) to piezoelectric elements 5$i$-$b$, 5$i$-$d$, 5$i$-$f$ on drive cantilever 3-$i$.

As described above, in the present embodiment, drive cantilever 3-$i$ is bent twice, whereby the drive force by drive cantilever 3-$i$ is increased and consequently, the deflection angle θ of mirror part 1 is increased.

In the foregoing embodiment, drive cantilever 3-$i$ (i=1 to 4) has a shape bent twice at 180° but may have a shape bent three or more times at 180°. When the number of bends in drive cantilever 3-$i$ is increased, the drive force by drive cantilever 3-$i$ is increased. Consequently, the deflection angle of mirror part 1 is increased but the resonance frequency is reduced. The number of bends in drive cantilever 3-$i$ is therefore adjusted in accordance with the required resonance frequency and the required deflection angle.

Fifth Embodiment

Figure 18:
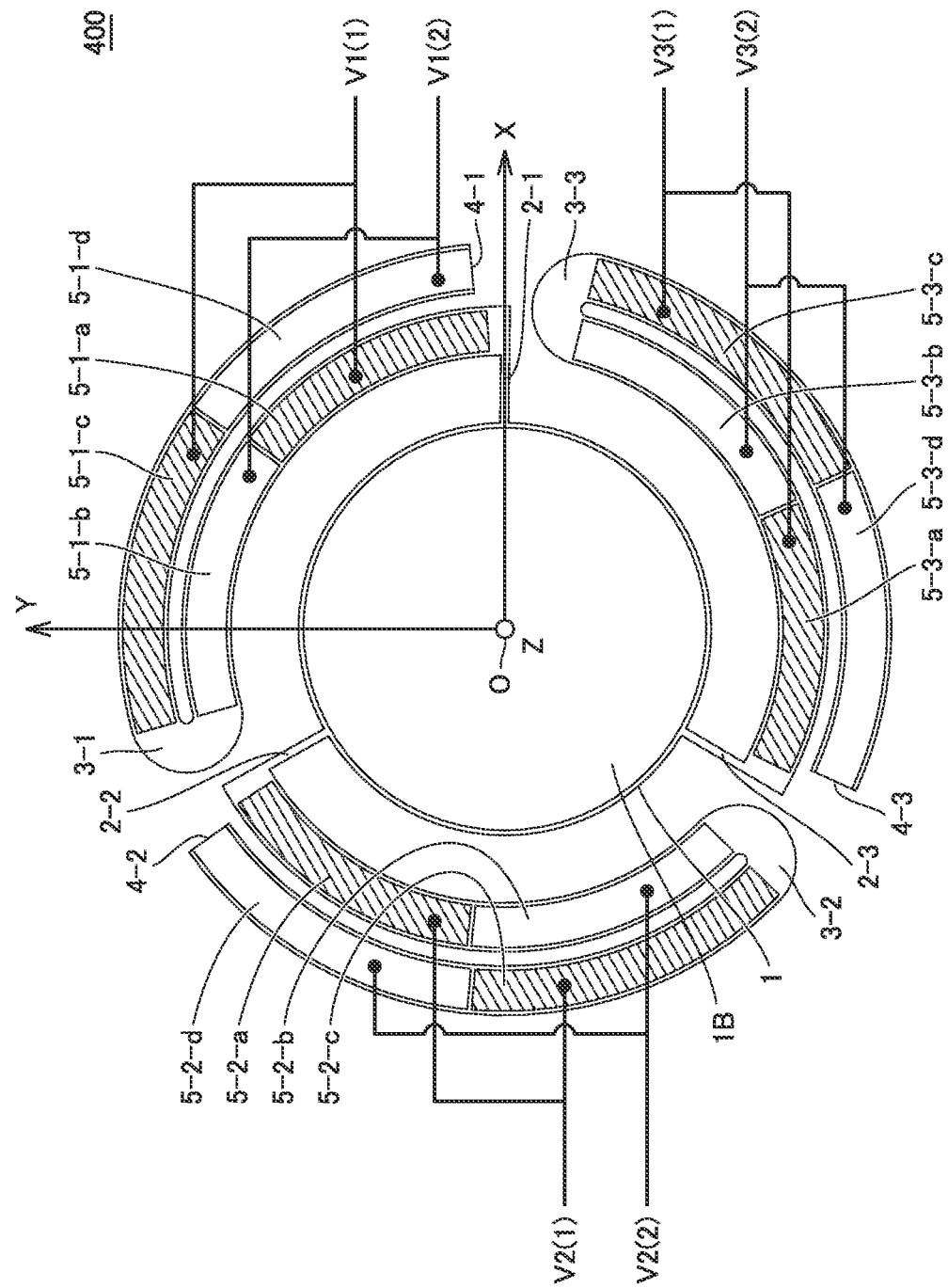
FIG. 18 is a diagram illustrating the front surface of the main part of the optical scanning device in a fifth embodiment.

FIG. 18 is a diagram illustrating the front surface of the main part of an optical scanning device 400 in a fifth embodiment.

Optical scanning device 400 in the fifth embodiment differs from optical scanning device 100 in the second embodiment in the following points.

Referring to FIG. 18, mirror part 1 is formed using the crystal plane (111) of an SOI substrate which is a kind of semiconductor substrates. The mechanical property of the crystal plane (111) of an SOI substrate is 3-fold symmetry.

Support cantilevers 2-1 to 2-3 support a silicon mirror part 1C swingably. Support cantilevers 2-1 to 2-3 have the same shape and size. Support cantilevers 2-1 to 2-3 are arranged in 120° rotational symmetry with respect to the center axis (the Z axis) of mirror part 1.

Drive cantilevers 3-1 to 3-3 are arranged to surround mirror part 1. Drive cantilevers 3-1 to 3-3 have the same shape and size. Drive cantilevers 3-1 to 3-3 are arranged in 120° rotational symmetry with respect to the center axis of mirror part 1.

One end of drive cantilever 3-$i$ (i=1 to 3) is connected to support cantilever 2-$i$, and the other end of drive cantilever 3-$i$ is connected to fixed portion 4-$i$. Drive cantilever 3-$i$ has a shape bent once at 180°. Drive cantilever 3-$i$ has two circumferential portions extending in the same direction as the circumferential direction of mirror part 1 and a bend portion.

Piezoelectric elements 5$i$-$a$, $b$, $c$, $d$ (i=1 to 3) are secured on drive cantilever 3-$i$. Piezoelectric elements 5$i$-$a$, $b$, $c$, $d$ have the same shape and size.

Of the portions that constitute drive cantilever 3-$i$ (i=1 to 3), a first portion of two circumferential portions extending in the same direction as the circumferential direction of mirror part 1 has piezoelectric elements 5$i$-$a$, $b$ and a second portion has piezoelectric elements 5$i$-$c$, $d$. Piezoelectric element 5$i$-$a$ and piezoelectric element 5$i$-$b$ are spaced apart from each other. Piezoelectric element 5$i$-$c$ and piezoelectric element 5$i$-$d$ are spaced apart from each other. Piezoelectric element 5$i$-$b$ and piezoelectric element 5$i$-$c$ are adjacent to each other with the bend portion of drive cantilever 3-$i$ interposed therebetween. Piezoelectric element 5$i$-$a$ is arranged at a position closest to one end of drive cantilever 3-$i$ connected to support cantilever 2-$i$. Piezoelectric element 5$i$-$d$ is arranged at a position closest to the other end of drive cantilever 3-$i$ connected to fixed portion 4-$i$.

Upper electrodes and lower electrodes are connected to piezoelectric elements 5$i$-$a$, $b$, $c$, $d$ (i=1 to 3) for applying a drive voltage. The dielectric polarization directions of piezoelectric elements 5$i$-$a$, $b$, $c$, $d$ are the same.

A first axis which is the rotation axis in the natural frequency mode 2 is parallel to mirror surface 1B. The direction of the first axis is the direction of a straight light connecting the center of mirror part 1 with a connection portion between mirror part 1 and support cantilever 2-1. A second axis which is the rotation axis in the natural frequency mode 3 is parallel to mirror surface 1B and orthogonal to the first axis. In FIG. 18, the first axis is the X axis, and the second axis is the Y axis.

Power supply unit 62 applies AC voltage of Equation (3) to piezoelectric elements 5$i$-$a$, 5$i$-$c$ on drive cantilever 3-$i$, where i=1 to 3.

$$Vi(1)=Vs \times \sin(\omega t + 120° \times (i-1)) \quad (3)$$

Here, ω=2πF0. F0 is the resonance frequency in the natural frequency mode 2 and the resonance frequency in the natural frequency mode 3. t is time.

Power supply unit 62 applies AC voltage of Equation (4) to piezoelectric elements 5*i-b*, 5*i-d* on drive cantilever 3-*i*, where i=1 to 3.

$$Vi(2)=-Vi(1)=-Vs\times\sin(\omega t+120°\times(i-1)) \quad (4)$$

Since the signs of Vi(1) in Equation (3) and Vi(2) in Equation (4) are reversed, the phase of Vi(1) in Equation (3) and the phase of Vi(2) in Equation (4) differ by 180°.

In the optical scanning device in the present embodiment, since the drive cantilevers are fewer than in the second embodiment, the number of drive voltages to be generated in power supply unit 62 can be reduced. Consequently, the configuration of power supply unit 62 can be simplified. In addition, since the support points at which mirror part 1 is displaced are fewer, the deflection angle can be easily increased.

Although the number of drive cantilevers is three in the present embodiment, the number of drive cantilevers is not limited thereto and may be N. Although three drive cantilevers 3-1 to 3-3 are ordered counterclockwise, embodiments are not limited thereto, and they may be ordered clockwise. That is, N drive cantilevers are ordered clockwise or counterclockwise.

When the number of drive cantilevers is N, power supply unit 62 applies AC voltage of Equation (3A) to piezoelectric elements 5*i-a*, 5*i-c* on drive cantilever 3-*i*, where i=1 to N.

$$Vi(1)=Vs\times\sin(\omega t+(360°/N)\times(i-1)) \quad (3A)$$

Here, ω=2π×F0. F0 is the resonance frequency in the natural frequency mode 2 and the resonance frequency in the natural frequency mode 3. t is time.

Power supply unit 62 applies AC voltage of Equation (4A) to piezoelectric elements 5*i-b*, 5*i-d* on drive cantilever 3-*i*, where i=1 to N.

$$Vi(2)=-Vi(1)=-Vs\times\sin(\omega t+(360°/N)\times(i-1)) \quad (4A)$$

Since the signs of Vi(1) in Equation (3A) and Vi(2) in Equation (4A) are reversed, the phase of Vi(1) in Equation (3A) and the phase of Vi(2) in Equation (4A) differ by 180°.

Therefore, in this case, the phase of AC voltage applied to the first piezoelectric element (5*i-a, b, c* or *d*) on the i-th drive cantilever (3-*i*) is larger by 360°/N than the phase of voltage applied to the second piezoelectric element (5-(*i*–1)-*a, b, c,* or *d*) on the (i−1)th drive cantilever (3-(*i*−1)).

In the present embodiment, N=3×1, and the shape of the front surface (mirror surface 1B) of mirror part 1 is circular. However, embodiments are not limited thereto. N may be 3×n (n is a natural number), and the shape of the front surface of mirror part 1 (mirror surface 1B) may be circular.

(Note)

Optical scanning device 400 in the fifth embodiment has the following features.

(8) N drive cantilevers (3-1 to 3-3) are ordered clockwise or counterclockwise. The phase of AC voltage applied by the power supply unit (62) to a first piezoelectric element (5-2-*a, b, c,* or *d*) on the i-th drive cantilever (for example, 3-2) is larger by (360°/N) than the phase of voltage applied to a second piezoelectric element (5-1-*a, b, c,* or *d*) on the (i−1)th drive cantilever (for example, 3-1). The position of the second piezoelectric element (5-1-*a, b, c,* or *d*) on the (i−1)th drive cantilever (3-1) is the same as the position of the first piezoelectric element (5-2-*a, b, c,* or *d*) on the i-th drive cantilever (3-2).

With such a configuration, AC voltage can be supplied to a plurality of piezoelectric elements on N drive cantilevers such that mirror part 1 can make all-round rotational displacement smoothly.

(9) The mirror part (1) is formed using the crystal plane (111) of a semiconductor substrate. N is 3×n (n is a natural number). The shape of the mirror surface (1B) is circular.

With such a configuration, an optical scanning device having drive cantilevers with uniform mechanical properties can be implemented.

Sixth Embodiment

Figure 19:
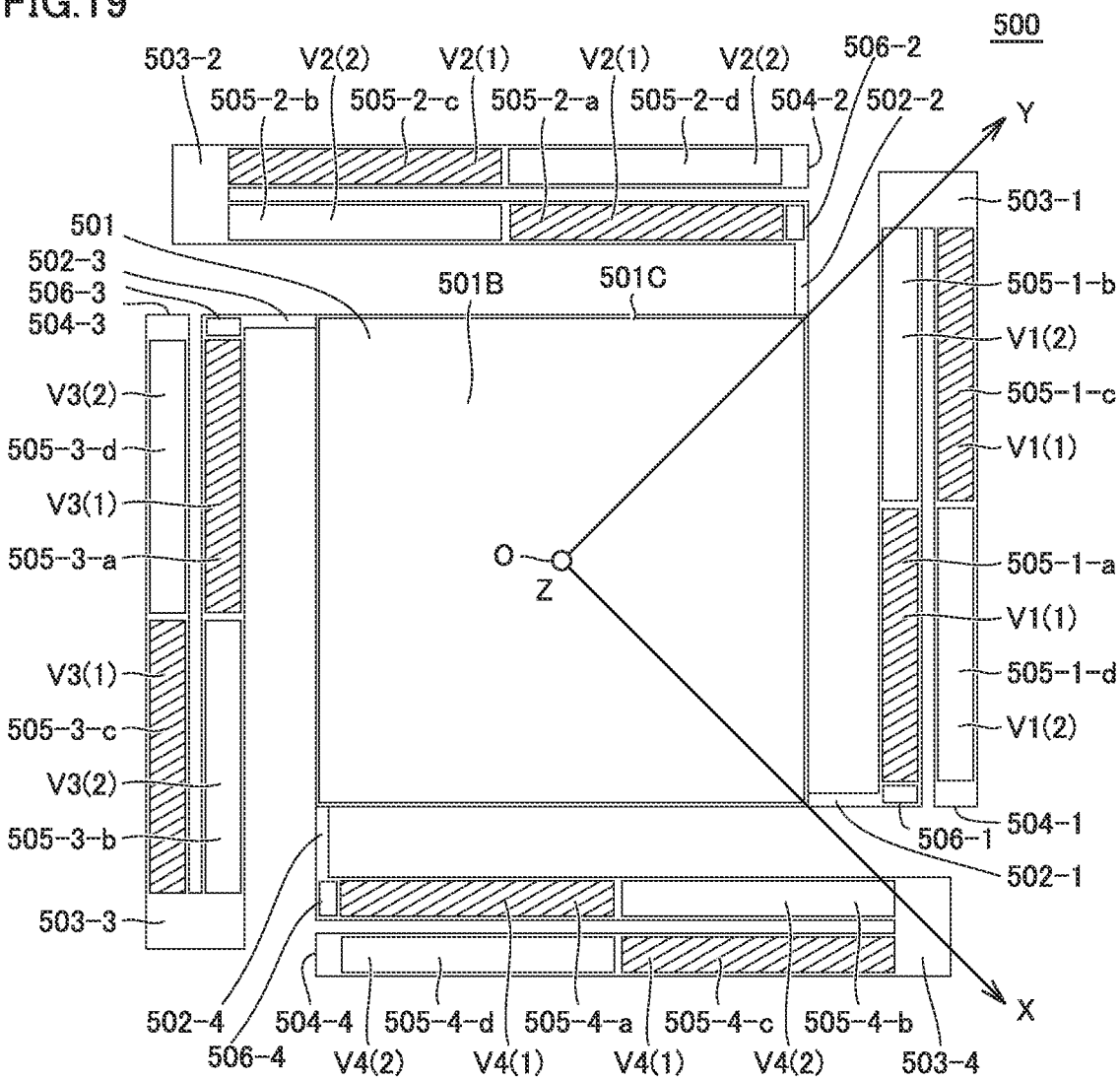
FIG. 19 is a diagram illustrating the front surface of the main part of the optical scanning device in a sixth embodiment.

FIG. 19 is a diagram illustrating the front surface of the main part of an optical scanning device 500 in a sixth embodiment.

Optical scanning device 500 in the sixth embodiment differs from optical scanning device 100 in the second embodiment in the following points.

Referring to FIG. 19, a mirror part 501 is formed using the crystal plane (100) of an SOI substrate which is a kind of semiconductor substrates, in the same manner as in the second embodiment.

The front surface (mirror surface 501B) and the back surface of mirror part 501 are square.

Support cantilevers 2-1 to 2-4 support a silicon mirror part 501C swingably. Support cantilevers 2-1 to 2-4 have the same shape and size. Support cantilevers 2-1 to 2-4 are arranged in 90° rotational symmetry with respect to the center axis (the Z axis) of mirror part 501.

Drive cantilevers 3-1 to 3-4 are disposed to surround mirror part 501. Drive cantilevers 3-1 to 3-4 have the same shape and size. Drive cantilevers 3-1 to 3-4 are arranged in 90° rotational symmetry with respect to the center axis of mirror part 501.

One end of drive cantilever 3-*i* (i=1 to 4) is connected to support cantilever 2-*i*, and the other end of drive cantilever 3-*i* is connected to fixed portion 4-*i*. Drive cantilever 3-*i* has a shape bent once at 180°. Drive cantilever 3-*i* has two circumferential portions extending in the same direction as the circumferential direction of mirror part 501 and a bend portion.

Piezoelectric elements 5*i-a, b, c, d* (i=1 to 4) are secured on drive cantilever 3-*i*. Piezoelectric elements 5*i-a, b, c, d* have the same shape and size.

Of the portions that constitute drive cantilever 3-*i* (i=1 to 4), a first portion of two circumferential portions extending in the same direction as the circumferential direction of mirror part 501 has piezoelectric elements 5*i-a, b*, and a second portion has piezoelectric elements 5*i-c, d*. Piezoelectric element 5*i-a* and piezoelectric element 5*i-b* are spaced apart from each other. Piezoelectric element 5*i-c* and piezoelectric element 5*i-d* are spaced apart from each other. Piezoelectric element 5-*i-b* and piezoelectric element 5*i-c* are adjacent to each other with the bend portion of drive cantilever 3-*i* interposed therebetween. Piezoelectric element 5*i-a* is arranged at a position closest to one end of drive cantilever 3-*i* connected to support cantilever 2-*i*. Piezoelectric element 5*i-d* is arranged at a position furthest from the other end of drive cantilever 3-*i* connected to fixed portion 4-*i*.

Upper electrodes and lower electrodes are connected to piezoelectric elements 5*i-a, b, c, d* (i=1 to 4) for applying a drive voltage. The dielectric polarization directions of piezoelectric elements 5*i-a, b, c, d* are the same.

A first axis which is the rotation axis in the natural frequency mode 2 is parallel to mirror surface 501B. The direction of the first axis is the direction of a straight line connecting the center of mirror part 501 with a connection portion between mirror part 501 and support cantilever 502-1. The second axis which is the rotation axis in the natural frequency mode 3 is parallel to mirror surface 501B and orthogonal to the first axis. In FIG. 19, the first axis is the X axis, and the second axis is the Y axis.

Power supply unit 62 applies AC voltage of Equation (5) to piezoelectric elements 5$i$-$a$, 5$i$-$c$ on drive cantilever 3-$i$, where i=1 to 4.

$$Vi(1)=Vs\times\sin(\omega t+90°\times(i-1)) \qquad (5)$$

Here, $\omega=2\pi\times F0$. F0 is the resonance frequency in the natural frequency mode 2 and the resonance frequency in the natural frequency mode 3. t is time.

Power supply unit 62 applies AC voltage of Equation (6) to piezoelectric elements 5$i$-$b$, 5$i$-$d$ on drive cantilever 3-$i$, where i=1 to 4.

$$Vi(2)=-Vi(1)=-Vs\times\sin(\omega t+90°\times(i-1)) \qquad (6)$$

Since the signs of Vi(1) in Equation (5) and Vi(2) in Equation (6) are reversed, the phase of Vi(1) in Equation (5) and the phase of Vi(2) in Equation (6) differ by 180°.

In the present embodiment, N=4×1, and the shape of the front surface (mirror surface 501B) of mirror part 501 is a regular (4×1) polygon. However, embodiments are not limited thereto. N may be 4×n (n is a natural number), and the shape of the front surface (mirror surface 501B) of mirror part 501 may be a regular (4×n) polygon.

(Note)

Optical scanning device 500 in the sixth embodiment has the following features.

(10) A mirror part (1) is formed using the crystal plane (100) of a semiconductor substrate. N is 4×n (n is a natural number). The shape of the mirror surface (501B) is a regular (4×n) polygon.

With such a configuration, the mechanical properties of a plurality of drive cantilevers can be made uniform.

Seventh Embodiment

Figure 20:
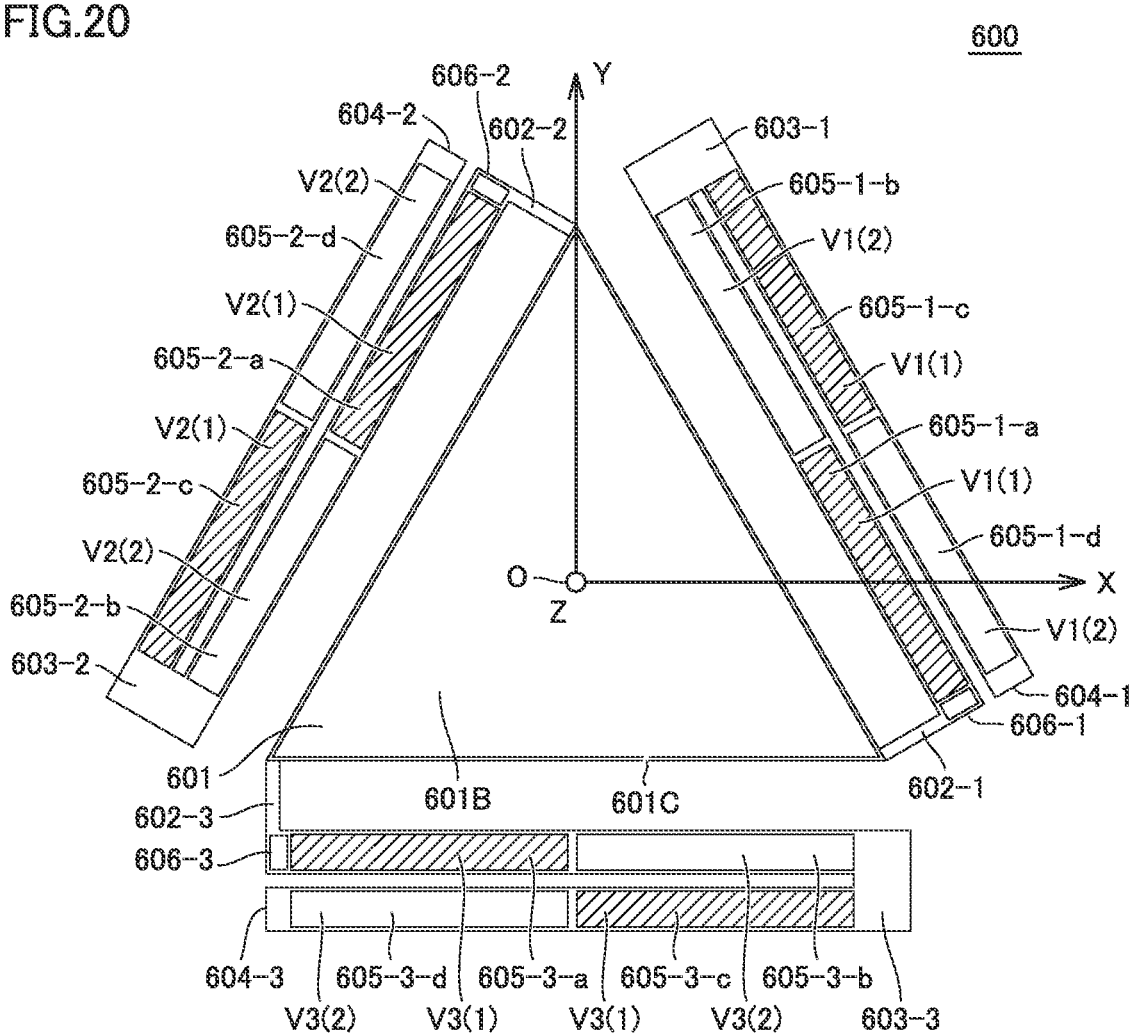
FIG. 20 is a diagram illustrating the front surface of the main part of the optical scanning device in a seventh embodiment.

FIG. 20 is a diagram illustrating the front surface of the main part of an optical scanning device 600 in a seventh embodiment.

A mirror part 601 is formed using the crystal plane (111) of an SOI substrate which is a kind of semiconductor substrates. The mechanical property of the crystal plane (111) of an SOI substrate is 3-fold symmetry.

The front surface (mirror surface 601B) and the back surface of mirror part 601 are in the shape of a regular triangular.

Support cantilevers 2-1 to 2-3 support a silicon mirror part 601C swingably. Support cantilevers 2-1 to 2-3 have the same shape and size. Support cantilevers 2-1 to 2-3 are arranged in 120° rotational symmetry with respect to the center axis (the Z axis) of mirror part 601.

Drive cantilevers 3-1 to 3-3 are arranged to surround mirror part 601. Drive cantilevers 3-1 to 3-3 have the same shape and size. Drive cantilevers 3-1 to 3-3 are arranged in 120° rotational symmetry with respect to the center axis of mirror part 601.

One end of drive cantilever 3-$i$ (i=1 to 3) is connected to support cantilever 2-$i$, and the other end of drive cantilever 3-$i$ is connected to fixed portion 4-$i$. Drive cantilever 3-$i$ has a shape bent once at 180°. Drive cantilever 3-$i$ has two circumferential portions extending in the same direction as the circumferential direction of mirror part 601 and a bend portion.

Piezoelectric elements 5$i$-$a$, $b$, $c$, $d$ (=1 to 3) are secured on drive cantilever 3-$i$. Piezoelectric elements 5$i$-$a$, $b$, $c$, $d$ have the same shape and size. Of the portions that constitute drive cantilever 3-$i$, a first portion of two circumferential portions extending in the same direction as the circumferential direction of mirror part 601 has piezoelectric elements 5$i$-$a$, $b$, and a second portion has piezoelectric elements 5$i$-$c$, $d$. Piezoelectric element 5$i$-$a$ and piezoelectric element 5$i$-$b$ are spaced apart from each other. Piezoelectric element 5$i$-$c$ and piezoelectric element 5$i$-$d$ are spaced apart from each other. Piezoelectric element 5$i$-$b$ and piezoelectric element 5$i$-$c$ are adjacent to each other with the bend portion of drive cantilever 3-$i$ interposed therebetween. Piezoelectric element 5$i$-$a$ is arranged at a position closest to one end of drive cantilever 3-$i$ connected to support cantilever 2-$i$. Piezoelectric element 5$i$-$d$ is arranged at a position closest to the other end of drive cantilever 3-$i$ connected to fixed portion 4-$i$.

Upper electrodes and lower electrodes are connected to piezoelectric elements 5$i$-$a$, $b$, $c$, $d$ (i=1 to 3) for applying a drive voltage. The dielectric polarization directions of piezoelectric elements 5$i$-$a$, $b$, $c$, $d$ are the same.

A first axis which is the rotation axis in the natural frequency mode 2 is parallel to mirror surface 601B. The direction of the first axis is the direction of a straight line connecting the center of mirror part 601 with a connection portion between mirror part 601 and support cantilever 602-2. A second axis which is the rotation axis in the natural frequency mode 3 is parallel to mirror surface 601B and orthogonal to the first axis. In FIG. 20, the first axis is the Y axis, and the second axis is the X axis.

Power supply unit 62 applies a sinusoidal voltage of Equation (7) to piezoelectric elements 5$i$-$a$, 5$i$-$c$ on drive cantilever 3-$i$, where i=1 to 3.

$$Vi(1)=Vs\times\sin(\omega t+120°\times(i-1)) \qquad (7)$$

Here, $\omega=2\pi\times F0$. F0 is the resonance frequency in the natural frequency mode 2 and the resonance frequency in the natural frequency mode 3. t is time.

Power supply unit 62 applies a sinusoidal voltage of Equation (8) to piezoelectric elements 5$i$-$b$, 5$i$-$d$ on drive cantilever 3-$i$, where i=1 to 3.

$$Vi(2)=-Vi(1)=-Vs\times\sin(\omega t+120°\times(i-1)) \qquad (8)$$

Since the signs of Vi(1) in Equation (7) and Vi(2) in Equation (8) are reversed, the phase of Vi(1) in Equation (7) and the phase of Vi(2) in Equation (8) differ by 180°.

In the present embodiment, N=3×1, and the front surface (mirror surface 601B) of mirror part 601 is a regular (3×1) polygon. However, embodiments are not limited thereto. N may be 3×n (n is a natural number), and the shape of the front surface (mirror surface 601B) of mirror part 601 may be a regular (3×n) polygon.

In the present embodiment, three support cantilevers 2-1 to 2-3 are arranged in (360°/3) rotational symmetry with respect to the center axis of mirror part 601, three drive cantilevers 3-1 to 3-3 are arranged in (360°/3) rotational symmetry with respect to the center axis of mirror part 601, and the shape of mirror part 601 is arranged in (360°/3) rotational symmetry with respect to the center axis of mirror part 601. However, embodiments are not limited thereto. N support cantilevers may be arranged in (360°/N) rotational symmetry with respect to the center axis of mirror part 601, N drive cantilevers may be arranged in (360°/N) rotational symmetry with respect to the center axis of mirror part 601, and the shape of mirror part 601 may be (360°/N) rotational symmetric with respect to the center axis of mirror part 601.

(Note)

Optical scanning device 600 in the seventh embodiment has the following features.

(11) A mirror part (601) is formed by using the crystal plane (111) of a semiconductor substrate. N is 3×n (n is a natural number). The shape of the mirror surface (601B) is a regular (3×n) polygon.

With such a configuration, an optical scanning device having drive cantilevers with uniform mechanical properties can be implemented.

(12) N support cantilevers (2-1 to 2-3) are arranged in (360°/N) rotational symmetry with respect to the center axis of mirror part (601). N drive cantilevers (3-1 to 3-3) are arranged in (360°/N) rotational symmetry with respect to the center axis of mirror part (601). The shape of the mirror part (601) is in (360°/N) rotational symmetry with respect to the center axis of mirror part (601).

With such a configuration, the resonance frequency in the first natural frequency mode (natural frequency mode 2) can be matched with the resonance frequency in the second natural frequency mode (natural frequency mode 3). As a result, the mirror part (1) can make all-round rotational displacement smoothly.

Eighth Embodiment

In a MEMS mirror capable of all-round rotation, rotational displacement with high linearity is required because if linearity is poor due to distorted rotational displacement, an error occurs in the acquired distance information. The devices described in PTLs 1 to 3 do not have a mechanism controlling the linearity of mirror displacement. The optical scanning device in the present embodiment controls the linearity of mirror displacement.

First of all, the linearity of all-round rotational displacement is described.

In the circumference of mirror part 1, let the inscribed angle $\Psi$ at a point of largest displacement in the Z axis direction be the mirror largest displacement inscribed angle $\Psi m$. Let the phase of AC voltage applied to piezoelectric elements 5i-a, b, c, d be the applied voltage phase $\Phi$.

Figure 21:
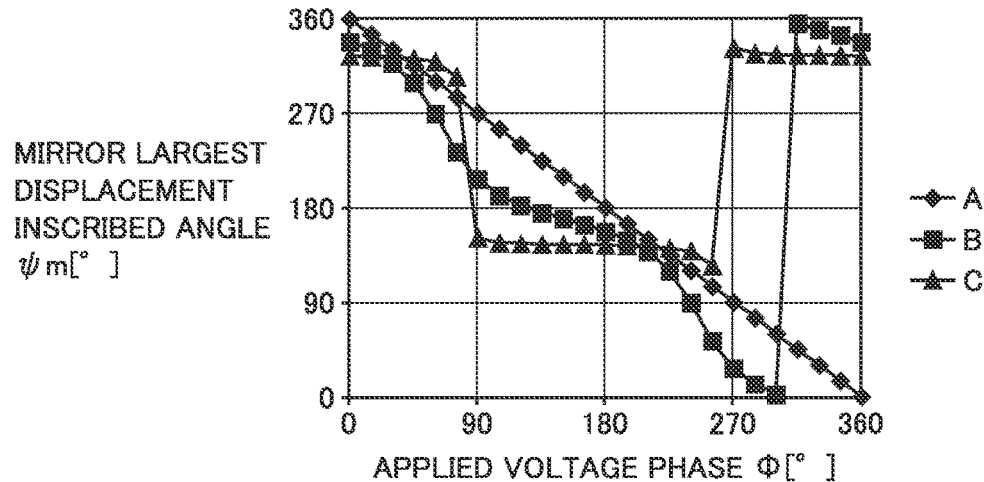
FIG. 21 is a diagram illustrating change in mirror largest displacement inscribed angle $\Psi m$ against change in the applied voltage phase $\Phi$ in displacement in three patterns.

FIG. 21 is a diagram illustrating change in the mirror largest displacement inscribed angle $\Psi m$ against change in the applied voltage phase $\Phi$ in displacement of three patterns.

In FIG. 21, the horizontal axis shows the applied voltage phase $\Phi$ (0° to 360° (one cycle)). The vertical axis shows the mirror largest displacement inscribed angle $\Psi m$. When the angular velocity of applied voltage is $\omega$, $\Phi=\omega t$ (t: time).

The plot line A is a line connecting plotted points of sample data measured in the case of all-round rotational displacement as in the second embodiment. The plot line A is a downward straight line. That is, the mirror largest displacement inscribed angle $\Psi m$ decreases linearly with increase in the applied voltage phase $\Phi$. The high linearity shows that mirror part 1 is rotationally displaced smoothly. This is because the position of largest displacement on the circumference of mirror part 1 changes at regular intervals with time. The downward slope shows rotational displacement counterclockwise.

The plot line B is a line connecting the plotted points of sample data measured in the case of serpentine rotational displacement. The plot line B deviates from a straight line.

The plot line C is a line connecting the plotted points of sample data measured in the case of vibration displacement around a single axis, rather than rotational displacement. The plot line C is not a downward slope. The plot line C shows displacement such that the mirror largest displacement inscribed angle $\Psi m$ changes in a range of 180° to 360°.

Figure 22:
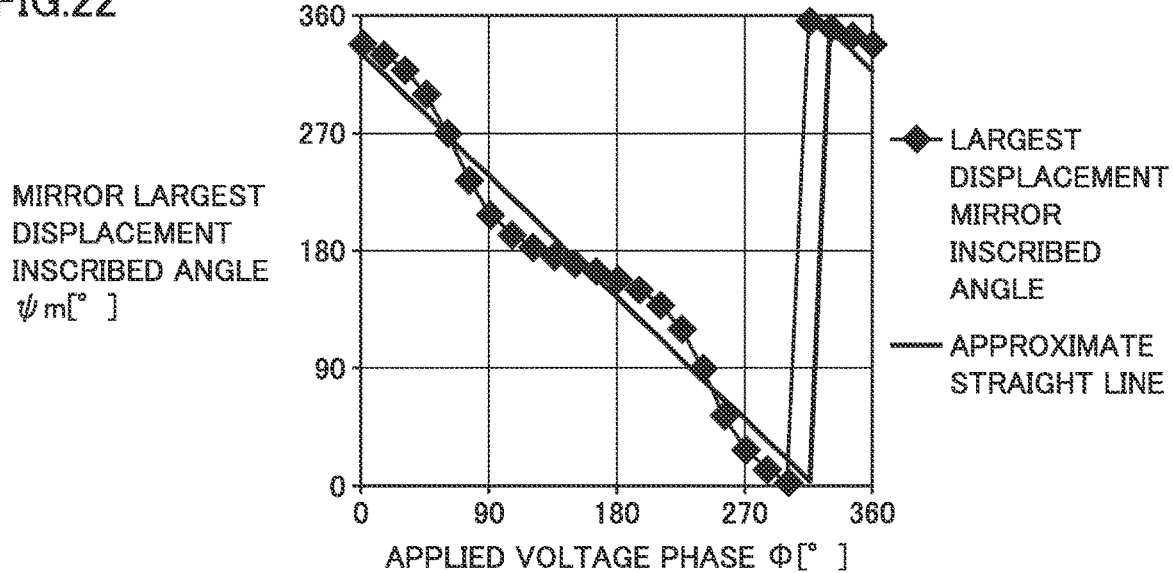
FIG. 22 is a diagram illustrating the plot line B in FIG. 21 and an approximate straight line of the plot line B.

FIG. 22 is a diagram illustrating the plot line B in FIG. 21 and an approximate straight line of the plot line B.

A rotation linearity error is used as the quantity that represents a deviation of the plot line B from the linearity of all-round rotational displacement of the mirror part (1). The approximate straight line is represented by Equation (9). The approximate straight line can be obtained by the least square method.

$$\psi b(\Phi)=a\times\Phi+b \tag{9}$$

$\psi m(\Phi)$ is the actually measured value. The amount of deviation $\Delta(\Phi)$ is represented by Equation (10).

$$\Delta(\Phi)=abs((\psi m(\Phi)-\psi b(\Phi))/(360\times a)) \tag{10}$$

Here, abs(s) is the absolute value of s.

Figure 23:
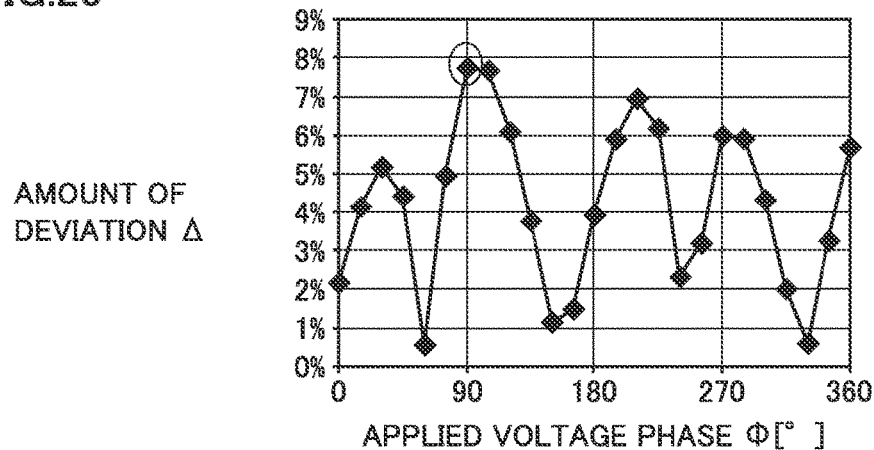
FIG. 23 is a diagram illustrating the rotation linearity error of the plot line B.

That is, the amount of deviation $\Delta(\Phi)$ is obtained by standardizing the difference between the actually measured value and the approximate straight line by one-cycle full scale (360×a) of the mirror largest inscribed angle $\psi m$. FIG. 23 is a diagram illustrating the rotation linearity error of the plot line B.

The maximum value of the amount of deviation $\Delta(\Phi)$ is defined as a rotation linearity error. FIG. 23 shows a value obtained by converting the amount of deviation $\Delta(\Phi)$ having a value equal to or greater than zero and equal to or smaller than one into percentage. In the example in FIG. 23, the rotation linearity error is 8% (0.08). As the rotation linearity error approaches zero, the linearity is higher and the all-round rotational displacement is smoother. For example, the mean value or the mean square value of the amount of deviation $\Delta(\Phi)$ may be used as a rotation linearity error, rather than using the maximum value of the amount of deviation $\Delta(\Phi)$ as a rotation linearity error.

As shown in the second embodiment, in order to obtain a large displacement with a small voltage, the optical scanning device in the present embodiment applies AC voltage at the matched resonance frequency F0 in two natural frequency modes to piezoelectric elements 5i-a to d (i=1 to 4) to allow mirror part 1 to make all-round rotational displacement. However, when a difference in resonance frequency in two natural frequency modes occurs due to manufacturing error or the like, the displacement is such as the plot line B or the plot line C. Consequently, smooth all-round rotational displacement with good linearity is unable to be achieved.

In the eighth embodiment, in order to solve this problem, a plurality of drive power supplies are used, which can independently adjust the amplitude and the initial phase of output voltage.

Figure 24:
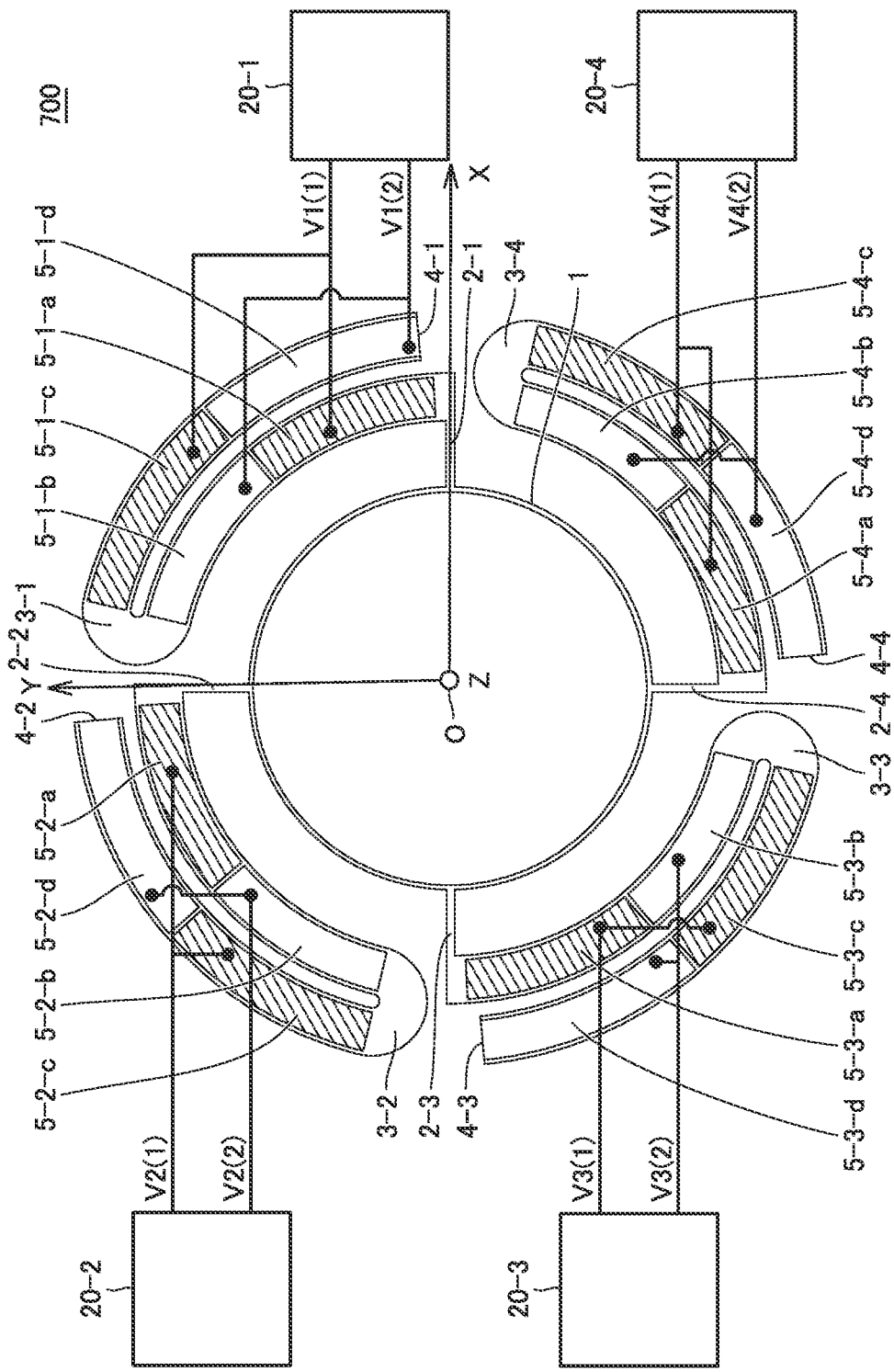
FIG. 24 is a diagram for explaining voltage for driving the piezoelectric elements in the optical scanning device in an eighth embodiment.

FIG. 24 is a diagram for explaining voltage for driving piezoelectric elements 5-i-a to d (i=1 to 4) in an optical scanning device 700 in the eighth embodiment. Power supply unit 62 includes a drive power supply 20-i for driving piezoelectric elements 5i-a, b, c, d on drive cantilever 3-i (i=1 to 4).

Drive power supply 20-i (i=1 to 4) applies AC voltage to 5i-a, c, of four piezoelectric elements 5i-a to d on drive cantilever 3-i, and applies AC voltage with the reversed sign to 5i-b, d. The phase and the amplitude of AC voltage of drive power supply 20-i can be controlled independently of the other drive power supplies. The frequencies of AC voltages of drive power supplies 20-1 to 20-4 are the same but can be set to a value in accordance with the resonance frequency.

The displacement of mirror part 1 when the resonance frequency in the natural frequency mode 2 and the resonance frequency in the natural frequency mode 3 do not match will now be described. It is assumed that AC voltages shown in Equation (1) and Equation (2) are applied in a state in which the resonance frequency in the natural frequency mode 2 and the resonance frequency in the natural frequency mode 3 do not match, for example, for the reason that mirror part 1 is out of symmetry.

Figure 25:
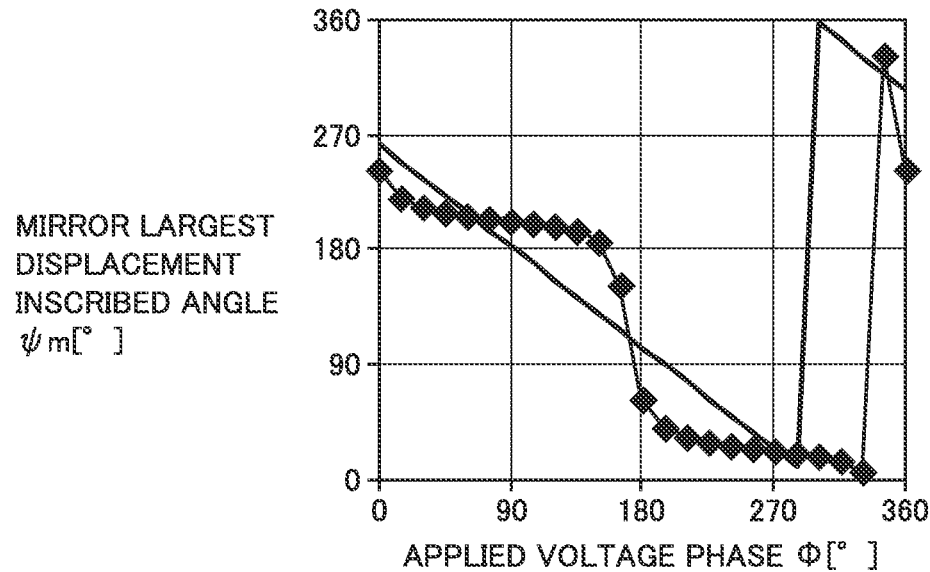
FIG. 25 is a diagram illustrating change in mirror largest displacement inscribed angle $\Psi m$ against change in the applied voltage phase $\Phi$ when AC voltage with resonance frequency F2 in the natural frequency mode 2 is applied.
Figure 26:
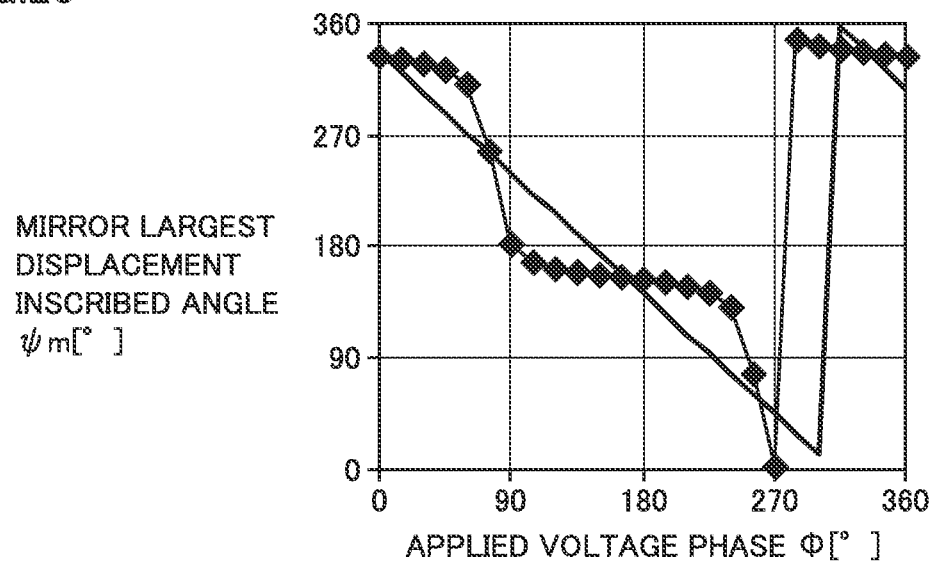
FIG. 26 is a diagram illustrating the relation between applied voltage phase $\Phi$ and mirror largest displacement inscribed angle $\Psi m$ when AC voltage with resonance frequency F3 in the natural frequency mode 3 is applied.
Figure 27:
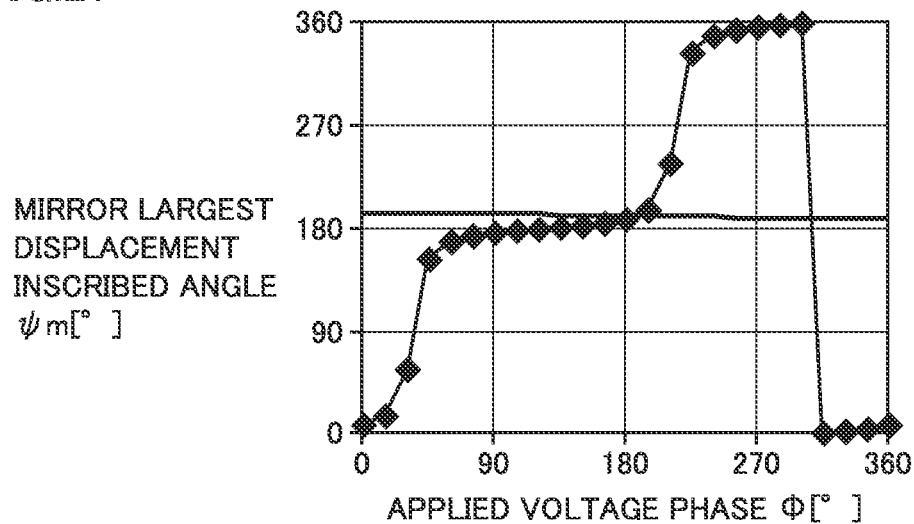
FIG. 27 is a diagram illustrating the relation between applied voltage phase $\Phi$ and mirror largest displacement inscribed angle $\Psi m$ when AC voltage with an intermediate frequency between resonance frequency F2 in the natural frequency mode 2 and resonance frequency F3 in the natural frequency mode 3 is applied.

FIG. 25 is a diagram illustrating change in the mirror largest displacement inscribed angle $\Psi m$ against change in the applied voltage phase $\Phi$ when AC voltage at the resonance frequency F2 in the natural frequency mode 2 is applied. FIG. 26 is a diagram illustrating the relation between the applied voltage phase $\Phi$ and the mirror largest displacement inscribed angle $\Psi m$ when AC voltage at the resonance frequency F3 in the natural frequency mode 3 is applied. FIG. 27 is a diagram illustrating the relation between the applied voltage phase $\Phi$ and the mirror largest displacement inscribed angle $\Psi m$ when AC voltage at the intermediate frequency between the resonance frequency F2 in the natural frequency mode 2 and the resonance frequency F3 in the natural frequency mode 3 is applied.

As shown in FIG. 25 and FIG. 26, in the resonance frequency F2 in the natural frequency mode 2 and the resonance frequency F3 in the natural frequency mode 3, the line (plot line) connecting the plots of the applied voltage phase $\Phi$ and the mirror largest displacement inscribed angle $\Psi m$ has the down-sloping characteristics. This plot line is not a straight line. This indicates serpentine rotational displacement.

As shown in FIG. 27, in the intermediate frequency (F2+F3)/2 (hereinafter referred to as intermediate frequency Fm between the natural frequency mode 2 and the natural frequency mode 3) between the resonance frequency F2 in the natural frequency mode 2 and the resonance frequency F3 in the natural frequency mode 3, the line (plot line) connecting the plots of the applied voltage phase $\Phi$ and the mirror largest displacement inscribed angle $\Psi m$ has the down-sloping characteristics. This plot line indicates rotational displacement in a reverse direction.

Figure 28:
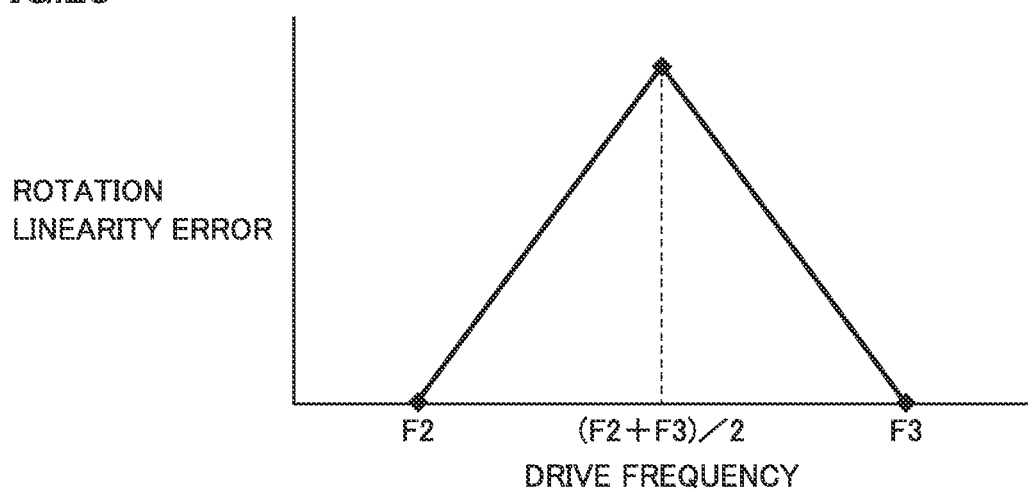
FIG. 28 is a diagram illustrating the relation between the frequency of drive voltage and the rotation linearity error.

FIG. 28 is a diagram illustrating the relation between the frequency of drive voltage and the rotation linearity error.

As shown in FIG. 28, in the intermediate frequency Fm between the natural frequency mode 2 and the natural frequency mode 3, the rotation linearity error is extremely large.

In the present embodiment, the rotation linearity error is reduced by setting the frequency of applied AC voltage to the intermediate frequency Fm between the natural frequency mode 2 and the natural frequency mode 3 and adjusting the initial phase and the amplitude of the applied AC voltage. The rotation linearity error can be reduced also by setting the frequency of applied AC voltage to the resonance frequency F2 in the natural frequency mode 2 or the resonance frequency F3 in the natural frequency mode 3 and adjusting the initial phase and the amplitude of the applied AC voltage, but it is impossible to increase the deflection angle $\theta$ of mirror part 1.

When the rotation linearity error is reduced by adjusting the initial phase and the amplitude of AC voltage using the resonance frequency F2 in the natural frequency mode 2, the deflection angle $\theta$ is determined by displacement in the natural frequency mode 3. Since the displacement in the Z axis direction in the natural frequency mode 3 is small, the deflection angle $\theta$ is small. When the rotation linearity error is reduced by adjusting the initial phase and the amplitude of AC voltage using the resonance frequency F3 in the natural frequency mode 3, the deflection angle $\theta$ is determined by displacement in the natural frequency mode 2. Since the displacement in the Z axis direction in the natural frequency mode 2 is small, the deflection angle $\theta$ is small. Accordingly, in the present embodiment, in order to reduce the rotation linearity error and maximize the deflection angle $\theta$, the intermediate frequency Fm between the resonance frequency in the natural frequency mode 2 and the resonance frequency in the natural frequency mode 3 is used.

Drive power supply 20-$i$ ($i$=1 to 4) outputs AC voltages Vi(1), Vi(2) as follows.

$$V1(1)=Vs1\times\sin(\omega t+\Phi 1) \tag{11}$$

$$V1(2)=-Vs1\times\sin(\omega t+\Phi 1) \tag{12}$$

$$V2(1)=Vs2\times\sin(\omega t+90°+\Phi 2) \tag{13}$$

$$V2(2)=-Vs2\times\sin(\omega t+90°+\Phi 2) \tag{14}$$

$$V3(1)=Vs3\times\sin(\omega t+180°+\Phi 3) \tag{15}$$

$$V3(2)=-Vs3\times\sin(\omega t+180°+\Phi 3) \tag{16}$$

$$V4(1)=Vs4\times\sin(\omega t+270°+\Phi 4) \tag{17}$$

$$V4(2)=-Vs4\times\sin(\omega t+270°+\Phi 4) \tag{18}$$

Here, $\omega=2\pi\times(F2+F3)/2$. F2 is the resonance frequency in the natural frequency mode 2, and F3 is the resonance frequency in the natural frequency mode 3. t is time.

Figure 29:
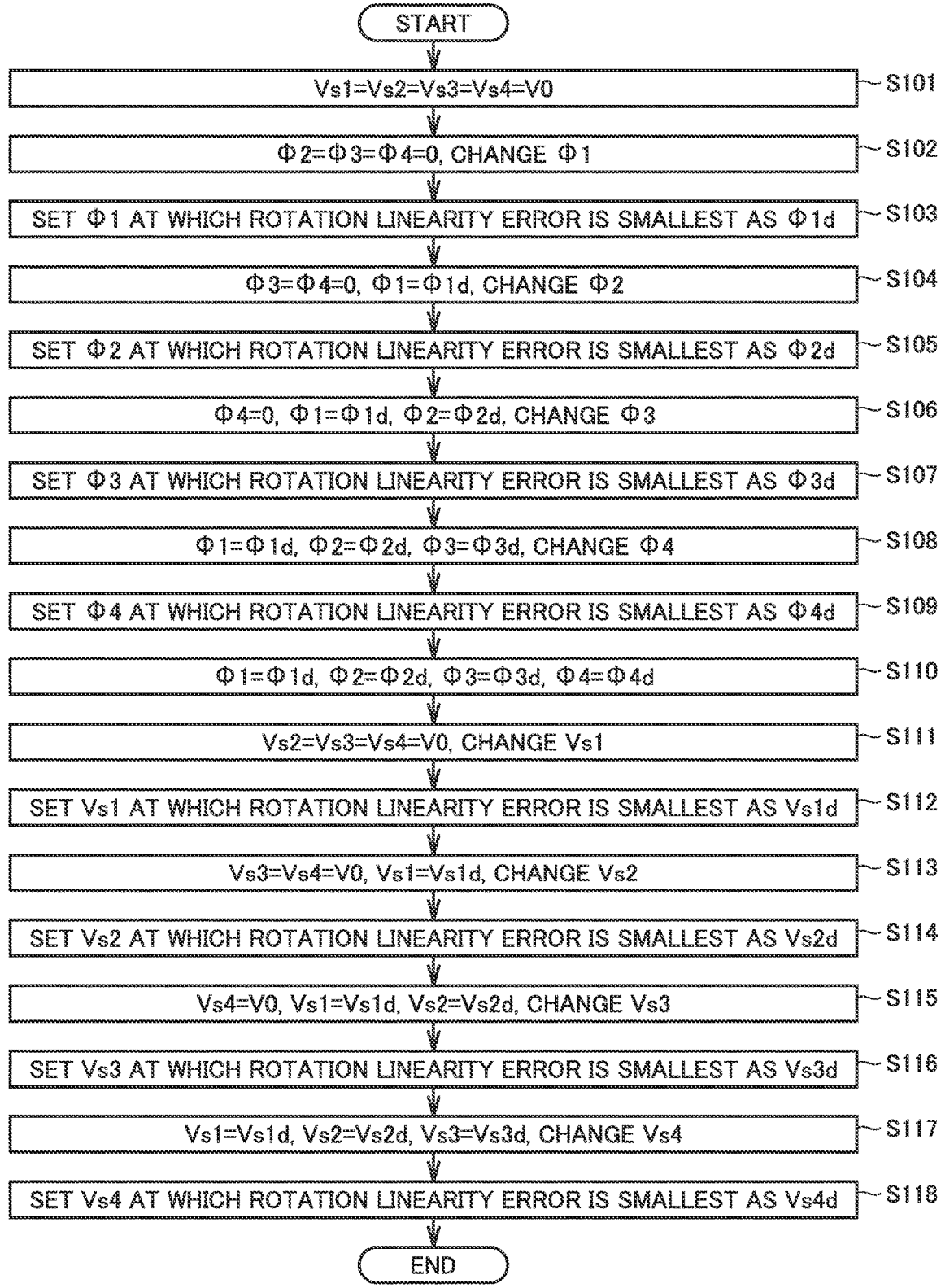
FIG. 29 is a flowchart illustrating the procedure for adjusting voltages of drive power supplies for allowing the mirror part to make all-round rotational displacement with the intermediate frequency Fm between the natural frequency mode 2 and the natural frequency mode 3 in the optical scanning device in the eighth embodiment.

FIG. 29 is a flowchart illustrating the procedure for adjusting voltages of drive power supplies 20-1 to 20-4 for allowing mirror part 1 to make all-round rotational displacement at the intermediate frequency Fm between the natural frequency mode 2 and the natural frequency mode 3 in optical scanning device 700 in the eighth embodiment.

In step S101, control unit 61 fixes the amplitudes of voltages Vs1 to Vs4 of drive power supplies 20-1 to 20-4 to a constant value F0.

Figure 30:
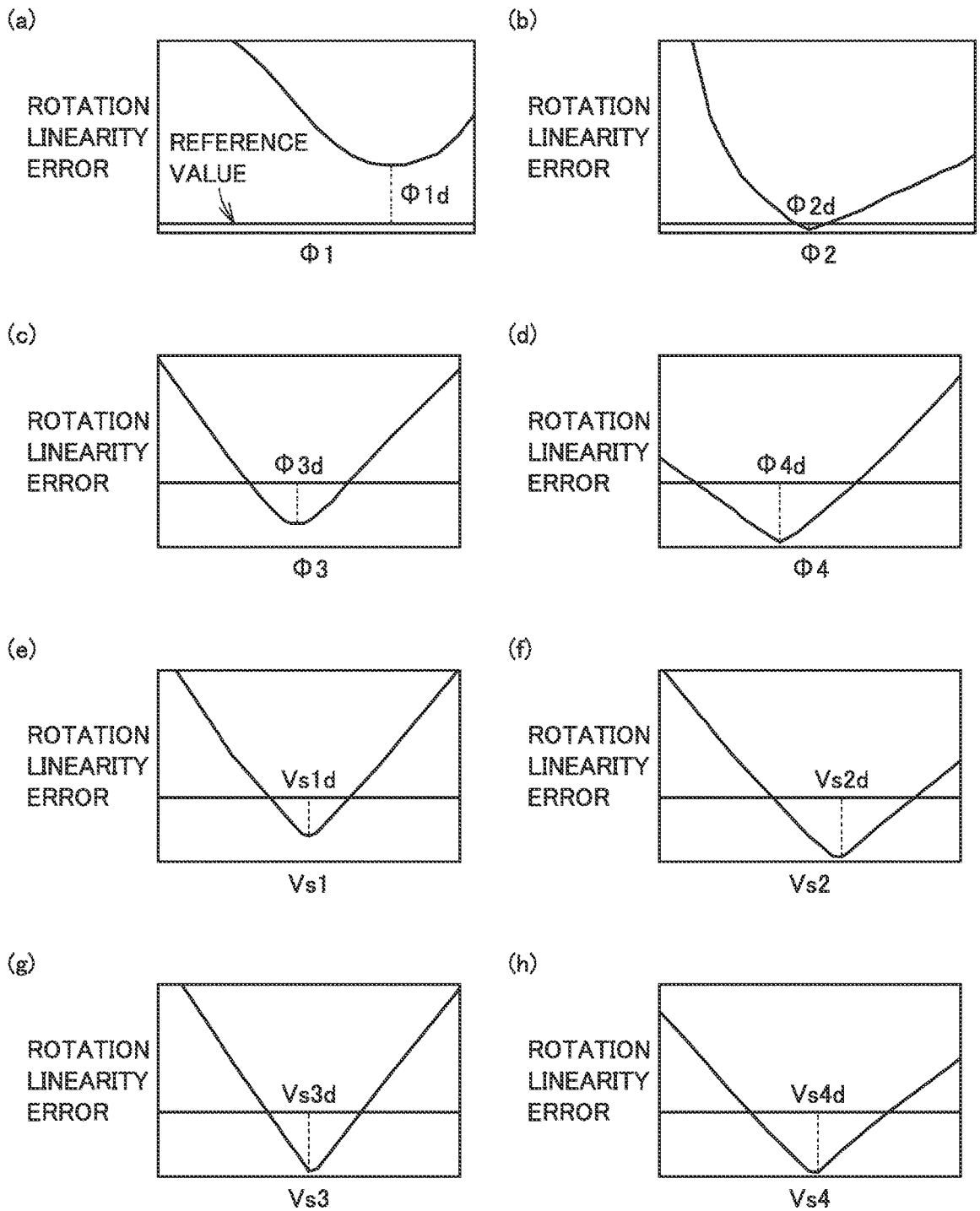
FIGS. 30(a) to 30(d) are diagrams illustrating the relation between initial phase $\Phi1$, $\Phi2$, $\Phi3$, $\Phi4$ and the measured rotation linearity error.
FIGS. 30(e) to 30(h) are diagrams illustrating the relation between the amplitude Vs1, Vs2, Vs3, Vs4 and the measured rotation linearity error.

In step S102, control unit 61 fixes the initial phases $\Phi 2$, $\Phi 3$, $\Phi 4$ of voltages of drive power supplies 20-2 to 20-4 to a constant value (=0) and measures the rotation linearity error while changing the voltage initial phase $\Phi 1$ of drive power supply 20-1. FIG. 30($a$) is a diagram illustrating the relation between the initial phase $\Phi 1$ and the measured rotation linearity error in step S102.

In step S103, control unit 61 sets $\Phi 1$ at which the rotation linearity error is smallest as $\Phi 1d$.

In step S104, control unit 61 fixes the initial phase $\Phi 1$ of voltage of drive power supply 20-1 to $\Phi 1d$, fixes the initial phases $\Phi 3$, $\Phi 4$ of voltages of drive power supplies 20-3, 20-4 to a constant value (=0), and measures the rotation linearity error while changing the initial phase $\Phi 2$ of voltage of drive power supply 20-2. FIG. 30($b$) is a diagram illustrating the relation between the initial phase $\Phi 2$ and the measured rotation linearity error in step S104.

In step S105, control unit 61 sets $\Phi 1$ at which the rotation linearity error is smallest as $\Phi 2d$.

In step S106, control unit 61 fixes the initial phases $\Phi 1$, $\Phi 2$ of voltages of drive power supplies 20-1, 20-2 as $\Phi 1d$, $\Phi 2d$, fixes the initial phase $\Phi 4$ of voltage of drive power supply 20-4 to a constant value (=0), and measures the rotation linearity error while changing the initial phase $\Phi 3$ of voltage of drive power supply 20-3. FIG. 30($c$) is a diagram illustrating the relation between the initial phase $\Phi 3$ and the measured rotation linearity error in step S106.

In step S107, control unit 61 sets 13 at which the rotation linearity error is smallest as $\Phi 3d$.

In step S108, control unit 61 fixes the initial phases Φ1, Φ2, Φ3 of voltages of drive power supplies 20-1, 20-2, 20-3 to Φ1d, Φ2d, Φ3d and measures the rotation linearity error while changing the initial phase Φ4 of voltage of drive power supply 20-4. FIG. 30(d) is a diagram illustrating the relation between the initial phase Φ4 and the measured rotation linearity error in step S108.

In step S109, control unit 61 sets Φ4 at which the rotation linearity error is smallest as Φ4d.

In step S110, control unit 61 fixes the initial phases Φ1, Φ2, Φ3, Φ4 of voltages of drive power supplies 20-1 to 20-4 to Φ1d, Φ2d, Φ3d, Φ4d.

In step S111, control unit 61 fixes the amplitudes Vs2, Vs3, Vs4 of voltages of drive power supplies 20-2, 20-3, 20-4 to a constant value V0 and measures the rotation linearity error while changing the amplitude Vs1 of voltage of drive power supply 20-1. FIG. 30(e) is a diagram illustrating the relation between the amplitude Vs1 and the measured rotation linearity error in step S111.

In step S112, control unit 61 sets Vs1 at which the rotation linearity error is smallest as Vs1d.

In step S113, control unit 61 fixes the amplitudes Vs3, Vs4 of voltages of drive power supplies 20-3, 20-4 to a constant value V0, fixes the amplitude Vs1 of voltage of drive power supply 20-1 to Vs1d, and measures the rotation linearity error while changing the amplitude Vs2 of voltage of drive power supply 20-2. FIG. 30(f) is a diagram illustrating the relation between the amplitude Vs2 and the measured rotation linearity error in step S113.

In step S114, control unit 61 sets Vs2 at which the rotation linearity error is smallest as Vs2d.

In step S115, control unit 61 fixes the amplitude Vs4 of voltage of drive power supply 20-4 to a constant value V0, fixes the amplitudes Vs1, Vs2 of voltages of drive power supplies 20-1, 20-2 to Vs1d, Vs2d, and measures the rotation linearity error while changing the amplitude Vs3 of voltage of drive power supply 20-3. FIG. 30(g) is a diagram illustrating the relation between the amplitude Vs3 and the measured rotation linearity error in step S115.

In step S116, control unit 61 sets Vs3 at which the rotation linearity error is smallest as Vs3d.

In step S117, control unit 61 fixes the amplitudes Vs1, Vs2, Vs3 of voltages of drive power supplies 20-1, 20-2, 20-3 to Vs1d, Vs2d, Vs3d and measures the rotation linearity error while changing the amplitude Vs4 of voltage of drive power supply 20-4. FIG. 30(h) is a diagram illustrating the relation between the amplitude Vs4 and the measured rotation linearity error in step S117.

In step S118, control unit 61 sets Vs4 at which the rotation linearity error is smallest as Vs4d.

After the adjustment described above, control unit 61 sets the initial phases Φ1 to Φ4 in Equations (11) to (18) to Φ1d to Φ4d and sets the amplitudes Vs1 to Vs4 to Vs1d to Vs4d to drive mirror part 1.

Figure 31:
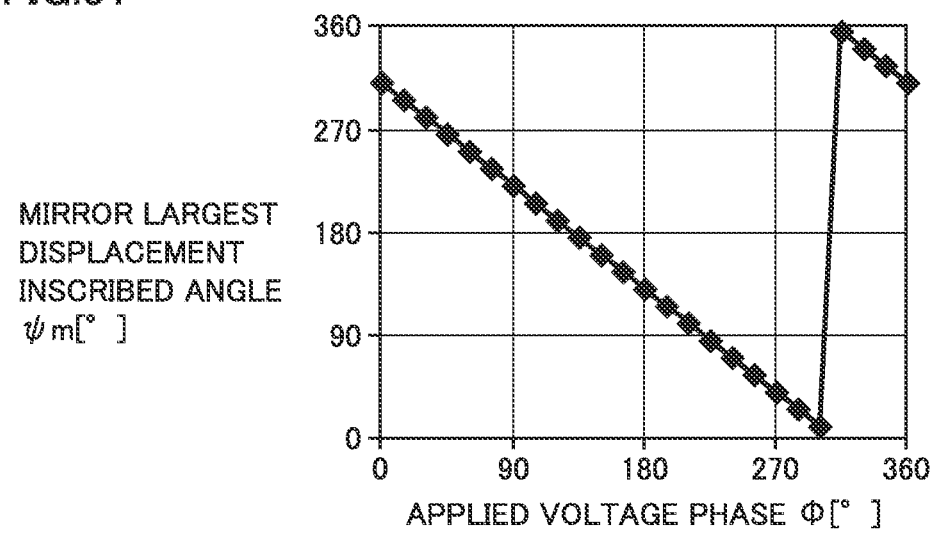
FIG. 31 is a diagram illustrating the applied voltage phase $\Phi$ and the measured mirror largest displacement inscribed angle $\Psi m$ after the adjustment of amplitude and initial phase of output voltage of a drive power supply.

FIG. 31 is a diagram illustrating the applied voltage phase Φ and the measured mirror largest displacement inscribed angle Ψm after the adjustment of amplitude and initial phase of output voltage of drive power supply 20-$i$ ($i$=1 to 4).

It can be understood that by controlling the initial phases and the amplitudes of drive power supplies 20-1 to 20-4, mirror part 1, which has rotated with a distortion in the opposite direction before the adjustment, rotates smoothly with good linearity.

Control unit 61 can also control the deflection angle θ of mirror part 1 by fixing the initial phases of voltages of drive power supplies 20-1, 20-2, 20-3, 20-4 to Φ1d, Φ2d, Φ3d, Φ4d and setting the amplitudes to k×Vs1d, k×Vs2d, k×Vs3d, k×Vs4d, and changing k.

(Note)

Optical scanning device 700 in the eighth embodiment has the following features.

(13) An optical scanning device (700) includes a mirror part (1) having a mirror surface (1B) configured to reflect light, N (N≥3) support cantilevers (2-1 to 2-4) supporting the mirror part (1) swingably, and N drive cantilevers (3-1 to 3-4) respectively connected to N support cantilevers (2-1 to 2-4). N drive cantilevers (3-1 to 3-4) are arranged to surround mirror part 1. An end of both ends of each of N drive cantilevers (3-1 to 3-4) that is not connected to the support cantilever (2-1 to 2-4) is fixed. Each of N drive cantilevers (3-1 to 3-4) has a shape bent one or more times at 180°. The optical scanning device (700) further includes a plurality of driving piezoelectric elements (5-1-$a$ to $d$, 5-2-$a$ to $d$, 5-3-$a$ to $d$, 5-4-$a$ to $d$) secured on N drive cantilevers (3-1 to 3-4) and a power supply unit (62) configured to apply AC voltage to a plurality of piezoelectric elements (5-1-$a$ to $d$, 5-2-$a$ to $d$, 5-3-$a$ to $d$, 5-4-$a$ to $d$). N support cantilevers (2-1 to 2-4) are arranged in (360°/N) rotational symmetry with respect to the center axis of the mirror part (1). The mirror part (1) has a first natural frequency mode (natural frequency mode 2) of being rotationally displaced around a first axis (the X axis) and a second natural frequency mode (natural frequency mode 3) of being rotationally displaced around a second axis (the Y axis). The first axis (the X axis) and the second axis (the Y axis) are parallel to the mirror surface (1B). The direction of the first axis (the X axis) is the direction of a straight line connecting the center of the mirror part (1) with a connection portion between the mirror part (1) and one of N support cantilevers (2-1 to 2-4). The second axis (the Y axis) is orthogonal to the first axis (the X axis). The power supply unit (62) applies AC voltage at an intermediate frequency (Fm) between a resonance frequency F2 in the first natural frequency mode (natural frequency mode 2) and a resonance frequency F3 in the second natural frequency mode (natural frequency mode 3). The amplitude and the initial phase of AC voltage can be adjusted.

Accordingly, even when the resonance frequency F2 in the first natural frequency mode (natural frequency mode 2) and the resonance frequency F3 in the second natural frequency mode (natural frequency mode 3) differ, the mirror part (1) can make all-round rotational displacement smoothly because the frequency of AC voltage to a plurality of piezoelectric elements is (F2+F3)/2, and the amplitude and the initial phase of AC voltage can be adjusted.

(14) The power supply unit (62) includes N drive power supplies (20-$i$) ($i$=1 to 4) each configured to apply AC voltage to a plurality of piezoelectric elements (5$i$-$a$ to $d$) on the corresponding drive cantilever (3-$i$).

The amplitude and the initial phase of AC voltage applied to a plurality of piezoelectric elements therefore can be adjusted by individually adjusting the output voltages of N drive power supplies.

(15) In adjustment of the initial phase of AC voltage, the control unit (61) selects one drive cantilever (for example, 3-2) from among N drive cantilevers (3-1 to 3-4), fixes the amplitude and the initial phase of AC voltage applied to a plurality of piezoelectric elements (5-1-$a$ to $d$, 5-3-$a$ to $d$, 5-4-$a$ to $d$) on one or more drive cantilevers (3-1, 3-3, 3-4) other than the selected drive cantilever, fixes the amplitude (Vs2) of AC voltage applied to a plurality of piezoelectric elements (5-2-$a$ to $d$) on the selected drive cantilever (3-2), and changes the initial phase (Φ2) and determines the initial phase (Φ2) when the rotation linearity error is smallest as an adjustment value (Φ2d) of the initial phase of AC voltage applied to a plurality of piezoelectric elements (5-2-*a* to *d*) on the selected drive cantilever (3-2). The rotation linearity error is the quantity that represents a deviation from the linearity of all-round rotational displacement of the mirror part (1). The all-round rotational displacement of mirror part 1 is a displacement of the mirror part (1) such that the center axis of the mirror part (1) makes a turn while the deflection angle (θ) of the mirror part (1) is kept constant.

Therefore, even when the resonance frequency F2 in the first natural frequency mode (natural frequency mode 2) and the resonance frequency F3 in the second natural frequency mode (natural frequency mode 3) differ, the mirror part (1) can make all-round rotational displacement smoothly by setting the frequency of AC voltage to a plurality of piezoelectric elements to (F2+F3)/2 and adjusting the initial phase such that rotation linear error is reduced.

(16) In adjustment of the amplitude of AC voltage, the control unit (61) selects one drive cantilever (for example, 3-2) from among N drive cantilevers (3-1 to 3-4), fixes the amplitude and the initial phase of AC voltage applied to a plurality of piezoelectric elements (5-1-*a* to *d*, 5-3-*a* to *d*, 5-4-*a* to *d*) on one or more drive cantilevers (3-1, 3-3, 3-4) other than the selected drive cantilever, fixes the initial phase (Φ2) of AC voltage applied to a plurality of piezoelectric elements (5-2-*a* to *d*) on the selected drive cantilever (3-2), and changes the amplitude (Vs2) and determines the amplitude (Vs2) at which the rotation linearity error is smallest, as an adjustment value (Vs2d) of amplitude of AC voltage applied to a plurality of piezoelectric elements (5-2-*a* to *d*) on the selected drive cantilever (3-2).

Therefore, even when the resonance frequency F2 in the first natural frequency mode (natural frequency mode 2) and the resonance frequency F3 in the second natural frequency mode (natural frequency mode 3) differ, the mirror part (1) can make all-round rotational displacement smoothly by setting the frequency of AC voltage to a plurality of piezoelectric elements to (F2+F3)/2 and adjusting the amplitude such that the rotation linearity error is reduced.

Ninth Embodiment

In a ninth embodiment, the rotation linearity error is reduced by setting the frequency of AC voltage applied to piezoelectric elements to an intermediate frequency Fm between the natural frequency mode 2 and the natural frequency mode 3 and adjusting the initial phase and the amplitude of the applied AC voltage in the same manner as in the eighth embodiment.

In the ninth embodiment, control unit 61 fixes the initial phase Φ4 of drive power supply 20-4 to a constant value (=0) and fixes the amplitude Vs4 to a constant value V0. The reason why the initial phase and the amplitude of output voltage of drive power supply 20-4 are not adjusted after the initial phases and the amplitudes of output voltages of drive power supplies 20-1 to 20-3 are adjusted and fixed is that the adjustment may increase the rotation linearity error.

Figure 32:
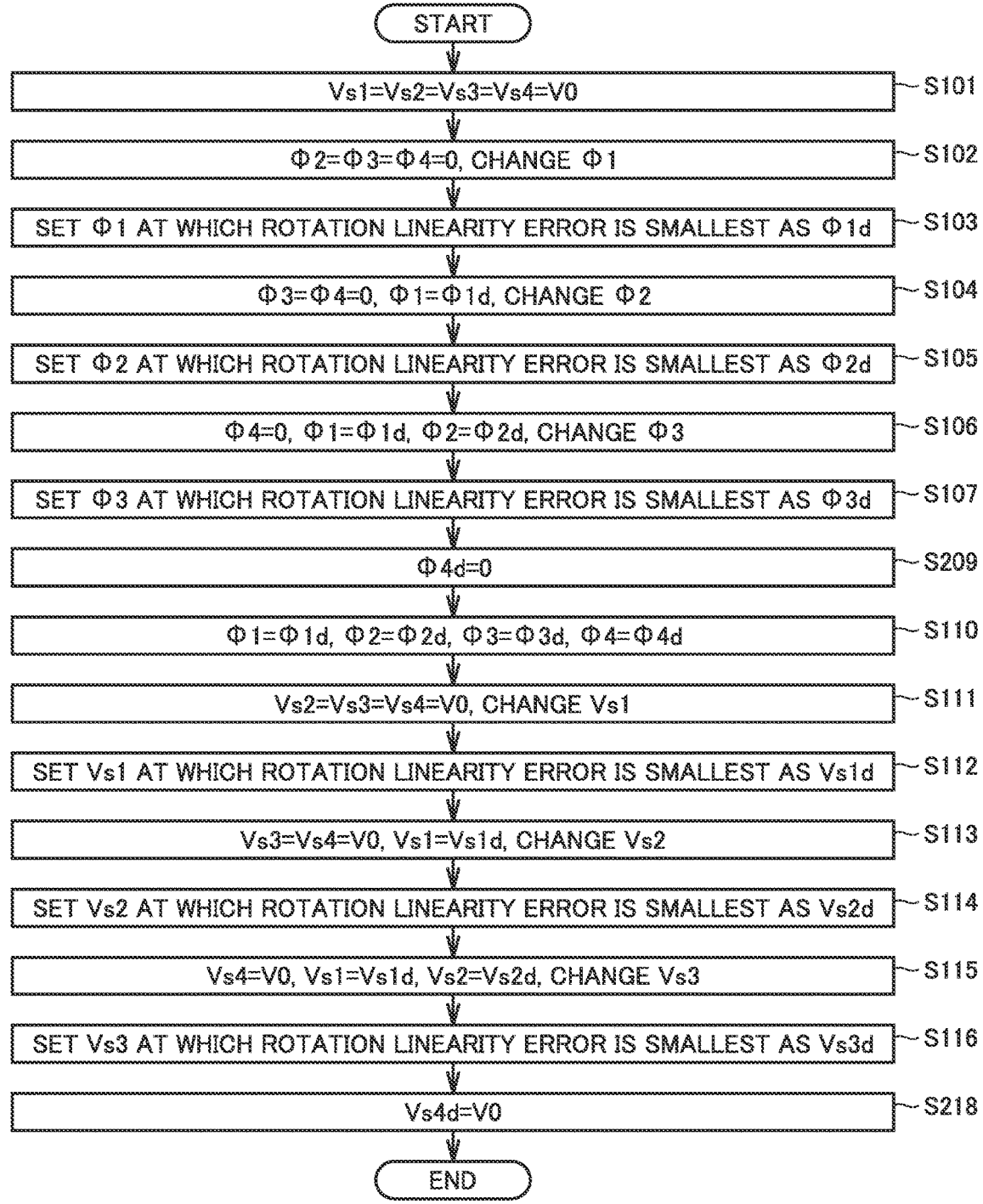
FIG. 32 is a flowchart illustrating the procedure for adjusting output voltages of the drive power supplies for allowing the mirror part to make all-round rotational displacement with the intermediate frequency Fm between the natural frequency mode 2 and the natural frequency mode 3 in the optical scanning device in a ninth embodiment.

FIG. 32 is a flowchart illustrating the procedure for adjusting output voltages of drive power supplies 20-1 to 20-4 for allowing mirror part 1 to make all-round rotational displacement at the intermediate frequency Fm between the natural frequency mode 2 and the natural frequency mode 3 in an optical scanning device 800 in the ninth embodiment.

This flowchart differs from the flowchart in FIG. 29 in that it does not include steps S108, S117 but includes step S209 instead of step S109 and includes step S218 instead of step S118.

In step S209, control unit 61 sets Φ4d to a constant value (=0).

In step S218, control unit 61 sets Vs4d to a constant value V0.

As described above, the present embodiment can prevent increase in rotation linearity error by not adjusting the initial phase and the amplitude of output voltage of drive power supply 20-4.

Tenth Embodiment

Figure 33:
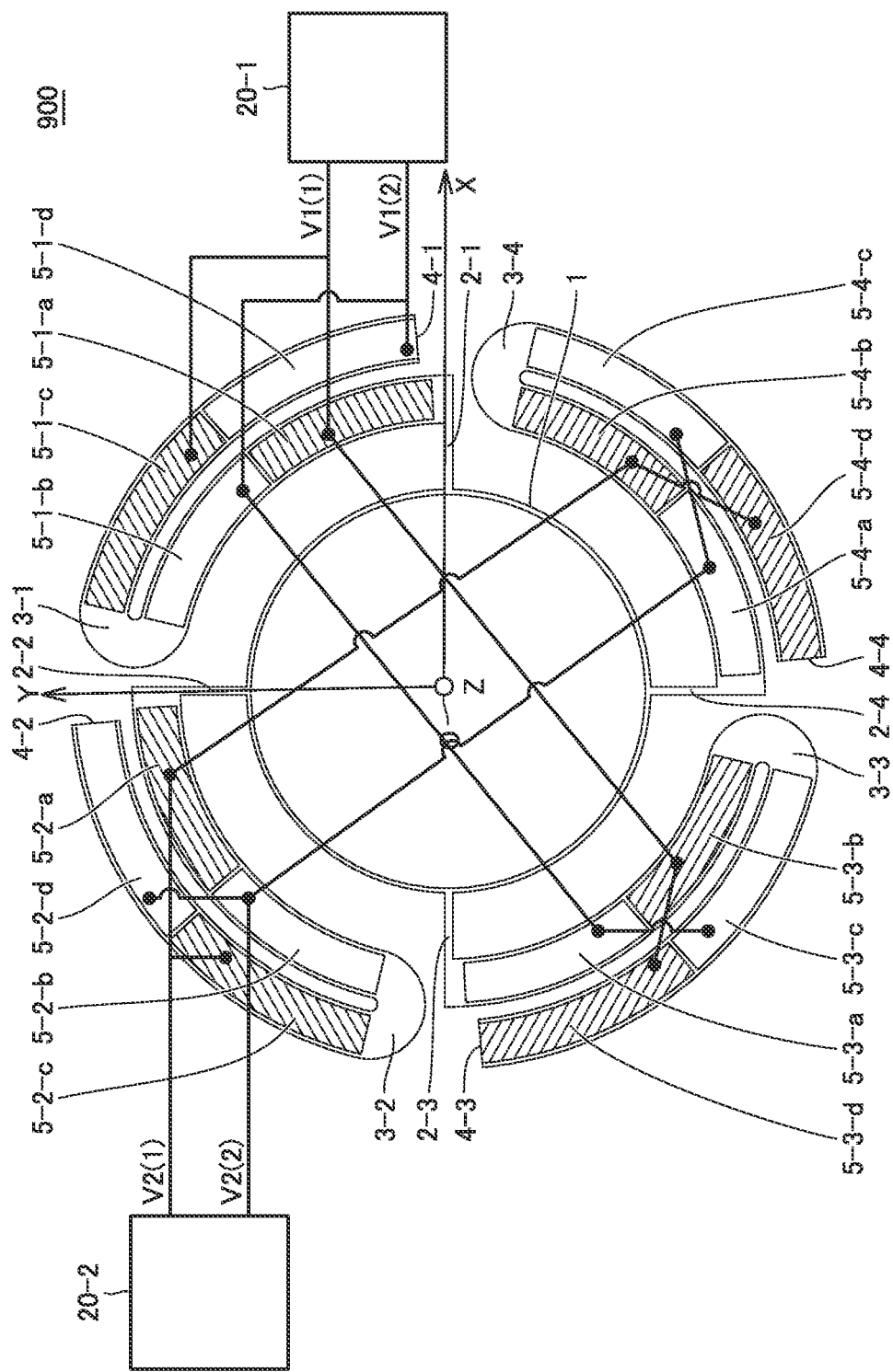
FIG. 33 is a diagram for explaining voltage for driving piezoelectric elements in the optical scanning device in a tenth embodiment.

FIG. 33 is a diagram for explaining voltage to drive piezoelectric elements 5*i*-*a* to *d* (*i*=1 to 4) in an optical scanning device 900 in a tenth embodiment. Power supply unit 62 includes a drive power supply 20-1 and a drive power supply 20-2.

Drive power supply 20-1 supplies AC voltage to piezoelectric elements 5-1-*a* to d, 5-3-*a* to *d* on drive cantilevers 3-1, 3-3. Drive power supply 20-2 supplies AC voltage to piezoelectric elements 5-2-*a* to *d*, 5-4-*a* to *d* on drive cantilevers 3-2, 3-4.

The phase and the amplitude of AC voltage of drive power supply 20-*i* can be controlled independently of the other drive power supply. The frequencies of AC voltages of drive power supplies 20-1, 20-2 are the same but can be set to a value in accordance with the resonance frequency.

Also in the present embodiment, the phase and the amplitude of AC voltage of drive power supply 20-*i* are adjusted when the resonance frequency F2 in the natural frequency mode 2 and the resonance frequency F3 in the natural frequency mode 3 do not match, in the same manner as in the eighth and ninth embodiments.

Drive power supply 20-1 outputs AC voltages Vi(1), Vi(2) as follows.

$$V1(1) = Vs1 \times \sin(\omega t + \Phi 1) \quad (19)$$

$$V1(2) = -Vs1 \times \sin(\omega t + \Phi 1) \quad (20)$$

Here, ω=2π×(F2+F3)/2. F2 is the resonance frequency in the natural frequency mode 2, and F3 is the resonance frequency in the natural frequency mode 3. t is time.

Drive power supply 20-2 outputs AC voltages V2(1), V2(2) as follows.

$$V2(1) = Vs2 \times \sin(\omega t + 90° + \Phi 2) \quad (21)$$

$$V2(2) = -Vs2 \times \sin(\omega t + 90° + \Phi 2) \quad (22)$$

V1(1) is supplied to piezoelectric elements 5-1-*a*, 5-1-*c* on the first drive cantilever 3-1 and supplied to piezoelectric elements 5-3-*b*, 5-3-*d* on the third drive cantilever 3-3.

V1(2) is supplied to piezoelectric elements 5-1-*b*, 5-1-*d* on the first drive cantilever 3-1 and supplied to piezoelectric elements 5-3-*a*, 5-3-*c* on the third drive cantilever 3-3.

V2(1) is supplied to piezoelectric elements 5-2-*a*, 5-2-*c* on the second drive cantilever 3-2 and supplied to piezoelectric elements 5-4-*b*, 5-4-*d* on the fourth drive cantilever 3-4.

V2(2) is supplied to piezoelectric elements 5-2-*b*, 5-2-*d* on the second drive cantilever 3-2 and supplied to piezoelectric elements 5-4-*a*, 5-4-*c* on the fourth drive cantilever 3-4.

Figure 34:
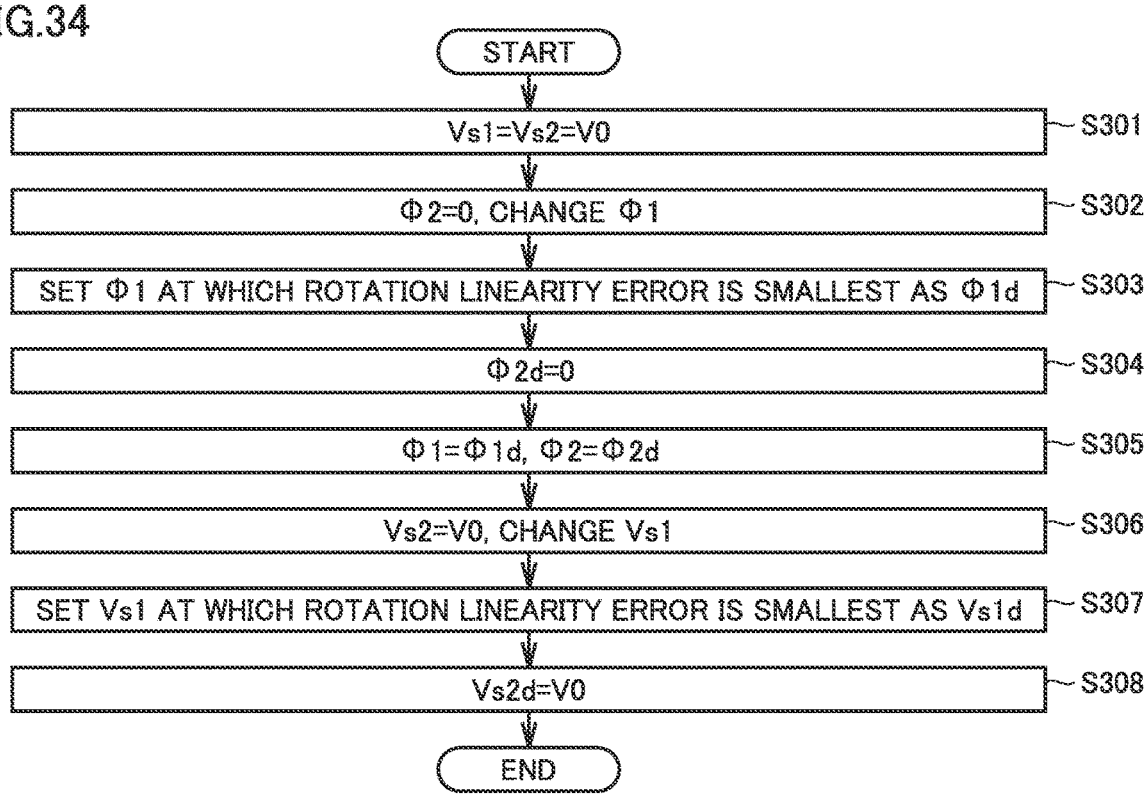
FIG. 34 is a flowchart illustrating the procedure for adjusting voltages of the drive power supplies for allowing the mirror part to make all-round rotational displacement with the intermediate frequency Fm between the natural frequency mode 2 and the natural frequency mode 3 in the optical scanning device in the tenth embodiment.

FIG. 34 is a flowchart illustrating the procedure for adjusting voltages of drive power supplies 20-1, 20-2 for allowing mirror part 1 to make all-round rotational displacement at the intermediate frequency Fm between the natural frequency mode 2 and the natural frequency mode 3 in optical scanning device 900 in the tenth embodiment.

In step S301, control unit 61 fixes the amplitudes Vs1, Vs2 of voltages of drive power supplies 20-1, 20-2 to a constant value V0.

Figure 35:
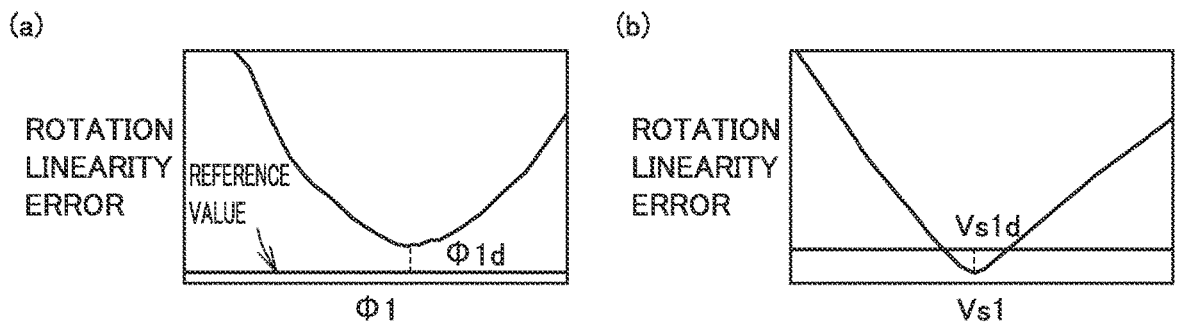
FIG. 35(a) is a diagram illustrating the relation between the initial phase $\Phi1$ and the measured rotation linearity error.
FIG. 35(b) is a diagram illustrating the relation between the amplitude Vs1 and the measured rotation linearity error.

In step S302, control unit 61 fixes the initial phase Φ2 of voltage of drive power supply 20-2 to a constant value (=0) and measures the rotation linearity error while changing the initial phase Φ1 of voltage of drive power supply 20-1. FIG. 35(*a*) is a diagram illustrating the relation between the initial phase Φ1 and the measured rotation linearity error in step S302.

In step S303, control unit 61 sets Φ1 at which the rotation linearity error is smallest as Φ1d.

In step S304, control unit 61 sets Φ2d to a constant value (=0).

In step S305, control unit 61 fixes the initial phases Φ1, Φ2 of voltages of drive power supplies 20-1, 20-2 to Φ1d, Φ2d.

In step S306, control unit 61 fixes the amplitude Vs2 of voltage of drive power supply 20-2 to a constant value V0 and measures the rotation linearity error while changing the amplitude Vs1 of voltage of drive power supply 20-1. FIG. 35(*b*) is a diagram illustrating the relation between the amplitude Vs1 and the measured rotation linearity error in step S306.

In step S307, control unit 61 sets Vs1 at which the rotation linearity error is smallest as Vs1d.

In step S218, control unit 61 sets Vs4d to constant value V0.

After the adjustment described above, control unit 61 sets the initial phases Φ1, Φ2 in Equations (19) to (22) to Φ1d, Φ2d and sets the amplitudes Vs1, Vs2 to Vs1d, Vs2d to drive mirror part 1.

As described above, the reason why the initial phase and the amplitude of output voltage of drive power supply 20-2 need not be adjusted after the initial phase and the amplitude of output voltage of drive power supply 20-1 are adjusted and fixed is that the rotation linearity can be adjusted by adjusting the relative amplitude and initial phase of the natural frequency mode 2 and the natural frequency mode 3. The natural frequency mode 2 is rotational vibration around the X axis, and the natural frequency mode 3 is rotational vibration around the Y axis. The vibration characteristics of the natural frequency mode 2 can be adjusted by adjusting the output voltage of drive power supply 20-1. The vibration characteristics of the natural frequency mode 3 can be adjusted by adjusting the output voltage of drive power supply 20-2. The amplitude and the initial phase of output voltage of drive power supply 20-2 are initially fixed and the rotation vibration characteristics around the Y axis are fixed, so that the relative drive characteristics around the Y axis and around the X axis can be adjusted by adjusting the amplitude and the phase of output voltage of drive power supply 20-1.

Control unit 61 can control the deflection angle θ of mirror part 1 by fixing the initial phases of voltages of drive power supplies 20-1, 20-2 to Φ1d, Φ2d, setting the amplitudes to k×Vs1d, k×Vs2d, and changing k.

The optical scanning device illustrated in the present embodiment is advantageous in that the drive power supplies can be simplified and the adjustment of rotational displacement can also be simplified.

In the present embodiment, four drive cantilevers 3-1 to 3-4 are ordered counterclockwise. However, embodiments are not limited thereto, and they may be ordered clockwise.

(Note)

Optical scanning device 900 in the tenth embodiment has the following features.

(17) Where N=4, four drive cantilevers are ordered clockwise or counterclockwise. Four support cantilevers (2-1 to 2-4) are arranged in 90° rotational symmetry with respect to the center axis of a mirror part (1). Four drive cantilevers (3-1 to 3-4) are arranged in 90° rotational symmetry with respect to the center axis of the mirror part (1). Of the portions that constitute each (3-*i*) of four drive cantilevers (3-1 to 3-4), each of a plurality of circumferential portions extending in the same direction as the circumferential direction of the mirror part (1) has two piezoelectric elements (5*i*-*a* and 5*i*-*b*, 5*i*-*c* and 5*i*-*d*). The power supply unit (61) includes a first drive power supply (20-1) configured to output a first AC voltage (V1(1)) having a first initial phase (Φ1) and a first amplitude (Vs1), and a second AC voltage (V1(2)) having a phase different from the first AC voltage (V1(1)) by 180 degrees and a second drive power supply (20-2) configured to output a third AC voltage (V2(1)) having a second initial phase (Φ2) and a second amplitude (Vs2) and a fourth AC voltage (V2(2)) having a phase different from the third AC voltage (V2(1)) by 180 degrees. The first drive power supply (20-1) applies the first AC voltage (V1(1)) to a first piezoelectric element (5-1-*a*) near the support cantilever (2-1), among a plurality of piezoelectric elements arranged on a first drive cantilever (3-1), and applies the first AC voltage (V1(1)) or the second AC voltage (V1(2)) to the other piezoelectric elements (5-1-*b* to *d*) arranged on the first drive cantilever (3-1). The first drive power supply (20-1) applies the second AC voltage (V1(2)) to a second piezoelectric element (5-3-*a*) near the support cantilever (2-3), among a plurality of piezoelectric elements arranged on a third drive cantilever (3-3), and applies the first AC voltage (V1(1)) or the second AC voltage (V1(2)) to the other piezoelectric elements (5-3-*b* to *d*) arranged on the third drive cantilever (3-3). The second drive power supply (20-2) applies the third AC voltage (V2(1)) to a third piezoelectric element (5-2-*a*) near the support cantilever (2-2), among a plurality of piezoelectric elements arranged on a second drive cantilever (3-2), and applies the third AC voltage (V2(1)) or the fourth AC voltage (V2(2)) to the other piezoelectric elements (5-2-*b* to *d*) arranged on the second drive cantilever (3-2). The second drive power supply (20-2) applies the fourth AC voltage (V2(2)) to a fourth piezoelectric element (5-4-*a*) near the support cantilever (2-4), among a plurality of piezoelectric elements arranged on a fourth drive cantilever (3-4), and applies the third AC voltage (V2(1)) or the fourth AC voltage (V2(2)) to the other piezoelectric elements (5-4-*b* to *d*) arranged on the fourth drive cantilever (3-4).

As described above, with only two drive power supplies (20-1, 20-2), AC voltage can be supplied to the piezoelectric elements (5*i*-*a* to *d*: i=1 to 4) on four drive cantilevers (3-1 to 3-4).

(18) The control unit (61) fixes the second initial phase (Φ2) and the second amplitude (Vs2) and fixes the first amplitude (Vs1), and changes the first initial phase (Φ1) to determine the first initial phase (Φ1) at which the rotation linearity error is smallest as an adjustment value (Φ1d) of the first initial phase. The control unit (61) fixes the second initial phase (Φ2) and the second amplitude (Vs2) and fixes the first initial phase (Φ1), and changes the first amplitude (Vs1) to determine the first amplitude (Vs1) at which the rotation linearity error is smallest as an adjustment value (Vs1d) of the first amplitude. The rotation linearity error is the quantity that represents a deviation from the linearity of all-round rotational displacement of the mirror part (1). The all-round rotational displacement of the mirror part (1) is a displacement of the mirror part (1) such that the center axis of the mirror part (1) makes a turn while the deflection angle of the mirror part (1) is kept constant.

With such a configuration, the rotation linearity error can be reduced only by adjusting the first initial phase ($\Phi 1$) and the first amplitude (Vs1) of AC voltage of the first drive power supply (20-2).

Eleventh Embodiment

Figure 36:
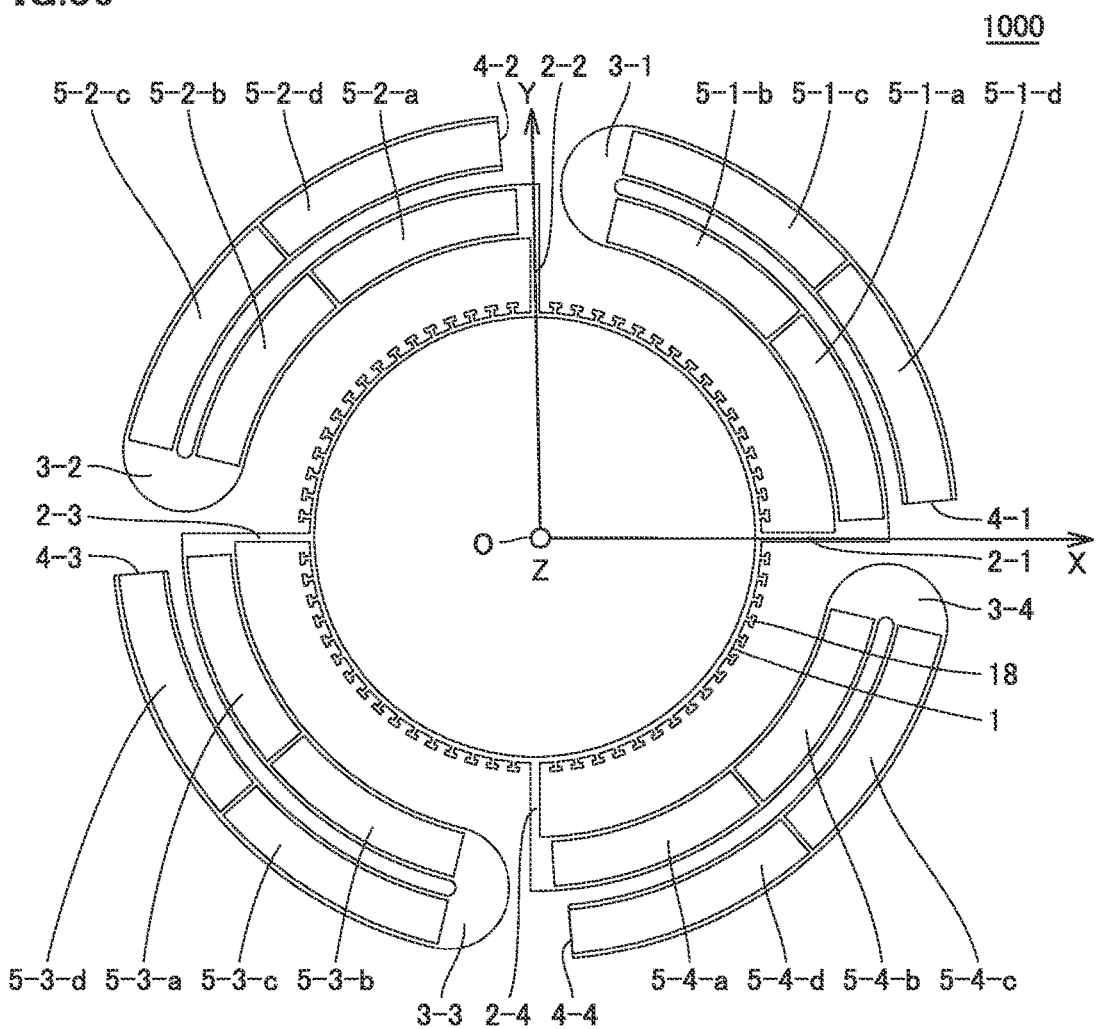
FIG. 36 is a diagram illustrating the mirror part of the optical scanning device in an eleventh embodiment.

FIG. 36 is a diagram illustrating mirror part 1 of an optical scanning device 1000 in an eleventh embodiment.

As shown in FIG. 36, mirror part 1 includes a trimming pattern 18 on the outer periphery of a silicon mirror part 1C. Trimming pattern 18 is formed of a plurality of projections.

Figure 37:
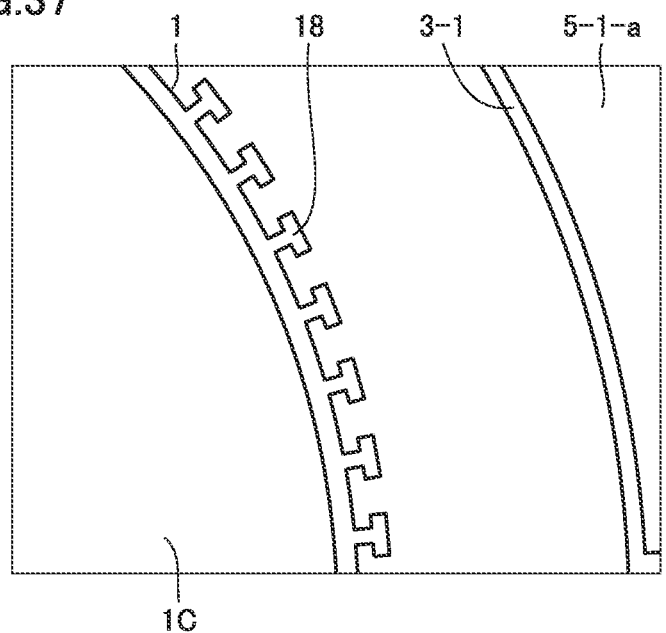
FIG. 37 is an enlarged view of a trimming pattern of the mirror part.

FIG. 37 is an enlarged view of the trimming pattern of mirror part 1.

When the difference between the resonance frequency F2 in the natural frequency mode 2 and the resonance frequency F3 in the natural frequency mode 3 is large, trimming pattern 18 is trimmed by local cutting, for example, by a laser, or by evaporation to reduce the difference between the resonance frequency F2 and the resonance frequency F3.

Figure 38:
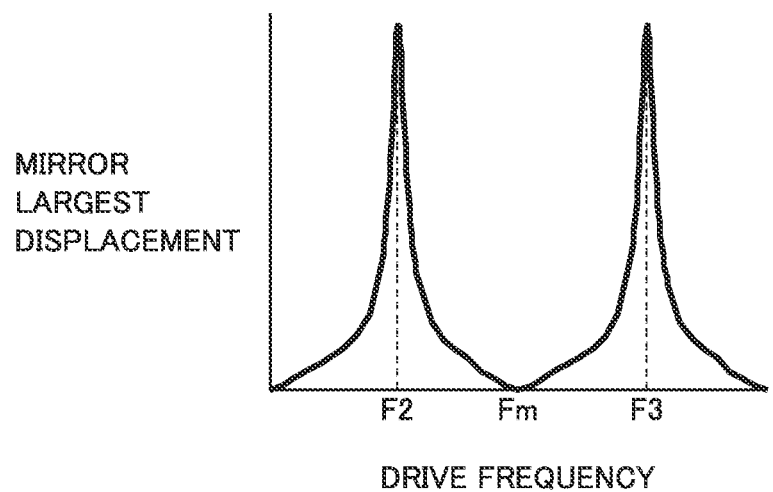
FIG. 38 is a diagram illustrating the relation between the drive frequency and the mirror largest displacement before trimming.

FIG. 38 is a diagram illustrating the relation between the drive frequency and the mirror largest displacement before trimming.

The mirror largest displacement refers to the largest displacement in the Z axis direction at a point on the circumference of mirror part 1. Since the difference between the resonance frequency F2 and the resonance frequency F3 is large before trimming, the mirror largest displacement at the intermediate frequency Fm is small.

Figure 39:
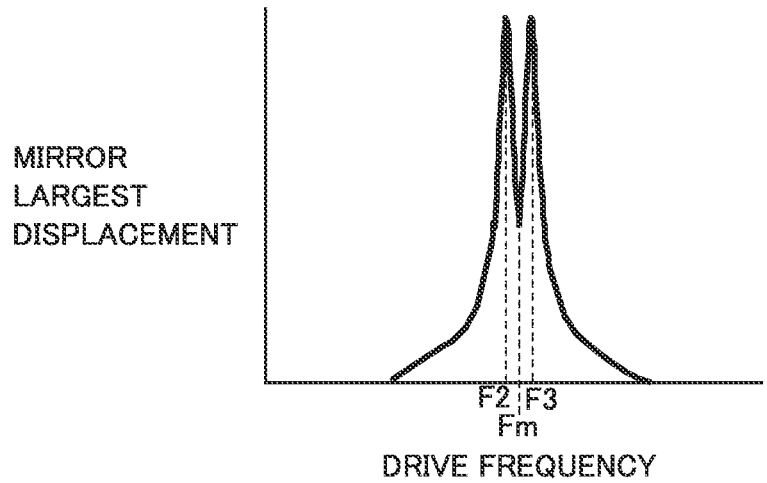
FIG. 39 is a diagram illustrating the relation between the drive frequency and the mirror largest displacement after trimming.

FIG. 39 is a diagram illustrating the relation between the drive frequency and the mirror largest displacement after trimming.

Since the difference between the resonance frequency F2 and the resonance frequency F3 is small after trimming, the mirror largest displacement at the intermediate frequency Fm is large.

When the mirror part 1 makes all-round rotational displacement with the intermediate frequency (F2+F3)/2 between two resonance frequencies F2 and F3, the initial phase and the amplitude of the drive power supply are controlled as described in the eighth to tenth embodiments to enable rotation displacement with good linearity.

However, as shown in FIG. 38, before trimming, since there is no displacement-increasing effect by resonance, it is impossible to increase the deflection angle of mirror part 1. Although increasing the amplitude of drive voltage increases the deflection angle, a pressure exceeding the withstand pressure upper limit is exerted on piezoelectric elements 5$i$-$a$ to $d$, if the amplitude of drive voltage is increased.

On the other hand, as shown in FIG. 39, after trimming, when mirror part 1 makes all-round rotational displacement with the intermediate frequency (F2+F3)/2 between two resonance frequencies F2 and F3, a minute displacement of piezoelectric elements 5$i$-$a$ to $d$ can be converted into a large displacement of drive cantilever 3-$i$, and the deflection angle of mirror part 1 can be increased.

The trimming step is performed in a testing step at a wafer level during fabrication of optical scanning device 1000 or in a testing step after packaging.

Figure 40:
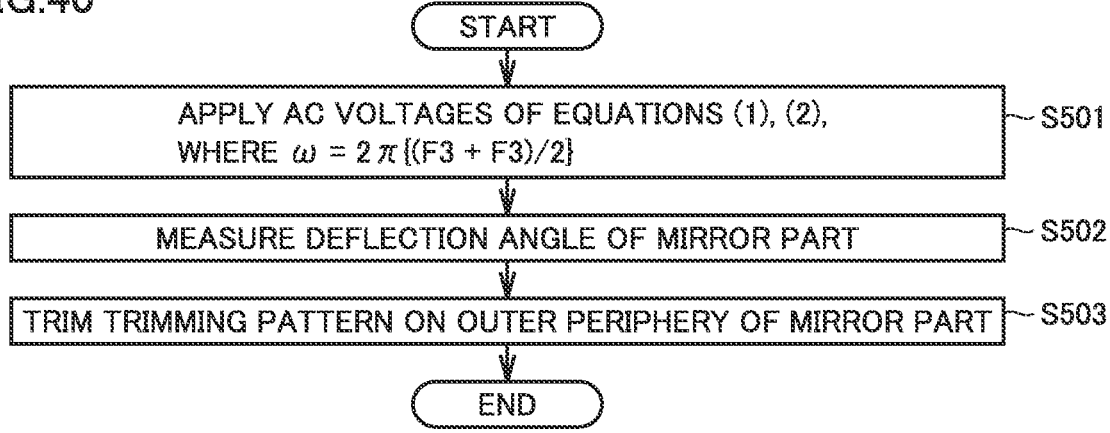
FIG. 40 is a flowchart illustrating the procedure for adjusting the optical scanning device in the eleventh embodiment.

FIG. 40 is a flowchart illustrating the procedure for adjusting optical scanning device 1000 in the eleventh embodiment.

In step S501, power supply unit 62 applies voltages of Equations (1), (2) to piezoelectric elements 5$i$-$a$, $b$, $c$, $d$ ($i$=1 to 4), where $\omega = 2\pi\{(F3+F3)/2\}$.

In step S502, detecting piezoelectric element 6-$i$ ($i$=1 to 4) generates electric charge proportional to the deflection angle $\theta$ of mirror part 1. Control unit 61 calculates the deflection angle of mirror part 1 based on the electric charge generated in detecting piezoelectric element 6-$i$ and displays the calculated deflection angle on a not-shown monitor.

In step S503, the tester trims a part or the whole of trimming pattern 18 on the outer periphery of mirror part 1, for example, by a laser, in accordance with the deflection angle of mirror part 1 displayed on the monitor.

In the present embodiment, the trimming pattern is formed of a plurality of minute projections. However, embodiments are not limited thereto, and the trimming pattern may have any other shapes.

(Note)

Optical scanning device 1000 in the eleventh embodiment has the following features.

(19) The mirror part (1) includes a trimming pattern (18) on the outer periphery thereof.

With such a configuration, even when resonant drive with the intermediate frequency Fm is impossible due to a large difference between the resonance frequency F2 in the first natural frequency mode (natural frequency mode 2) and the resonance frequency F3 in the second natural frequency mode (natural frequency mode 3), the trimming pattern provided on the outer periphery of the mirror part (1) can be trimmed to reduce the difference between the resonance frequency F2 and the resonance frequency F3, thereby enabling resonant drive with the intermediate frequency Fm.

Twelfth Embodiment

In the eleventh embodiment, a trimming pattern is arranged on the outer periphery of mirror part 1. However, embodiments are not limited thereto.

In a twelfth embodiment, equivalent effects can be achieved by removing a part of mirror part 1 of an optical scanning device 1100, a part of drive cantilevers 3-1 to 3-4, or a part of support cantilevers 2-1 to 2-4, for example, by a laser.

Figure 41:
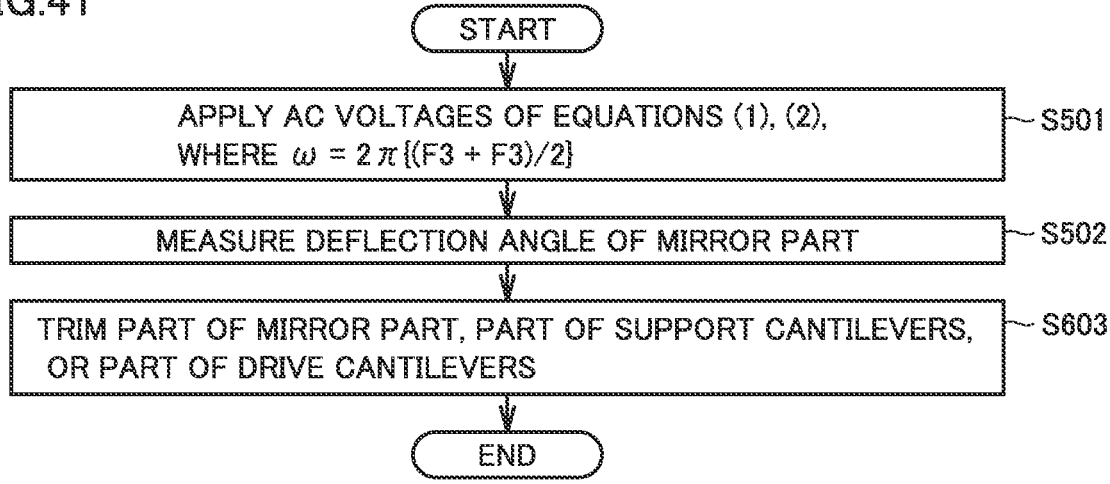
FIG. 41 is a flowchart illustrating the adjustment procedure for the optical scanning device in a twelfth embodiment.

FIG. 41 is a flowchart illustrating the procedure for adjusting optical scanning device 1100 in a twelfth embodiment.

In step S501, power supply unit 62 applies voltages of Equations (1), (2) to piezoelectric elements 5$i$-$a$ to $d$ ($i$=1 to 4), where $\omega = 2\pi\{(F3+F3)/2\}$.

In step S502, detecting piezoelectric element 6-$i$ ($i$=1 to 4) generates electric charge proportional to the deflection angle $\theta$ of mirror part 1. Control unit 61 calculates the deflection angle of mirror part 1 based on the electric charge generated in detecting piezoelectric element 6-$i$ and displays the calculated deflection angle on a not-shown monitor.

In step S603, the tester trims a part of mirror part 1 (including a part of the trimming pattern, if any), a part of drive cantilevers 3-1 to 3-4, or a part of support cantilevers 2-1 to 2-4, for example, by a laser, in accordance with the deflection angle of mirror part 1 displayed on the monitor.

The initial phase and the amplitude of AC voltage may be further adjusted after trimming as in the foregoing embodiment.

(Note)

Optical scanning device 1100 in the twelfth embodiment has the following features.

(20) In a method of adjusting an optical scanning device (1100), the optical scanning device (1100) includes a mirror part (1) having a mirror surface (1B) configured to reflect light, N (N≥3) support cantilevers (2-1 to 2-4) supporting the mirror part (1) swingably, and N drive cantilevers (3-1 to 3-4) respectively connected to N support cantilevers (2-1 to 2-4). N drive cantilevers (3-1 to 3-4) are arranged to surround the mirror part 1. An end of both ends of each of N drive cantilevers (3-1 to 3-4) that is not connected to the support cantilever (2-1 to 2-4) is fixed. Each of N drive cantilevers (3-1 to 3-4) has a shape bent one or more times at 180°. The optical scanning device (1100) further includes a plurality of driving piezoelectric elements (5-1-*a* to *d*, 5-2-*a* to *d*, 5-3-*a* to *d*, 5-4-*a* to *d*) secured on N drive cantilevers (3-1 to 3-4) and a power supply unit (62). N support cantilevers (2-1 to 2-4) are arranged in (360°/N) rotational symmetry with respect to the center axis of the mirror part (1). The mirror part (1) has a first natural frequency mode (natural frequency mode 2) of being rotationally displaced around a first axis (the X axis) and a second natural frequency mode (natural frequency mode 3) of being rotationally displaced a second axis (the Y axis). The first axis (the X axis) and the second axis (the Y axis) are parallel to the mirror surface (1B). The direction of the first axis (the X axis) is the direction of a straight line connecting the center of the mirror part (1) with a connection portion between the mirror part (1) and one of N support cantilevers (2-1 to 2-4). The second axis (the Y axis) is orthogonal to the first axis (the X axis). This adjustment method includes the step of applying AC voltage to a plurality of piezoelectric elements (5*i*-*a* to *d*) by the power supply unit (62). The phase of AC voltage is a value corresponding to the position of the piezoelectric element, and the frequency of AC voltage is an intermediate frequency (Fm) between a resonance frequency F2 in the first natural frequency mode (natural frequency mode 2) and a resonance frequency F3 in the second natural frequency mode (natural frequency mode 3). This adjustment method further includes the steps of: measuring the deflection angle of the mirror part (1); and trimming a part of the mirror part (1), a part of the support cantilevers (2-1 to 2-4), or a part of drive cantilevers (3-1 to 3-4).

Therefore, even when resonant drive with the intermediate frequency Fm is impossible due to a large difference between the resonance frequency F2 in the first natural frequency mode (natural frequency mode 2) and the resonance frequency F3 in the second natural frequency mode (natural frequency mode 3), a part of the mirror part (1), a part of the support cantilevers (2-1 to 2-4), or a part of the drive cantilevers (3-1 to 3-4) is trimmed by a laser, whereby the difference between the resonance frequency F2 and the resonance frequency F3 is reduced to enable resonant drive with the intermediate frequency Fm.

Thirteenth Embodiment

Figure 42:
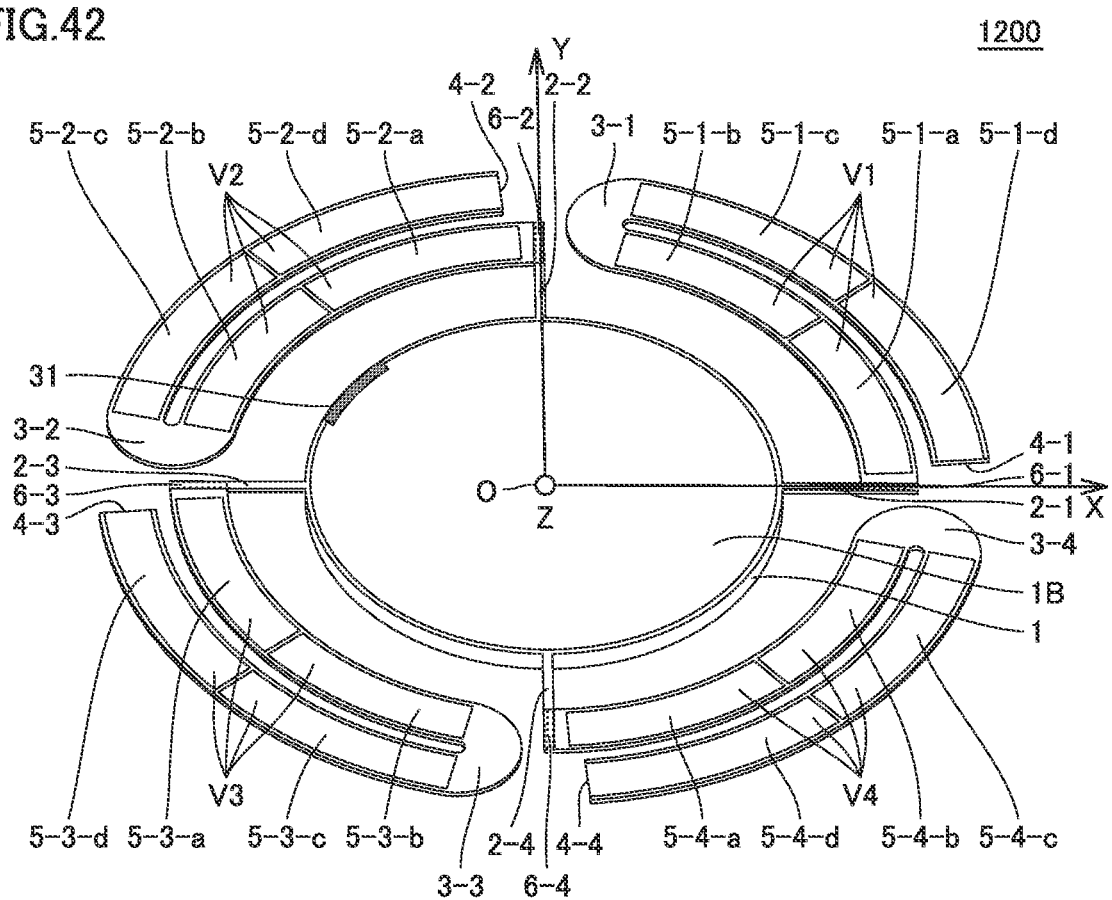
FIG. 42 is a diagram illustrating an example of the optical scanning device in a thirteenth embodiment.

FIG. 42 is a diagram illustrating an optical scanning device 1200 as an example of a thirteenth embodiment.

In the present embodiment, as shown in FIG. 42, a frequency adjusting film 31 is formed on the periphery of mirror part 1. Frequency adjusting film 31 can be formed by locally growing a thin film of tungsten or the like by a local film deposition method such as laser CVD.

In the twelfth embodiment, a part of the mirror structure is locally cut, for example, by a laser or evaporated for adjustment of the resonance frequency F2 in the natural frequency mode 2 and the resonance frequency F3 in the natural frequency mode 3, whereby the difference between the resonance frequency F2 and the resonance frequency F3 is reduced. In the present embodiment, frequency adjusting film 31 on the periphery of mirror part 1 adjusts the resonance frequency difference.

Figure 43:
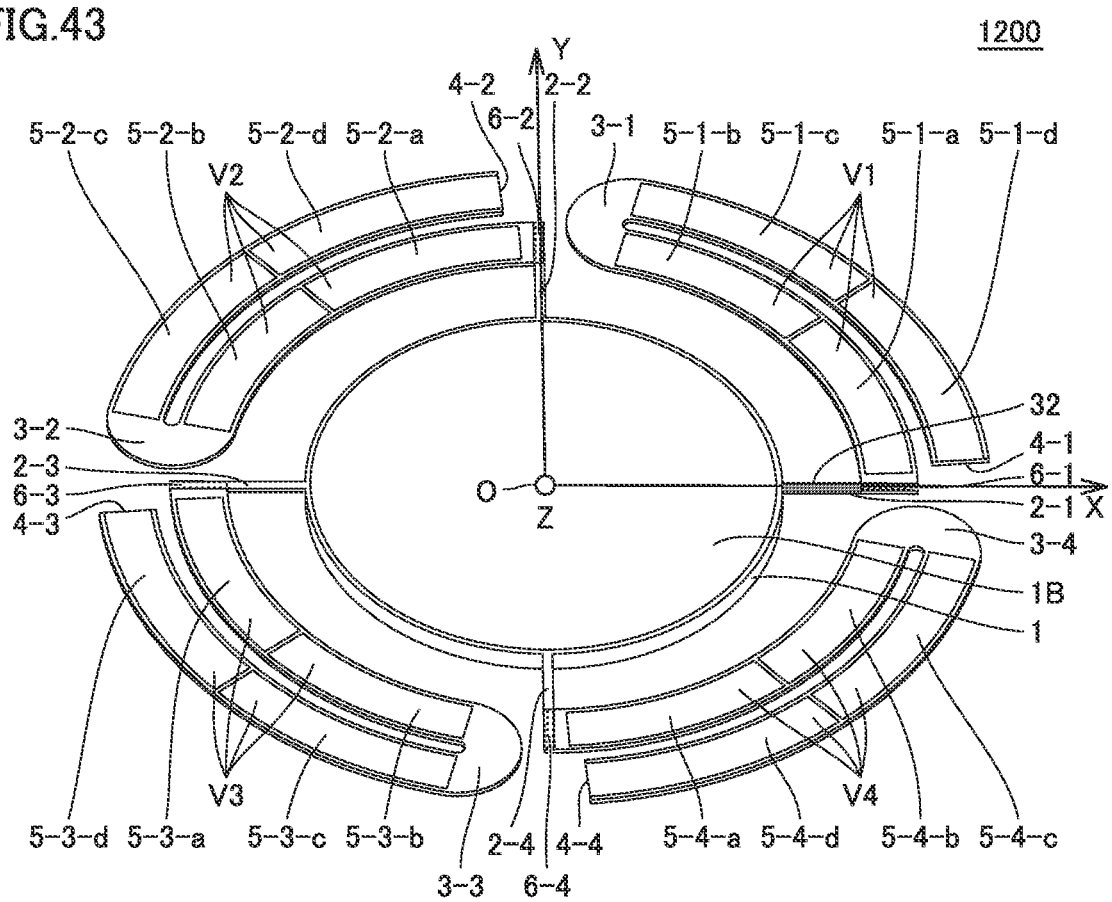
FIG. 43 is a diagram illustrating another example of the optical scanning device in the thirteenth embodiment.

FIG. 43 is a diagram illustrating an optical scanning device 1300 as another example of the thirteenth embodiment.

As shown in FIG. 43, a frequency adjusting film 32 is formed on support cantilever 2-1 to adjust the resonance frequency difference.

The frequency adjusting film may be formed on a part of mirror part 1, a part of drive cantilevers 3-1 to 3-4, or a part of support cantilevers 2-1 to 2-4, rather than being formed on the periphery of mirror part 1 and on support cantilever 2-1.

Figure 44:
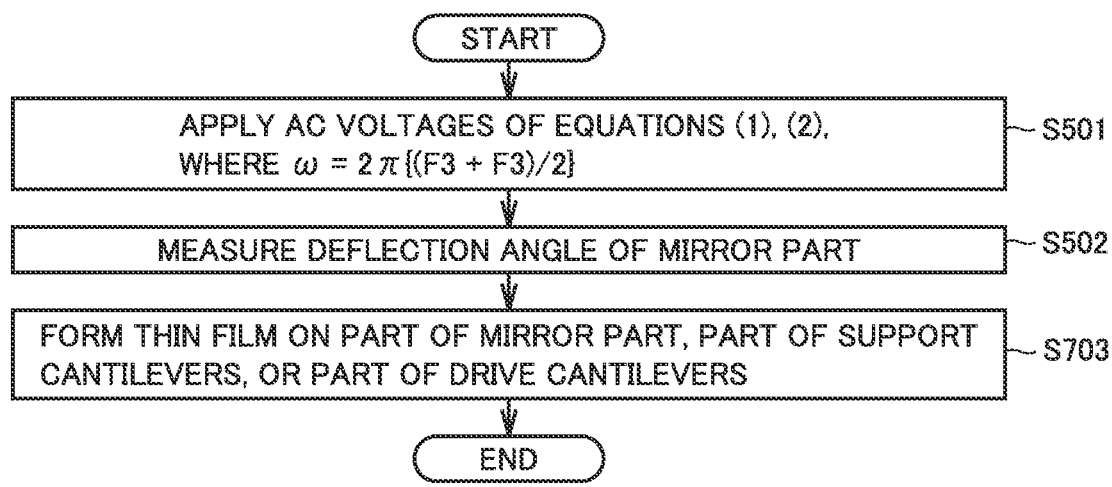
FIG. 44 is a flowchart illustrating the procedure for adjusting the optical scanning device in the thirteenth embodiment.

FIG. 44 is a flowchart illustrating the procedure for adjusting optical scanning devices 1200, 1300 in the thirteenth embodiment.

In step S501, power supply unit 62 applies voltages of Equations (1), (2) to piezoelectric elements 5*i*-*a* to *d* (i=1 to 4), where ω=2π{(F3+F3)/2}.

In step S502, detecting piezoelectric element 6-*i* (i=1 to 4) generates electric charge proportional to the deflection angle θ of mirror part 1. Control unit 61 calculates the deflection angle of mirror part 1 based on the electric charge generated in detecting piezoelectric element 6-*i* and displays the calculated deflection angle on a not-shown monitor.

In step S603, the tester forms a thin film on a part of mirror part 1, a part of drive cantilevers 3-1 to 3-4, or a part of support cantilevers 2-1 to 2-4 in accordance with the deflection angle of mirror part 1 displayed on the monitor.

The frequency adjustment by a local thin film is advantageous in that the adjustment range is wide and minute adjustment is possible, compared with trimming, because the degree of freedom in thin film formation is high. In trimming, the evaporated structure may be deposited again to cause a resonance frequency shift, whereas the local thin film is advantages in that the problem caused by re-deposition does not occur.

(Note)

Optical scanning device 1200, 1300 in the thirteenth embodiment has the following features.

(21) In a method of adjusting an optical scanning device (1200, 1300), the optical scanning device (1100) includes a mirror part (1) having a mirror surface (1B) configured to reflect light, N (N≥3) support cantilevers (2-1 to 2-4) supporting the mirror part (1) swingably, and N drive cantilevers (3-1 to 3-4) respectively connected to N support cantilevers (2-1 to 2-4). N drive cantilevers (3-1 to 3-4) are arranged to surround the mirror part 1. An end of both ends of each of N drive cantilevers (3-1 to 3-4) that is not connected to the support cantilever (2-1 to 2-4) is fixed. Each of N drive cantilevers (3-1 to 3-4) has a shape bent one or more times at 180°. The optical scanning device (1100) further includes a plurality of driving piezoelectric elements (5-1-*a* to *d*, 5-2-*a* to *d*, 5-3-*a* to *d*, 5-4-*a* to *d*) secured on N drive cantilevers (3-1 to 3-4) and a power supply unit (62). N support cantilevers (2-1 to 2-4) are arranged in (360°/N) rotational symmetry with respect to the center axis of the mirror part (1). The mirror part (1) has a first natural frequency mode (natural frequency mode 2) of being rotationally displaced around a first axis (the X axis) and a second natural frequency mode (natural frequency mode 3) of being rotationally displaced around a second axis (the Y axis). The first axis (the X axis) and the second axis (the Y axis) are parallel to the mirror surface (1B). The direction of the first axis (the X axis) is the direction of a straight line connecting the center of the mirror part (1) with a connection portion between the mirror part (1) and one of N support cantilevers (2-1 to 2-4). The second axis (the Y axis) is orthogonal to the first axis (the X axis). This adjustment method includes the step of applying AC voltage to a plurality of piezoelectric elements (5$i$-$a$ to $d$) by the power supply unit (62). The phase of AC voltage is a value corresponding to the position of the piezoelectric element, and the frequency of AC voltage is an intermediate frequency (Fm) between a resonance frequency F2 in the first natural frequency mode (natural frequency mode 2) and a resonance frequency F3 in the second natural frequency mode (natural frequency mode 3). This adjustment method further includes the steps of: measuring the deflection angle of the mirror part (1); and forming a thin film (31, 32) on a part of the mirror part (1), a part of the support cantilevers (2-1 to 2-4), or a part of the drive cantilevers (3-1 to 3-4).

Therefore, even when resonant drive with the intermediate frequency Fm is impossible due to a large difference between the resonance frequency F2 in the first natural frequency mode (natural frequency mode 2) and the resonance frequency F3 in the second natural frequency mode (natural frequency mode 3), a thin film (31, 32) is formed on a part of the mirror part (1), a part of the support cantilevers (2-1 to 2-4), or a part of the drive cantilevers (3-1 to 3-4), whereby the difference between the resonance frequency F2 and the resonance frequency F3 is reduced to enable resonant drive with the intermediate frequency Fm.

(Modifications)

The present invention is not limited to the foregoing embodiments and includes, for example, modifications as follows.

(A) Shape of Mirror Part 1

In the second to seventh embodiments, mirror part 1 has a 360°/N rotational symmetric shape with respect to the Z axis such that the resonance frequency in the natural frequency mode 2 and the resonance frequency in the natural frequency mode 3 match. However, embodiments are not limited thereto. Even when mirror part 1 does not have a 360°/N rotational symmetric shape with respect to the Z axis, the resonance frequency in the natural frequency mode 2 and the resonance frequency in the natural frequency mode 3 can be matched by adjusting the mechanical rigidity of the drive cantilevers, the support cantilevers, and the mirror part. However, the rotation linearity error can be reduced more when mirror part 1 has a 360°/N rotational symmetric shape with respect to the Z axis.

(B) Number of Piezoelectric Elements

In the first to eleventh embodiments, two piezoelectric elements are arranged on each of a plurality of circumferential portions extending in the same direction as the circumferential direction of mirror part 1 on one drive cantilever. However, embodiments are not limited thereto. For example, when A, B, C, D, a bend portion, E, F, G, H piezoelectric elements are arranged on one drive cantilever in order from an end, AC voltage with a phase P may be applied to A, B, E, F and AC voltage with a phase (P+180°) may be applied to C, D, G, H. This reduces mechanical stress exerted on the piezoelectric elements and alleviates breakage and separation of the piezoelectric elements. On the other hand, when two piezoelectric elements are arranged as in the first to eleventh embodiments, the arrangement area of the piezoelectric elements can be increased, and the drive force can be increased.

(C) Configuration of Third to Seventh Embodiments

The configuration of the mirror part, the drive cantilevers, the support cantilevers, and the piezoelectric elements in the third to seventh embodiments is premised on that the resonance frequency in the natural frequency mode 2 and the resonance frequency in the natural frequency mode 3 match. However, embodiments are not limited thereto. The configuration of the mirror part, the drive cantilevers, the support cantilevers, and the piezoelectric elements in the third to seventh embodiments can be applied also when the intermediate frequency between the resonance frequency in the natural frequency mode 2 and the resonance frequency in the natural frequency mode 3 described in the eighth to twelfth embodiments is used.

Embodiments disclosed here should be understood as being illustrative rather than being limitative in all respects. The scope of the present invention is shown not in the foregoing description but in the claims, and it is intended that all modifications that come within the meaning and range of equivalence to the claims are embraced here.

REFERENCE SIGNS LIST 1, 501, 601 mirror part, 1B, 501B, 601B mirror surface, 1C, 501C, 601C silicon mirror part, 2-1 to 2-4, 502-1 to 502-4, 602-1 to 602-3 support cantilever, 3-1 to 3-4, 503-1 to 503-4, 603-1 to 603-3 drive cantilever, 4-1 to 4-4, 504-1 to 504-4, 604-1 to 604-3 fixed portion, 5-1-$a$ to $d$, 5-2-$a$ to $d$, 5-3-$a$ to $d$, 5-4-$a$ to $d$, 505-1-$a$ to $d$, 505-2-$a$ to $d$, 505-3-$a$ to $d$, 505-4-$a$ to $d$, 605-1-$a$ to $d$, 605-2-$a$ to $d$, 605-3-$a$ to $d$ piezoelectric element, 6-1 to 6-4 detecting piezoelectric element, 10 SOI substrate, 101 silicon support layer, 102 silicon active layer, 103 silicon oxide film, 11 insulating film, 12 lower layer electrode, 13 piezoelectric thin film, 14 upper layer electrode, 15 insulating film, 16 wiring electrode, 17 package, 18 trimming pattern, 20-1 to 20-4 drive power supply, 61 control unit, 62 power supply unit, 91 optical system, 92 target, 93 distance information calculator, 95 receiver circuit, 96 drive circuit, 99 sensing unit, 100, 200, 300, 400, 500, 600, 700, 800, 900, 1000, 1100, 1200, 1300 optical scanning device, 31, 32 frequency-adjusting thin film, LD laser diode, PD photodiode.

The invention claimed is:

1. An optical scanning device comprising:
a mirror part having a mirror surface configured to reflect light;
N (N>3) support cantilevers supporting the mirror part swingably; and
N drive cantilevers respectively connected to the N support cantilevers,
wherein the N drive cantilevers are arranged to surround the mirror part, an end of both ends of each of the N drive cantilevers that is not connected to the support cantilever is fixed, and each of the N drive cantilevers has a shape bent one or more times,
the optical scanning device further comprising:
a plurality of driving piezoelectric elements secured on the N drive cantilevers; and
a power supply unit configured to apply AC voltage to the piezoelectric elements,
wherein the mirror part precesses by setting a frequency of AC voltage applied to each of the piezoelectric elements to a common value and setting a phase of AC voltage applied to each of the piezoelectric elements to a value determined according to a position of the piezoelectric element, the N support cantilevers are arranged in (360°/N) rotational symmetry with respect to a center axis of the mirror part, the mirror part has a first natural frequency mode of being rotationally displaced around a first axis and a second natural frequency mode of being rotationally displaced around a second axis, the first axis and the second axis being parallel to the mirror surface, a direction of the first axis being a direction of a straight line connecting a center of the mirror part with a connection portion between the mirror part and one of the N support cantilevers, the second axis being orthogonal to the first axis, the power supply unit applies AC voltage at an intermediate frequency between a resonance frequency in the first natural frequency mode and a resonance frequency in the second natural frequency mode, an amplitude and an initial phase of the AC voltage are adjustable, and the power supply unit includes N drive power supplies each applying AC voltage to a plurality of piezoelectric elements on a corresponding drive cantilever, the optical scanning device further comprising a control unit configured to, in adjustment of the initial phase of the AC voltage, select one drive cantilever from among the N drive cantilevers, fix the amplitude and the initial phase of AC voltage applied to a plurality of piezoelectric elements on one or more drive cantilevers other than the selected drive cantilever, and fix the amplitude of AC voltage applied to a plurality of piezoelectric elements on the selected drive cantilever, and change the initial phase to determine the initial phase at which rotation linearity error is smallest as an adjustment value of the initial phase of AC voltage applied to a plurality of piezoelectric elements on the selected drive cantilever, wherein the rotation linearity error is a quantity that represents a deviation from linearity of all-round rotational displacement of the mirror part, and the all-round rotational displacement of the mirror part is a displacement of the mirror part such that the center axis of the mirror part makes a turn while a deflection angle of the mirror part is kept constant.

2. An optical scanning device comprising:

a mirror part having a mirror surface configured to reflect light;

N (N>3) support cantilevers supporting the mirror part swingably; and

N drive cantilevers respectively connected to the N support cantilevers, wherein the N drive cantilevers are arranged to surround the mirror part, an end of both ends of each of the N drive cantilevers that is not connected to the support cantilever is fixed, and each of the N drive cantilevers has a shape bent one or more times, the optical scanning device further comprising:

a plurality of driving piezoelectric elements secured on the N drive cantilevers: and a power supply unit configured to apply AC voltage to the piezoelectric elements, wherein the mirror part precesses by setting a frequency of AC voltage applied to each of the piezoelectric elements to a common value and setting a phase of AC voltage applied to each of the piezoelectric elements to a value determined according to a position of the piezoelectric element, the N support cantilevers are arranged in (360°/N) rotational symmetry with respect to a center axis of the mirror part, the mirror part has a first natural frequency mode of being rotationally displaced around a first axis and a second natural frequency mode of being rotationally displaced around a second axis, the first axis and the second axis being parallel to the mirror surface, a direction of the first axis being a direction of a straight line connecting a center of the mirror part with a connection portion between the mirror part and one of the N support cantilevers, the second axis being orthogonal to the first axis, the power supply unit applies AC voltage at an intermediate frequency between a resonance frequency in the first natural frequency mode and a resonance frequency in the second natural frequency mode, an amplitude and an initial phase of the AC voltage are adjustable, and the power supply unit includes N drive power supplies each applying AC voltage to a plurality of piezoelectric elements on a corresponding drive cantilever, the optical scanning device further comprising a control unit configured to, in adjustment of the amplitude of AC voltage, select one drive cantilever from among the N drive cantilevers, fix the amplitude and the initial phase of AC voltage applied to a plurality of piezoelectric elements on one or more drive cantilevers other than the selected drive cantilever, fix the initial phase of AC voltage applied to a plurality of piezoelectric elements on the selected drive cantilever, and change the amplitude to determine the amplitude at which rotation linearity error is smallest as an adjustment value of amplitude of AC voltage applied to a plurality of piezoelectric elements on the selected drive cantilever, wherein the rotation linearity error is a quantity that represents a deviation from linearity of all-round rotational displacement of the mirror part, and the all-round rotational displacement of the mirror part is a displacement of the mirror part such that the center axis of the mirror part makes a turn while a deflection angle of the mirror part is kept constant.

3. An optical scanning device comprising:

a mirror part having a mirror surface configured to reflect light;

N (N>3) support cantilevers supporting the mirror part swingably; and

N drive cantilevers respectively connected to the N support cantilevers, wherein the N drive cantilevers are arranged to surround the mirror part, an end of both ends of each of the N drive cantilevers that is not connected to the support cantilever is fixed, and each of the N drive cantilevers has a shape bent one or more times, the optical scanning device further comprising:

a plurality of driving piezoelectric elements secured on the N drive cantilevers: and a power supply unit configured to apply AC voltage to the piezoelectric elements, wherein the mirror part precesses by setting a frequency of AC voltage applied to each of the piezoelectric elements to a common value and setting a phase of AC voltage applied to each of the piezoelectric elements to a value determined according to a position of the piezoelectric element, the N support cantilevers are arranged in (360°/N) rotational symmetry with respect to a center axis of the mirror part, the mirror part has a first natural frequency mode of being rotationally displaced around a first axis and a second natural frequency mode of being rotationally displaced around a second axis, the first axis and the second axis being parallel to the mirror surface, a direction of the first axis being a direction of a straight line connecting a center of the mirror part with a connection portion between the mirror part and one of the N support cantilevers, the second axis being orthogonal to the first axis, the power supply unit applies AC voltage at an intermediate frequency between a resonance frequency in the first natural frequency mode and a resonance frequency in the second natural frequency mode, an amplitude and an initial phase of the AC voltage are adjustable, wherein $N=4$, four drive cantilevers are ordered clockwise or counter-clockwise, four support cantilevers are arranged in 90° rotational symmetry with respect to the center axis of the mirror part, four drive cantilevers are arranged in 90° rotational symmetry with respect to the center axis of the mirror part, and, of portions that constitute each of the four drive cantilevers, each of a plurality of circumferential portions extending in a same direction as a circumferential direction of the mirror part has two piezoelectric elements, the power supply unit includes a first drive power supply configured to output a first AC voltage having a first initial phase and a first amplitude and a second AC voltage having a phase different from the first AC voltage by 180 degrees, and a second drive power supply configured to output a third AC voltage having a second initial phase and a second amplitude and a fourth AC voltage having a phase from the third AC voltage by 180 degrees, the first drive power supply applies the first AC voltage to a first piezoelectric element near the support cantilever, of a plurality of piezoelectric elements arranged on the first drive cantilever, and applies the first AC voltage or the second AC voltage to other piezoelectric elements arranged on the first drive cantilever, applies the second AC voltage to a second piezoelectric element near the support cantilever, of a plurality of piezoelectric elements arranged on the third drive cantilever, and applies the first AC voltage or the second AC voltage to other piezoelectric elements arranged on the third drive cantilever, and the second drive power supply applies the third AC voltage to a third piezoelectric element near the support cantilever, of a plurality of piezoelectric elements arranged on the second drive cantilever, applies the third AC voltage or the fourth AC voltage to other piezoelectric elements arranged on the second drive cantilever, applies the fourth AC voltage to a fourth piezoelectric element near the support cantilever, of a plurality of piezoelectric elements arranged on the fourth drive cantilever, and applies the third AC voltage or the fourth AC voltage to other piezoelectric elements arranged on the fourth drive cantilever.

4. The optical scanning device according to claim 3, further comprising a control unit configured to fix the second initial phase and the second amplitude and fix the first amplitude, change the first initial phase to determine the first initial phase at which rotation linearity error is smallest as an adjustment value of the first initial phase, fix the second initial phase and the second amplitude and fix the first initial phase, and change the first amplitude to determine the first amplitude at which rotation linearity error is smallest as an adjustment value of the first amplitude, wherein the rotation linearity error is a quantity that represents a deviation from linearity of all-round rotational displacement of the mirror part, and the all-round rotational displacement of the mirror part is a displacement of the mirror part such that the center axis of the mirror part makes a turn while a deflection angle of the mirror part is kept constant.

5. The optical scanning device according to claim 1, wherein the mirror part has a trimming pattern on an outer periphery thereof.

6. The optical scanning device according to claim 1, wherein the N support cantilevers are arranged in (360°/N) rotational symmetry with respect to a center axis of the mirror part, and the N drive cantilevers are arranged in (360°/N) rotational symmetry with respect to the center axis of the mirror part, the mirror part has a (360°/N) rotational symmetric shape with respect to the center axis of the mirror part, the mirror part is formed using a crystal plane (100) of a semiconductor substrate, and the N is 4×n, and the mirror surface has a circular shape, and n is a natural number.

7. The optical scanning device according to claim 1, wherein the N support cantilevers are arranged in (360°/N) rotational symmetry with respect to a center axis of the mirror part, and the N drive cantilevers are arranged in (360°/N) rotational symmetry with respect to the center axis of the mirror part, the mirror part has a (360°/N) rotational symmetric shape with respect to the center axis of the mirror part, the mirror part is formed using a crystal plane (100) of a semiconductor substrate, and the N is 4×n, and the mirror surface has a regular (4×n) polygonal shape, and n is a natural number.

8. The optical scanning device according to claim 1, wherein the N support cantilevers are arranged in (360°/N) rotational symmetry with respect to a center axis of the mirror part, and the N drive cantilevers are arranged in (360°/N) rotational symmetry with respect to the center axis of the mirror part, the mirror part has a (360°/N) rotational symmetric shape with respect to the center axis of the mirror part, the mirror part is formed using a crystal plane (111) of a semiconductor substrate, the N is 3×n, and the mirror surface has a circular shape, and n is a natural number.

9. The optical scanning device according to claim 2, wherein the mirror part has a trimming pattern on an outer periphery thereof.

10. The optical scanning device according to claim 2, wherein
the N support cantilevers are arranged in (360°/N) rotational symmetry with respect to a center axis of the mirror part, and the N drive cantilevers are arranged in (360°/N) rotational symmetry with respect to the center axis of the mirror part,
the mirror part has a (360°/N) rotational symmetric shape with respect to the center axis of the mirror part,
the mirror part is formed using a crystal plane (100) of a semiconductor substrate, and the N is 4×n, and
the mirror surface has a circular shape, and n is a natural number.

11. The optical scanning device according to claim 2, wherein
the N support cantilevers are arranged in (360°/N) rotational symmetry with respect to a center axis of the mirror part, and the N drive cantilevers are arranged in (360°/N) rotational symmetry with respect to the center axis of the mirror part,
the mirror part has a (360°/N) rotational symmetric shape with respect to the center axis of the mirror part,
the mirror part is formed using a crystal plane (100) of a semiconductor substrate, and the N is 4×n, and
the mirror surface has a regular (4×n) polygonal shape, and n is a natural number.

12. The optical scanning device according to claim 2, wherein
the N support cantilevers are arranged in (360°/N) rotational symmetry with respect to a center axis of the mirror part, and the N drive cantilevers are arranged in (360°/N) rotational symmetry with respect to the center axis of the mirror part,
the mirror part has a (360°/N) rotational symmetric shape with respect to the center axis of the mirror part,
the mirror part is formed using a crystal plane (111) of a semiconductor substrate,
the N is 3×n, and
the mirror surface has a circular shape, and n is a natural number.

13. The optical scanning device according to claim 1, further comprising a control unit configured to, in adjustment of the amplitude of AC voltage, select one drive cantilever from among the N drive cantilevers, fix the amplitude and the initial phase of AC voltage applied to a plurality of piezoelectric elements on one or more drive cantilevers other than the selected drive cantilever, fix the initial phase of AC voltage applied to a plurality of piezoelectric elements on the selected drive cantilever, and change the amplitude to determine the amplitude at which rotation linearity error is smallest as an adjustment value of amplitude of AC voltage applied to a plurality of piezoelectric elements on the selected drive cantilever,
wherein the rotation linearity error is a quantity that represents a deviation from linearity of all-round rotational displacement of the mirror part, and the all-round rotational displacement of the mirror part is a displacement of the mirror part such that the center axis of the mirror part makes a turn while a deflection angle of the mirror part is kept constant.

14. The optical scanning device according to claim 1, wherein $N=4$, four drive cantilevers are ordered clockwise or counterclockwise,
four support cantilevers are arranged in 90° rotational symmetry with respect to the center axis of the mirror part, four drive cantilevers are arranged in 90° rotational symmetry with respect to the center axis of the mirror part, and, of portions that constitute each of the four drive cantilevers, each of a plurality of circumferential portions extending in a same direction as a circumferential direction of the mirror part has two piezoelectric elements,
the power supply unit includes
a first drive power supply configured to output a first AC voltage having a first initial phase and a first amplitude and a second AC voltage having a phase different from the first AC voltage by 180 degrees, and
a second drive power supply configured to output a third AC voltage having a second initial phase and a second amplitude and a fourth AC voltage having a phase from the third AC voltage by 180 degrees,
the first drive power supply applies the first AC voltage to a first piezoelectric element near the support cantilever, of a plurality of piezoelectric elements arranged on the first drive cantilever, and applies the first AC voltage or the second AC voltage to other piezoelectric elements arranged on the first drive cantilever, applies the second AC voltage to a second piezoelectric element near the support cantilever, of a plurality of piezoelectric elements arranged on the third drive cantilever, and applies the first AC voltage or the second AC voltage to other piezoelectric elements arranged on the third drive cantilever, and
the second drive power supply applies the third AC voltage to a third piezoelectric element near the support cantilever, of a plurality of piezoelectric elements arranged on the second drive cantilever, applies the third AC voltage or the fourth AC voltage to other piezoelectric elements arranged on the second drive cantilever, applies the fourth AC voltage to a fourth piezoelectric element near the support cantilever, of a plurality of piezoelectric elements arranged on the fourth drive cantilever, and applies the third AC voltage or the fourth AC voltage to other piezoelectric elements arranged on the fourth drive cantilever.

15. The optical scanning device according to claim 2, wherein $N=4$, four drive cantilevers are ordered clockwise or counterclockwise,
four support cantilevers are arranged in 90° rotational symmetry with respect to the center axis of the mirror part, four drive cantilevers are arranged in 90° rotational symmetry with respect to the center axis of the mirror part, and, of portions that constitute each of the four drive cantilevers, each of a plurality of circumferential portions extending in a same direction as a circumferential direction of the mirror part has two piezoelectric elements,
the power supply unit includes
a first drive power supply configured to output a first AC voltage having a first initial phase and a first amplitude and a second AC voltage having a phase different from the first AC voltage by 180 degrees, and
a second drive power supply configured to output a third AC voltage having a second initial phase and a second amplitude and a fourth AC voltage having a phase from the third AC voltage by 180 degrees, the first drive power supply applies the first AC voltage to a first piezoelectric element near the support cantilever, of a plurality of piezoelectric elements arranged on the first drive cantilever, and applies the first AC voltage or the second AC voltage to other piezoelectric elements arranged on the first drive cantilever, applies the second AC voltage to a second piezoelectric element near the support cantilever, of a plurality of piezoelectric elements arranged on the third drive cantilever, and applies the first AC voltage or the second AC voltage to other piezoelectric elements arranged on the third drive cantilever, and the second drive power supply applies the third AC voltage to a third piezoelectric element near the support cantilever, of a plurality of piezoelectric elements arranged on the second drive cantilever, applies the third AC voltage or the fourth AC voltage to other piezoelectric elements arranged on the second drive cantilever, applies the fourth AC voltage to a fourth piezoelectric element near the support cantilever, of a plurality of piezoelectric elements arranged on the fourth drive cantilever, and applies the third AC voltage or the fourth AC voltage to other piezoelectric elements arranged on the fourth drive cantilever.

16. The optical scanning device according to claim 1, wherein
the N drive cantilevers are ordered clockwise or counterclockwise,
a phase of AC voltage applied by the power supply unit to a first piezoelectric element on an i-th drive cantilever is larger than a phase of voltage applied to a second piezoelectric element on an (i−1)th drive cantilever by (360°/N), and
a position of the second piezoelectric element in the (i−1)th drive cantilever is same as a position of the first piezoelectric element in the i-th drive cantilever.

17. The optical scanning device according to claim 2, wherein
the N drive cantilevers are ordered clockwise or counterclockwise,
a phase of AC voltage applied by the power supply unit to a first piezoelectric element on an i-th drive cantilever is larger than a phase of voltage applied to a second piezoelectric element on an (i−1)th drive cantilever by (360°/N), and
a position of the second piezoelectric element in the (i−1)th drive cantilever is same as a position of the first piezoelectric element in the i-th drive cantilever.

18. The optical scanning device according to claim 3, wherein
the N drive cantilevers are ordered clockwise or counterclockwise,
a phase of AC voltage applied by the power supply unit to a first piezoelectric element on an i-th drive cantilever is larger than a phase of voltage applied to a second piezoelectric element on an (i−1)th drive cantilever by (360°/N), and
a position of the second piezoelectric element in the (i−1)th drive cantilever is same as a position of the first piezoelectric element in the i-th drive cantilever.

* * * * *